United States Patent [19]
Saitoh et al.

[11] Patent Number: 4,567,127
[45] Date of Patent: Jan. 28, 1986

[54] PHOTOCONDUCTIVE MEMBER COMPRISING A HYDROGENATED OR HALOGENATED AMORPHOUS SILICON AND GERANIUM LAYER

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 647,539

[22] Filed: Sep. 5, 1984

[30] Foreign Application Priority Data

| Sep. 7, 1983 | [JP] | Japan | 58-164581 |
| Sep. 8, 1983 | [JP] | Japan | 58-165655 |
| Sep. 21, 1983 | [JP] | Japan | 58-175090 |
| Oct. 11, 1983 | [JP] | Japan | 58-189595 |
| Oct. 21, 1983 | [JP] | Japan | 58-197334 |
| Oct. 27, 1983 | [JP] | Japan | 58-201229 |

[51] Int. Cl.$^4$ .............................. G03G 5/08
[52] U.S. Cl. ........................ 430/65; 430/84; 430/95
[58] Field of Search .............. 430/64, 66, 67, 84, 430/95, 65

[56] References Cited

U.S. PATENT DOCUMENTS 4,414,319 11/1983 Shirai et al. ............................ 430/66
4,471,042 9/1984 Komatsu et al. ...................... 430/66

FOREIGN PATENT DOCUMENTS 145541 11/1979 Japan ...................................... 430/66

*Primary Examiner*—John L. Goodrow
*Attorney, Agent, or Firm*—Fitzpatrick, Cella, Harper & Scinto

[57] ABSTRACT

A photoconductive member is provided which comprises a substrate and a light receiving layer having photoconductivity which comprises an amorphous material containing silicon atoms and germanium atoms, the distribution of germanium atoms therein being non-uniform in the layer thickness direction, and carbon atoms being contained in the light receiving layer.

Said photoconductive member can further comprise thereon another layer which comprises amorphous material containing silicon atoms as a matrix and at least one kind of atoms selected from the group of nitrogen atoms and oxygen atoms.

48 Claims, 57 Drawing Figures

PHOTOCONDUCTIVE MEMBER COMPRISING A HYDROGENATED OR HALOGENATED AMORPHOUS SILICON AND GERANIUM LAYER

BACKGROUND OF THE INVENTION

Field of the Invention

The present invention relates to photoconductive members sensitive to electromagnetic waves such as light (the light herein is in a broad sense including ultraviolet rays, visible rays, infrared rays, X-rays, γ-rays, etc.).

Description of the Prior Art

Photoconductive materials for constructing photoconductive layers in solid-state image pickup devices and in image forming devices, e.g. electrophotographic image forming members and original-reading devices, are requested to have characteristics such as high sensitivity, high S/N ratio [photo-current (Ip)/dark current (Id)], absorption spectral characteristics fitting the spectrum of the electromagnetic waves to be irradiated, quick photo-responsiveness, desired dark photo-responsiveness, desired dark resistivity, and harmlessness to human body during use, and further for solid-state pickup devices, the ease of after-image treatment. In particular, the harmlessness to human body during use is important for the photoconductive materials to be incorporated into electrophotographic appliances for office purposes.

A photoconductive material recently noticed on the ground of the above points is amorphous silicon (hereinafter designated as a-Si), which is described in for example, German Pat. Offen. Nos. 2,746,967 and 2,855,718 as an electrophotographic image forming member and German Pat. Offen. No. 2,933,411 about application thereof to a photoelectric conversion type of reader.

However, the prior art photoconductive member having a photoconductive layer of a-Si still needs to be improved in overall characteristic including electrical, optical, and photoconductive properties such as dark resistivity, photosensitivity, and photo-responsiveness, environment resistances such as humidity resistance, and stability with time passage.

For instance, when photoconductive members of a-Si type were used as electrophotographic image forming members, attempts to enhance the photosensitivity and simultaneously the dark resistance, in the past, often brought about undesirable effects such that; residual potential was frequently observed during service; fatigue accumulated during repeated operations continued for long hours and this was accompanied by a so-called ghost phenomenon that is the occurrence of an afterimage; and the responsiveness gradually deteriorated during high-speed repeated operations.

In addition, a-Si has a relatively low absorption coefficient for light waves longer than short-side visible light waves. Accordingly, the prior art photoconductive layer made up of a-Si is ineffective in utilizing the energy of the semiconductor lasers practically used today or the longer-wave energy of halogen lamps or fluorescent lamps, when these light sources are used for the irradiation. This is one of the still remaining problems to solve.

Meanwhile, when a large portion of the incident light arrives at the substrate of a photoconductive member without being absorbed by the photoconductive layer, light interference due to multiple reflection will takes place in the photoconductive layer if the substrate has a high reflectance for the light incident thereupon through the photoconductive layer. This interference is a factor in causing the "unfocused image". This effect becomes more remarkable as the irradiation spot is made smaller for the purpose of improving the resolution. This is a significant problem in particular when a semiconductor laser is employed as a light source.

Moreover, when the photoconductive layer of a-Si is formed to contain hydrogen atoms or halogen atoms such as fluorine or chlorine for improving electrical and photoconductive properties thereof or boron, phosphorus, or some other atoms for controlling the electroconductive type, a problem arises occasionally in the electrical or photoconductive properties of the resulting layer depending upon the manner of incorporating these atoms. For instance, the problem is that photocarriers produced by light irradiation have insufficient lifetimes in this layer or that the injection of electric charge from the substrate side of the dark area is not sufficiently impeded.

Furthermore, in the formation of the photoconductive layer thicker than ten and several $\mu$, a phenomenon such as the lifting or peeling of the layer from the substrate or the cracking in the layer is liable to develop with the time of leaving the product in the air after withdrawal thereof from the vapor-deposition chamber used for the layer formation. This phenomenon is remarkable in particular when the substrate is of drum type commonly used in the field of electrophotography. Thus the photoconductive member involves problems to solve in respect to the stability with passage of time.

Accordingly it is necessary to improve characteristics of a-Si material itself and on the other hand, to design photoconductive members employing it, so as to solve all the problems noted above.

SUMMARY OF THE INVENTION

The present invention has been made in view of the above various points. That is, as a result of extensive general studies continued on a-Si from the view point of the adaptability and utility thereof for photoconductive members used in photoconductive image forming members, solid-state image pickup devices, reading devices, etc., it has been found that a photoconductive member prepared according to a specified design, as will be described later, to have a photoconductive light receiving layer which consists of an amorphous material containing mixtures of silicon atoms (Si) and germanium atoms (Ge) as matrix and hydrogen atoms (H) or/and halogen atoms (X), i.e. a so-called hydrogenated amorphous silicon-germanium, halogenated amorphous silicon-germanium, or halogen-containing hydrogenated amorphous silicon-germanium (hereinafter these materials are generically designated as "a-SiGe(H,X)"), has excellent characteristics for practical use, surpasses the prior art photoconductive member in all respects, and in particular has markedly good characteristics suitable for electrophotography and is superior in absorption spectral characteristics for longer-wavelength light.

The primary object of the invention is to provide a photoconductive member of environment-proof type which has stable electrical, optical, and photoconductive properties scarcely affected by environmental service conditions, outstanding resistance to light-caused fatigue as well as superior photosensitivity to longer waves of light, does not degrade during repeated service operations, and shows no or little residual potential.

Another object of the invention is to provide a photoconductive member which has high sensitivity to all visible rays and specially to rays from semiconductor lasers, and exhibits quick photo-response.

A further object of the invention is to provide a photoconductive member which has a high quality laminate structure compact and stable wherein all the layers are bonded together with strong adhesion.

Still another object of the invention is to provide a photoconductive member which has such good electrophotographic characteristics, exhibiting adequate charge-retaining characteristics when charged for electrostatic image formation and almost no deterioration of these characteristics even in a high humidity atmosphere, as to be used very effectively for usual electrophotography.

A further object of the invention is to provide a photoconductive member for electrophotography with which high quality images can be readily obtained with good expression of halftone and with high resolution.

Still another object of the invention is to provide a photoconductive member which has high photosensitivity, high S/N ratio, and good electrical contact between the substrate and the photoconductive layer.

A further object of the invention is to provide a photoconductive member comprising a substrate and a photoconductive light receiving layer which is comprised of an amorphous material containing silicon atoms and germanium atoms, the distribution of germanium atoms therein being nonuniform in the thickness direction, and carbon atoms being contained in the light receiving layer.

A still another object of the invention is to provide a photoconductive member comprising a substrate and a photoconductive light receiving layer which, supported by the substrate, is comprised of an amorphous material containing silicon atoms and germanium atoms, wherein the light receiving layer contains carbon atoms and a substance controlling electroconductive properties, and the distribution of germanium atoms in the light receiving layer is nonuniform in the thickness direction.

A further object of the invention is to provide a photoconductive member comprising a substrate and a light receiving layer composed of a first layer which is comprised of an amorphous material containing silicon atoms and germanium atoms and exhibits photoconductivity and a second layer which is composed of an amorphous material containing silicon atoms and nitrogen atoms, wherein the distribution of germanium atoms in the first layer is nonuniform in the thickness direction and carbon atoms are contained in the first layer.

According to one aspect of the invention, there is provided a photoconductive member comprising a substrate and a photoconductive light receiving layer which is comprised of an amorphous material containing silicon atoms and germanium atoms, the distribution of germanium atoms therein being nonuniform in the thickness direction, and carbon atoms being contained in the light receiving layer.

According to another object of the present invention is provided a photoconductive member comprising a substrate and a light receiving layer composed of a first layer which is comprised of an amorphous material containing silicon atoms and germanium atoms and exhibits photoconductivity and a second layer which is comprised of an amorphous material containing silicon atoms and nitrogen atoms, wherein the first layer contains carbon atoms and a substance controlling electroconductive properties and the distribution of germanium atoms in the first layer is nonuniform in the thickness direction.

According to still another aspect of the present invention, there is provided a photoconductive member comprising a substrate and a light receiving layer composed of a first layer which is comprised of an amorphous material containing silicon atoms and germanium atoms and exhibits photoconductivity and a second layer which is comprised of an amorphous material containing silicon atoms and oxygen atoms, wherein the distribution of germanium atoms in the first layer is nonuniform in the thickness direction and carbon atoms are contained in the first layer.

According to further aspect of the present invention, there is provided a photoconductive member comprising a substrate and a light receiving layer composed of a first layer which is comprised of an amorphous mateiral containing silicon atoms and germanium atoms and exhibits photoconductivity and a second layer which is comprised of an amorphous mateiral containing silicon atoms and oxygen atoms, wherein the first layer contains carbon atoms and a substance controlling electroconductive properties and the distribution of germanium atoms in the first layer is nonuniform in the thickness direction.

The photo-conductive member of the invention having a structure as defined above solves all the problems noted above, exhibiting excellent electrical, optical, and photoconductive properties and outstanding dielectric strength and stability to service environments.

In particular when applied as an electrophotographic image forming member, the photoconductive member of the invention has such stable electrical properties that the influence of residual potential on the image formation is not observed in the slightest degree, exhibits high sensitivity, S/N ratio, and resistance to light-caused fatigue, and gives steadily and repeatedly high quality images of high density with good expression of halftone and with high resolution.

Moreover the photoconductive member of the invention can be used continuously and repeatedly at a high speed for long hours since the light receiving layer formed on the substrate is tough in itself and excellent in adhesion to the substrate.

Furthermore the photoconductive member of the invention has high sensitivity to all visible rays and specially to rays from semiconductor lasers and quickly responses to light.

DETAILED DESCRIPTION OF PREFERRED EMBODIMENTS

Figure 1:
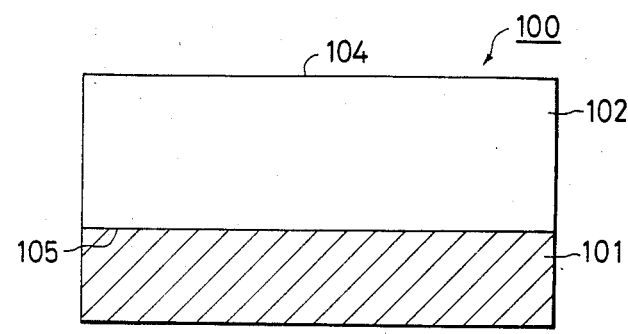
FIGS. 1 and 2 are schematic view of photoconductive members of the invention for illustrating the structure thereof.

Referring now to the drawings, the photoconductive member of the invention is described in detail.

FIG. 1 is a schematic illustration of the structure of a photoconductive member which is the first embodiment of the invention.

The photoconductive member 100 shown in FIG. 1 consists of a substrate 101 and a photoconductive light receiving layer 102 which is formed of a-SiGe(H,X) on the substrate 101 and contains carbon atoms.

Germanium atoms in the light receiving layer 102 are distributed continuously so that the concentration thereof varies in the thickness direction and is higher in the substrate 101 side (the interface 105 side) than in the opposite side (the free surface 104 side) of the light receiving layer.

In the photoconductive member 100 of the invention, it is desirable that the distribution of germanium atoms in the light receiving layer be in such a state as the above in the thickness direction and be uniform in the directions parallel to the surface of the substrate.

Figure 2:
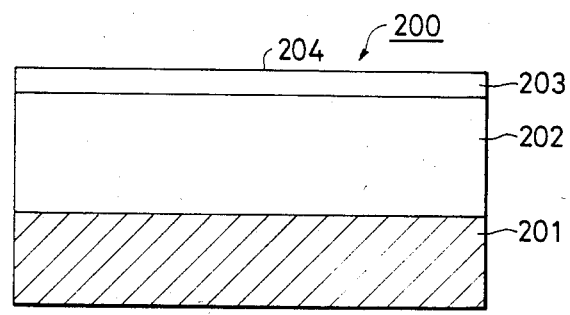

FIG. 2 is a schematic illustration of the structure of a photoconductive member which is the second embodiment of the invention.

The photoconductive member 200 shown in FIG. 2 has a light receiving layer which, laid on a substrate 201 for the photoconductive member, is composed of a first layer 202 and a second layer 203. The first layer 202 is made up of a-SiGe(H,X), contains carbons atoms, and exibits photoconductivity.

Germanium atoms in the first layer 202 are distributed continuously so that the concentration thereof varies in the thickness direction and is higher in the substrate 201 side (the side nearer in the interface between the substrate 201 and the first layer 202) than in the opposite side (the side nearer to the interface between the first layer 202 and the second layer 203).

The second layer is built up of an amorphous material containing silicon atoms as matrix and at least one species of nitrogen atoms and oxygen atoms and desirably contains at least one species of hydrogen atoms and halogen atoms.

In the photoconductive member 200 of the invention, it is desirable that the distribution of germanium atoms in the first layer be in such a state as the above in the thickness direction and be uniform in the directions parallel to the substrate surface.

FIGS. 3 to 11 show typical examples of the distribution of germanium atoms in the light receiving layer or first layer of the photoconductive member according to the invention.

Figure 3:
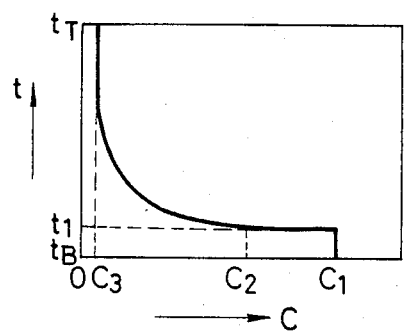
FIGS. 3 to 11 illustrate the distribution of germanium atoms in the light receiving layer or first layer.

In FIGS. 3 to 11, the germanium atom distribution concentration C is plotted on the abscissa and the distance from the interface between the substrate and the photoconductive light receiving layer or first layer on the ordinate. On the ordinate, the point $t_B$ denotes the position of the interface between the substrate and the light receiving layer or first layer and the point $t_T$ denotes the position of the surface opposite to the substrate, of the light receiving layer or fitst layer. Thus, the light receiving layer or first layer containing germanium atoms has been grown from the $t_B$ side toward the $t_T$ side FIG. 3 shows a first typical example of the distribution with respect to the thickness direction in the light receiving layer or first layer.

In the case of FIG. 3, the germanium atom distribution concentration C is kept at a constant value of $C_1$ from position $t_B$ to position $t_1$, dropped there to $C_2$, and decreased continuously to become $C_3$ at position $t_T$.

Figure 4:
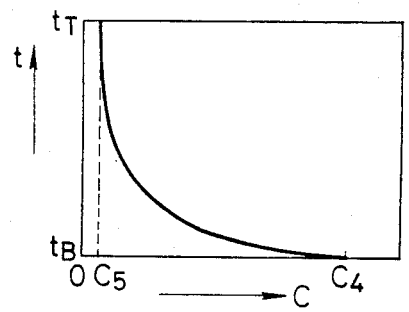

In the case of FIG. 4, the distribution concentration C is decreased continuously from $C_4$ at position $t_B$ to $C_5$ at position $t_T$.

Figure 5:
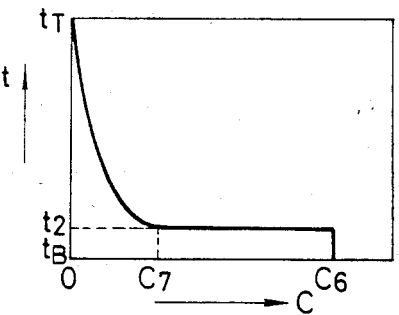

In the case of FIG. 5, the distribution concentration is kept at a constant value of $C_6$ from position $t_B$ to position $t_2$, dropped there to $C_7$, and then decreased gradually and continuously to become a substantial zero at position $t_T$ (the substantial zero herein means a concentration below the minimum detectable value).

Figure 6:
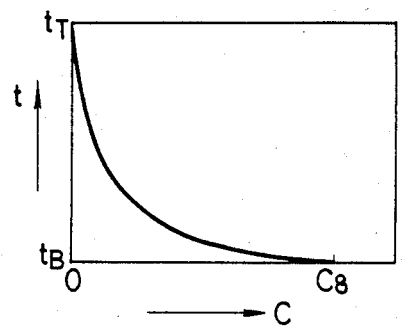

In the case of FIG. 6, the distribution concentration C is decreased continuously from $C_8$ at position $t_B$ to a substantial zero at position $t_T$.

Figure 7:
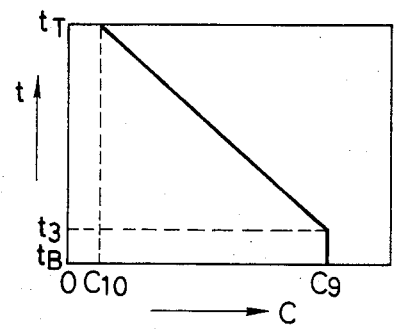

In the case of FIG. 7, the distribution concentration C is kept at a constant value $C_9$ from position $t_B$ to position $t_3$ and then decreased linearly to become $C_{10}$ at position $t_T$.

Figure 8:
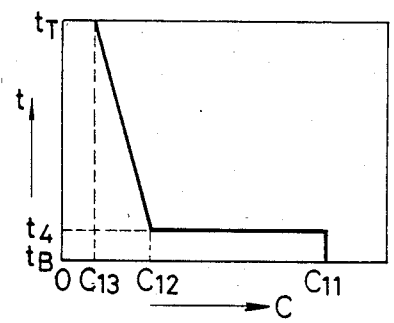

In the case of FIG. 8, the distribution concentration C is kept at a constant value of $C_{11}$ from position $t_B$ to position $t_4$, dropped there to $C_{12}$, and then decreased linearly to become $C_{13}$ at position $t_T$.

Figure 9:
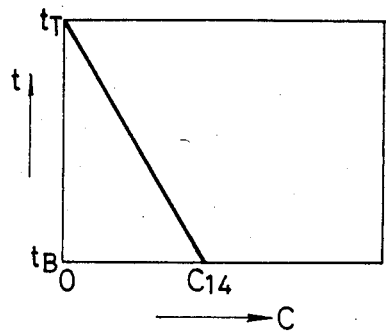

In the case of FIG. 9, the distribution concentration C is decreased linearly from $C_{14}$ at position $t_B$ to a substantial zero at position $t_T$.

Figure 10:
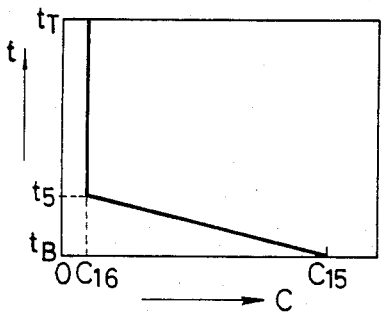

In the case of FIG. 10, the distribution concentration C is decreased linearly from $C_{15}$ at position $t_B$ to $C_{16}$ at position $t_5$ and kept at this constant value of $C_{16}$ between position $t_6$ and position $t_T$.

Figure 11:
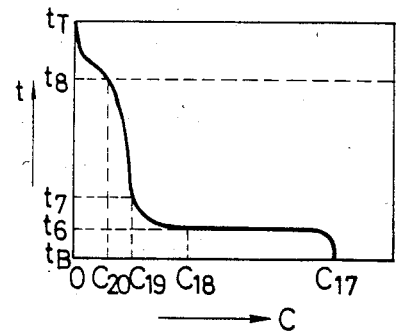

In the case of FIG. 11, the distribution concentration C is $C_{17}$ at position $t_B$, then decreased gradually at first and then rapidly near position $t_6$, and dropped there to $C_{18}$. Between position $t_6$ and position $t_8$, the distribution concentration C is decreased gradually at first to become $C_{19}$ at position $t_7$, then further decreased much more gradually to become $C_{20}$ at position $t_8$. Between position $t_8$ and position $t_T$, the distribution concentration C is decreased from $C_{20}$ to a substantial zero depicting a curve as shown in the figures.

As illustrated above referring to FIGS. 3 to 11 by giving some typical examples, the thickness-directional distribution of germanium atoms in the light receiving layer or first layer, in this invention, is higher in the interface $t_B$ side and considerably lower in the surface $t_T$ side The light receiving layer or first layer of the photoconductive member according to the invention is desired to have a localized region (A) that contains germanium atoms in relatively high concentrations, rations, in the interface $t_B$ side as stated above.

The localized region (A), in the invention, is desirably positioned within the distance of $5\mu$ from the interface $t_B$. The region (A) may be all or a part of the layer region ($L_T$) ranging from the interface $t_B$ to the plane $5\mu$ distance therefrom. The choice of whether all or a part of the layer region ($L_T$) is occupied by the localized region (A) depends upon characteristics required for the light receiving layer or a first layer.

It is desirable to form the localized region (A) so that the maximum concentration Cmax, in the thickness direction, of germanium atom distributed in the region (A) will be at least 1000 atomic ppm, more suitably 5000 atomic ppm, and most suitably $1 \times 10^4$ atomic ppm, based on the silicon atoms contained.

It is desirable to form the light receiving layer or first layer containing germanium atoms so that the maximum distribution concentration Cmax thereof will be positioned in the above defined layer region (L$_T$), the layer 5μ thick on the substrate.

The content of germanium atoms in the light receiving layer or first layer is suitably chosen so as to achieve objects of the invention effectively. In general, the content is suitably 1–9.5×10$^5$ atomic ppm, more suitably 100–8×10$^5$ atomic ppm, and most suitably 500–7×10$^5$ atomic ppm, based on the total content of silicon atoms and germanium atoms in the layer.

In the light receiving layer or first layer of the photoconductive member according to invention, germanium atoms distributed continuously over the entire region of the layer and the distribution concentration C thereof is decreased in the direction from the substrate side to the free surface side. Accordingly, the light receiving layer can be formed to have required characteristics by a suitable design of the distribution concentration C change of germanium atoms in the thickness direction (the thickness-directional germanium atom distribution curve) as required.

For instance, high photosensitivity in a wide range of wavelengths from relatively short to long, including all wavelengths of visible rays, can be given to the light receiving layer or first layer by elevating the distribution concentration C of germanium atoms in the substrate side and minimizing it in the free surface side of the light receiving layer or first layer.

As will be described later, it is also possible, by enhancing the distribution concentration C of germanium atoms extremely in the substrate-side interfacial layer of the light receiving layer or first layer, that the longer-wavelength light from a semiconductor laser which can be absorbed not completely in the light-incident side of the layer can be absorbed almost completely in the substrate-side region, thereby preventing effectively the interference which may be caused by the reflection from the substrate-side interface.

In the photoconductive member of the invention, carbon atoms are incorporated into the light receiving layer or first layer for the purpose of enhancing the photosensitivity, dark resistance, and the adhesion between the substrate and the above layer. Carbon atoms may be distributed in either the entire region or a partial layer region of the light receiving layer or first layer.

The distribution of carbon atoms in the light receiving layer or first layer may be uniform or, like the distribution of germanium atoms illustrated in FIGS. 3 to 11, nonuniform, in the thickness direction.

That is, the distribution of carbon atoms, when nonuniform in the thickness direction, can be illustrated similarly to FIGS. 3 to 11 which show that of germanium atoms.

In the invention, the layer region (C) containing carbon atoms in the light receiving layer or first layer if formed to occupy the entire region of the light receiving layer or first layer when the main purpose of the carbon incorporation is the enhancement of the photosensitivity and dark resistance, and to occupy the substrate-side interfacial region of the layer when the main purpose is the improvement of the adhesion between the substrate and the light receiving layer or first layer.

In the former case, the content of carbon atoms in the layer region (C) is desired to be relatively low for the purpose of attaining high photosensitivity. In the latter case, the content is desired to be relatively high for the purpose of ensuring the improvement of the adhesion.

For achieving both the above purposes at the same time, carbon atoms are desirably distributed either so as to be relatively concentrated in the substrate side and relatively diluted in the free surface side of the layer or so as not to be intentionally contained in the free surface side of the layer.

The content of carbon atoms in the layer region (C) formed in the light receiving layer or first layer is suitably chosen by considering the organic relation with characteristics such as those required for the layer region (C) itself and those of the contact interface with the substrate when the layer region (C) is formed to contact the substrate directly.

When some other layer region is formed to contact said layer region (C) directly, the carbon atom content therein is suitably chosen by considering also the relations to characteristics of the other layer region and characteristics at the interface between the two layer regions.

In brief, the content of carbon atoms in the layer region (C) is suitably chosen according to characteristics for the photoconductive member. In general, the content is suitably 0.001–50 atomic %, more suitably 0.002–40 atomic %, and most suitably 0.003—30 atomic %.

When the layer region (C) occupies all or large part of the light receiving layer or first layer, the above upper limit of carbon content is desired to be lowered sufficiently. That is, when the thickness T$_o$ of the layer region (C) is at least 2/5 of the thickness T of the light receiving layer or first layer, the upper limit of carbon content in the layer region (C) is desired to be 30 atomic %, preferably 20 atomic %, particularly preferably 10 atomic %.

Preferably the layer region (C) containing carbon atoms in the light receiving layer or first layer is formed as a localized region (B) containing carbon atoms in relatively high concentrations in the substrate-side as stated above, whereby the adhesion between the substrate and said layer can be more improved.

Illustrating by using the notations shown in FIGS. 3 to 11, the localized region (B) is desirably formed within the distance of 5 μ from the interface t$_B$.

The localized region (B) may be all or a part of the layer region (L$_T$) ranging from the interface t$_B$ to the plane 5μ distance therefrom. The choice of whether all or a part of the layer region (L$_T$) is to be occupied by the localized region (B) depends upon characteristics required for the light receiving layer or first layer to be formed.

It is desirable to form the layer region (C) containing carbon atoms so that the maximum concentration Cmax of carbon atoms distributed in the thickness direction will be at least desirably 500 atomic ppm, preferably 800 atomic ppm, particularly preferably 1000 atomic ppm.

Thus, it is desirable to form the layer region (C) containing carbon atoms so as to place the maximum distribution concentration Cmax within the distance of 5μ from the interface t$_B$.

In the invention, examples of halogen atoms (X), incorporated, if necessary, into the light receiving layer are fluorine, chlorine, bromine, and iodine atoms, among which fluorine and chlorine atoms are particularly suited.

In the invention, the light receiving layer or first layer consisting of a-SiGe(H,X) is formed according to a vacuum deposition method, for example, the glow discharge method, sputtering method, or ion plating method, which utilizes an electric discharge phenomenon. For instance, the formation of the layer according to the glow discharge method can be accomplished by; feeding a silicon atom(Si)-supplying gas and a germanium atom(Ge)-supplying gas as basic raw materials and if necessary, a hydrogen atoms(H)-introducing gas or-/and a halogen atoms(X)-introducing gas into a deposition chamber that can be evacuated, under an intended pressure; and generating a glow discharge in the deposition chamber to deposit a-SiGe(H,X) on the prescribed substrate placed in advance on a definite position, while controlling the distribution concentration of germanium atoms according to a prescribed flow rate changing curve. According to the sputtering method, the light receiving layer or first layer is formed by setting a target made of Si, two targets made of Si and Ge respectively, or a target made of Si-Ge mixture in a sputtering purpose deposition chamber; feeding a Ge-supplying gas diluted, if necessary, with an inert gas, e.g. Ar or He, and if necessary an H-introducing gas or/and an halogen atoms (X)-introducing gas into the deposition chamber; and forming an intended gas plasma and sputtering the target while controlling the flow of the Ge-supplying gas feed according to a predetermined Ge distribution curve.

According to the ion plating method, the light receiving layer or first layer can be formed in the same manner as according to the sputtering method, except that a polycrystalline or single-crystalline germanium are placed as vapor sources in vapor-deposition purpose boats, respectively and the vapor sources are heated and evaporated by resistance-heating or the electron beam method (EB method) to pass the resulting vapor through an intended plasmic atmosphere.

Suitable Si-supplying raw materials for use in the invention include hydrogenated silicons (silanes) gaseous or gasifiable, for example, $SiH_4$, $Si_2H_6$, $Si_3H_8$, and $Si_4H_{10}$. In particular, $SiH_4$ and $Si_2H_6$ are preferred because of the ease of handling for the layer formation and the high efficiency for Si supply.

Suitable Ge-supplying raw materials include hydrogenated germanium geseous or gasifiable, for example, $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, and $Ge_9H_{20}$. In particular, $GeH_4$, $Ge_2H_6$, and Gehd $3H_8$ are preferred because of the ease of handling for the layer formation and the high efficiency for Ge supply.

Effective halogen-introducing starting gas for use in the invention include various halogen compounds gaseous or gasifiable, for example, halogen gases, halogenated compounds, interhalogen compounds, and halogen-substitution derivatives of silanes.

Further, halogen-containing hydrogenated silicon compounds gaseous or gasifiable, which have silicon and halogen as constituent atoms, can also be used as effective halogen-introducing raw materials in the invention.

Individual examples of the halogen compounds suitable for use in the invention are halogen gases of fluorine, chlorine, bromine, and iodine and interhalogen compounds such as BrF, ClF, $ClF_3$, $BrF_5$, $BrF_3$, $IF_7$, ICl, and IBr.

Suitable examples of the halogen-containing silicon compound, i.e. halogen-substitution derivatives of silanes, are silicon halides such as $SiF_4$, $Si_2F_6$, $SiCl_4$, and $SiBr_4$.

When such a halogen-containing silicon compound is used together with a Ge-supplying gas for producing the photoconductive member characteristic of the invention by glow discharge, the light receiving layer or first layer consisting of a halogen-containing a-SiGe can be formed on a desired substrate without using the silane gas as Si-supply raw material gas.

The basic way to form the halogen-containing light receiving layer or first layer on a desired substrate according to the glow discharge method comprises feeding, for example, a silicon halide as Si-supplying gas, a hydrogenated germanium as Ge-supplying gas, and a diluent gas such as Ar, $H_2$, or He in a predetermined mixing proportions at predetermined flow rates into a suitable deposition chamber, and generating a flow discharge to form a plasmic atmosphere of these gases. In this case, hydrogen gas or a hydrogen-containing gaseous silicon compound can be added in a suitable proportion to the above gas mixture for easier control of the content of hydrogen atoms to be introduced into the layer.

Each of the above gaseous raw materials used may be in the form of either a single compound or a mixture of plural compounds.

According to either of the sputtering method and the ion plating method, the introduction of halogen atoms into the layer can be accomplished by feeding the above cited halogen compound or halogen-containing silicon compound in gaseous form into a deposition chamber, and forming a plasmic atmosphere of the gas.

The introduction of hydrogen atoms in the layer to be formed can be accomplished by feeding a hydrogen-introducing gaseous material, e.g. $H_2$ or the above cited silane or/and hydrogenated germanium, into a sputtering purpose deposition chamber, and forming a plasmic atmosphere of the gas.

While the above cited halogen compounds or halogen-containing silicon compounds can be effectively used as halogen-introducing feed gas in the invention, the following gaseous or gasifiable compounds can also be used as effective raw materials for the formation of the light receiving layer or first layer. That is; halogenated compounds containing at least one hydrogen atom as a constituent including; hydrogen halides, e.g. HF, HCl, HBr, and HI; halogen-substituted silanes, e.g. $SiH_2F_2$, $SiH_2I_2$, $SiH_2Cl_2$, $SiHCl_3$, $SiH_2Br_2$, and $SiHBr_3$; hydrogenated germanium halides, e.g. $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, and $GeH_3I$; and germanium halides, e.g. $GeF_4$, $GeCl_4$, $GeBr_4$, $GeI_4$, $GeF_2$, $GeCl_2$, $GeBr_2$, and $GeI_2$.

Of these compounds, the halogenated compounds containing at least one hydrogen atom can be used as favorable halogen-introducing raw materials in the invention, since these halogenated compounds in the layer formation serve to introduce hydrogen atoms, which are very effective for controlling electrical or photoelectric properties of the light receiving or first layer, along with halogen atoms into the layer.

Hydrogen atoms can also be introduced into the light receiving layer or the first layer by actuating discharge in a deposition chamber in the presence of hydrogen or silicon hydride such as $SiH_4$, $Si_2H_6$, $Si_3H_8$ and $Si_4H_{10}$ in addition to germanium or germanium compound such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$ and $Ge_9H_{20}$ for feeding germanium and silicon or a silicon compound for feeding Si.

In preferred embodiments of the invention, the content of hydrogen atoms (H), the content of halogen atoms (X), or the combined content of hydrogen atoms and halogen atoms (H+X), in the light receiving layer or first layer of the photoconductive member is desirably 0.01-0.40 atomic %. preferably 0.05-30 atomic %, particularly preferably 0.1-25 atomic %.

For controlling contents of hydrogen atoms or/and halogen atoms in the light receiving layer or first layer, it is recommended to manipulate, for example, the substrate temperature, the flow of raw material fed into the deposition chamber for incorporating hydrogen atoms or/and halogen atoms into the layer, and the electric discharge power.

The thickness of the light receiving layer or first layer in the photoconductive member of the invention is suitably decided so that photocarriers produced in the layer may be transported effectively. In general, the thickness is desirably 1-100$\mu$, preferably 1-80$\mu$, particularly 2-50$\mu$.

In the invention, the formation of the layer region (C) containing carbon atoms in the light receiving layer or first layer can be accomplished by using a carbon-introducing raw material jointly with the above stated starting materials and introducing carbon atoms into the forming layer while controlling the quantity of carbon atoms.

When the glow discharge method is applied for the formation of the layer region (C), a carbon-introducing starting material is added to the material suitably selected from the above cited starting materials suitable for the formation of the light receiving layer or first layer. Most of the gaseous or gasifiable compounds containing at least one carbon atom as a constituent can be used as starting materials for the introduction of carbon atoms.

For example, there may be used; (1) a starting gas containing silicon (Si) as a constituent atom, a starting gas containing carbon (C) as a constituent atom, and if necessary, a starting gas containing hydrogen (H) or/and halogen (X) as constituent atoms, in desired mixing proportions; (2) a starting gas containing silicon (Si) as a constituent atom and a starting gas containing carbon (C) and hydrogen (H) as constituent atoms in desired mixing proportions; or (3) a starting gas containing silicon (Si) as a constituent atom and a starting gas containing silicon (Si), carbon (C), and hydrogen (H) as constituent atoms in desired mixing proportions.

Alternatively, there may be used mixtures of a starting gas containing silicon (Si) and hydrogen (H) as constituent atoms and a starting gas containing carbon (C) as a constituent atom.

Examples of the starting gas containing C and H as constituent atoms are $C_1$-$C_5$ saturated hydrocarbons, $C_2$-$C_5$ ethylenic hydrocarbons, and $C_2$-$C_4$ acetylenic hydrocarbons.

Such hydrocarbons include e.g. methane ($CH_4$), ethane ($C_2H_6$), propane ($C_3H_8$), n-butane (n-$C_4H_{10}$), and pentane ($C_5H_{12}$), as saturated hydrocarbons; ethylene ($C_2H_4$), propylene ($C_3H_6$), butene-1 ($C_4H_8$), butene-2 ($C_4H_8$), isobutylene ($C_4H_8$), and pentene ($C_5H_{10}$), as ethylenic hydrocarbons; and acetylene ($C_2H_2$), methylacetylene ($C_3H_4$), and butyne ($C_4H_6$), as acetylenic hydrocarbons.

Besides these compounds, there may be used silicon alkyls such as $Si(CH_3)_4$ and $Si(C_2H_5)_4$, which contains Si, C, and H as constituent atoms.

In the invention, oxygen atoms and/or nitrogen atoms in addition to carbon atoms can be incorporated into the layer region (C) for the purpose of further enhancement of the effect which can be obtained with carbon atoms. Suitable compounds as the starting gas for introducing oxygen atoms into the layer region (C) include, for example, oxygen ($O_2$), ozone ($O_3$), nitrogen monoxide (NO), nitrogen dioxide ($NO_2$), nitrogen suboxide ($N_2O$), dinitrogen trioxide ($NO_2O_3$), dinitrogen tetraoxide ($N_2O_4$), dinitrogen pentoxide ($N_2O_5$), nitrogen trioxide ($NO_3$), and lower siloxanes such as disiloxane ($H_3SiOSiCH_3$) and trisiloxane ($H_3Si.O.SiH_2.SiH_3$), which are constituted of silicon (Si), oxygen (O), and hydrogen (H) atoms. Suitable compounds as the starting material for introducing nitrogen atoms into the layer region (C) include nitrogen compounds constitued of N atoms or N and H atoms such as gaseous nitrogen and gaseous or gasifiable nitrides and azides, e.g. nitrogen ($N_2$), ammonia ($NH_3$), hydrazine ($H_2N.NH_2$), hydrogen azide ($HN_3$), and ammonium azide ($NH_4N_3$) Besides these compounds, nitrogen halides such as nitrogen trifluoride ($F_3N$) and dinitrogen tetrafluoride ($F_4N_2$) can be used as raw materials which serve to introduce halogen atoms (X) in addition to nitrogen atoms (N).

The formation of the light receiving layer or first layer containing carbon atoms can be accomplished by using a wafer of single-crystalline or polycrystalline silicon, a wafer of C, or a wafer of Si-C mixture and sputtering the target material in a suitable atmosphere selected from various gas atmospheres.

For instance, when an Si wafer is used as target, the sputtering is carried out as follows: starting gases for introducing carbon atoms and if necessary, hydrogen atoms or/and halogen atoms, diluted with an inert gas as required, are fed into a suitable deposition chamber, and a plasma of these gases is formed there to sputter the Si wafer.

Alternatively, when Si and C are used separately as targets or an Si-C mixture is used as one target, the sputtering is carried out in an atmosphere of suitable diluent gas or of a gas containing hydrogen (H) or/and halogen (X) as constituent atoms. The above cited starting gas for introducing carbon atoms, suitable in the case of glow discharge, can also be used effectively in the case of sputtering.

When the light receiving layer having a carbon-containing layer region (C) is formed in the invention, an intended carbon atom distribution in the thickness direction (depth profile) can be obtained, in the case of glow discharge, by feeding a carbon-introducing gaseous raw material into a deposition chamber while varying the gas flow suitably according to an intended flow rate changing curve.

The gas flow can be regulated, for instance, by varying gradually the opening of a prescribed needle valve fitted in the gas flow line, in any way commonly used, e.g. manual operation or driving with an external motor. The flow rate is varied not always linearly. It is regulated according to a curve previously designed by means of, e.g. a microcomputer. Thus, the intended distribution of carbon atoms can be obtained.

When the layer region (C) is formed by sputtering, the first way of attaining an intended thickness-directional distribution of carbon atoms is, similarly to the case of glow discharge, to vary suitably, as intended, the flow rate of the carbon-introducing gaseous material to be fed into the deposition chamber.

The second way is to use a target suitable for sputtering, for example, a target of Si-C mixture in which the mixing ratio of Si to C has been varied in the thickness direction according to an intended carbon atom distribution curve.

In the photoconductive member of the invention, electroconductive properties of the light receiving layer or the first layer, which contains germanium atoms, can be controlled as desired be incorporating, if necessary, a substance (C) controlling electroconductive properties thereinto.

Such substances (C) are "impurities", so-called in the field of semiconductors, which include, in the invention, p-type impurities that give the resulting light receiving layer or first layer of a-SiGe(H,X) p-type semiconductor characteristics and n-type impurities that give n-type semiconductor characteristics.

Suitable p-type impurities for use in the invention include elements of group III of the periodic table, e.g. B (Boron), Al (aluminum), Ga (gallium), In (indium) and Tl (thallium), among which B and Ga are particularly suited.

Suitable n-type impurities include elements of group V of the periodic table, e.g. P (phosphorus), As (arsenic), Sb (antimony), and Bi (bismuth), among which P and As are particularly suited.

The content of the substance (C) controlling electroconductive properties in the light receiving layer or first layer is suitably chosen by considering the organic connection with characteristics such as electroconductive properties requested for the layer and characteristics of the layer on the interface where the layer contacts the substrate.

When the substance (C) is localized in an intended layer region in the light receiving layer or first layer, particularly in the substrate-side interfacial region (E) of the layer, the content of the substance (C) therein is suitably chosen by considering also the relation to characteristics of the other layer region formed to be in direct contact with said layer region and the relation to characteristics thereof at this contact interface.

In the invention, the content of the substance (C) controlling electroconductive properties in the light receiving layer is desirably $0.01-5 \times 10^4$ atomic ppm, preferably $0.5-1 \times 10^4$ atomic ppm, particularly preferably $1-5 \times 10^3$ atomic ppm.

It is desirable to locally incorporate the substance (C) in some layer region, particularly in the substrate-side interfacial region (E) of the light receiving layer or first layer in an amount of at least desirably 30 atomic ppm, preferably 50 atomic ppm, particularly preferably 100 atomic ppm.

In particular, by incorporating the substance (C) in at least the above concentration in the substrate-side interfacial region (E), it becomes possible to impede effectively, when the incorporated substance (C) is a p-type impurity, the injection of electrons from substrate side into the light receiving layer where the free surface of the layer is positively charged, and when the incorporated substance (C) is of n-type, the injection of holes from the substrate into the light receiving layer where the free surface of the layer is negatively charged.

When a substance (C), p-type or n-type, is thus incorporated in the substrate-side interfacial layer (E) of the light receiving layer or first layer, the other region (Z) of the layer is allowed to contain either another substance (C) of the reverse polarity type or a substance (C) of the same polarity type in a far less amount than in the interfacial region (E).

In such a case, the content of the substance (C) in the other region (Z) is suitably chosen depending upon the polarity and content of the substance (C) in the substrate-side interfacial region (E), and desirably 0.001 - 1000 atomic ppm, preferably 0.05-500 atomic ppm, particularly preferably 0.1-200 atomic ppm.

When substances (C) of the same polarity type are incorporated in the interfacial region (E) and the other region (Z) respectively, the content of the substance (C) in the region (Z) is desired to be as low as up to 50 atomic ppm. Another mode of distributing substances (C) is that a layer region containing a substance (C) and another layer region containing a substance (C) of the reverse polarity type are arranged in the light receiving layer or first layer so as to contact each other directly, thereby forming a so-call deletion layer on the contact interface. For instance, a layer region containing the above cited p-type impurity and another layer region containing the above cited n-type impurity are laid to contact each other directly, thereby forming a so-called p-n junction to provide a depletion layer.

The introduction of a substance (C), e.g. an element of group III or V as a constituent in the light receiving layer or first layer can be accomplished by feeding a starting material suitable for introducing such an element in a gas state, together with a starting gas for forming the light receiving layer or first layer, into a deposition chamber. The raw material used for introducing an element of group III is desired to be gaseous at ordinary temperature and pressure or readily gasifiable under the conditions of the layer formation. Suitable materials for introducing an element of group III include, for example, boron hydrides (boranes) such as $B_2H_6$, $B_4H_{10}$, $B_5H_9$, $B_5H_{11}$, $B_6H_{10}$, $B_6H_{12}$, and $B_6H_{14}$ and boron halides such as $BF_3$, $BCl_3$, and $BBr_3$, for introducing boron, and $AlCl_3$, $GaCl_3$, $Ga(CH_3)_3$, $ICl_3$, and $TlCl_3$, for introducing other elements of group III.

Suitable materials for introducing an element of group V include, for example, hydrogen phosphides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$, for introducing phosphorus, and $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$, for introducing other elements of group V.

When the photoconductive member of the invention has a light receiving layer composed of a first layer, photoconductive, consisted of a-SiGe (H,X), containing carbon atoms and a second layer laid on the first layer, this second layer has a free surface and has been formed to achieve objects of the invention chiefly in respect to humidity resistance, characteristics for continuously repeated operations, resistance to high voltage, resistance to service environments, and durability. The second layer is built up of an amorphous material which contains silicon atoms as matrix and at least one species of nitrogen atoms and oxygen atoms.

In this type of photoconductive member according to the invention, both the amorphous materials constructing the first and second layers, respectively have common constituent silicon atoms, thereby securing chemical stability sufficiently at the interface therebetween.

A preferred embodiment of the second layer consisted of an amorphous material which contains silicon atoms (Si), nitrogen atoms (N), and if necessary, hydrogen atoms (H) or/and halogen atoms (X) (hereinafter this amorphous material is designated as "$a-(Si_xN_{1-x})_y(H,X)_{1-y}$", wherein $0<x, y<1$).

The second layer, when consisted of $a-(Si_xN_{1-x})_y(H,X)_{1-y}$, can be formed by the glow discharge method, sputtering method, ion implantation method, ion plating method, electron beam method, etc. In practice, one of these methods is suitably chosen depending upon such factors as production conditions, degree of investment on equipment, production scale, and characteristics required for the photoconductive member produced. In general, the glow discharge method and the sputtering method are favourably applied since these methods are advantageous in that operational conditions for producing the photoconductive member having required characteristics are relatively easy to control and nitrogen atoms and halogen atoms, together with silicon atoms, can be easily introduced into the second layer to be formed.

The second layer may also be formed by combined use of glow discharge and sputtering methods in one deposition chamber.

The formation of the second layer according to the glow discharge method can be accomplished by feeding starting gas suitable for the formation of $a-(Si_xN_{1-x})_y(H,X)_{1-y}$ (composed basically of an Si-supplying gas and an N-supplying gas and if necessary H-introducing or/and X-introducing gases), mixed with a diluent gas, if necessary, in a predetermined mixing ratio, into a vacuum deposition chamber in which a substrate overlaid with a first layer has been fixed, and generating a glow discharge in the chamber to form a plasmic atmosphere of the fed gas, thereby depositing $a-(Si_xN_{1-x})_y(H,X)_{1-y}$ on the first layer.

In the invention, most of the compounds, gaseous or gasifiable, having at least one of silicon (Si), nitrogen (N), hydrogen (H), and halogen (X) as a constituent atoms can be used as a starting gas for the formation of $a-(Si_xN_{1-x})_y(H,X)_{1-y}$.

When a starting gas having Si as a constituent atom and none of N, H, and X is employed, the following mixtures thereof can be used each in intended mixing proportions as the feed for the layer formation: (1) a mixture of a gas having Si as a constituent atom, a gas having N as a constituent atom, and if necessary, a gas having H as a constituent atom or/and a gas having X as a constituent atom; (2) a mixture of a gas having Si as a constituent atom and a gas having N and H as constituent atoms or/and a gas having N and X as constituent atoms; and (3) a mixture of a gas having Si as a constituent atom and either a gas having Si, N, and H as constituent atoms or a gas having Si, N, and X as constituent atoms.

Besides the above materials, there may be used, as the starting gas, a mixture of a gas having Si and H as constituent atoms and a gas having N as a constituent atom or a mixture of a gas having Si and X as constituent atoms and a gas having N as a constituent atom.

Suitable halogens (X) for a constituent of the second layer are F, Cl, Br, and I; in particular F and Cl are favorable.

Effective starting gas for the formation of the second layer are gaseous at ordinary temperature and pressure or readily gasifiable.

As the methods for forming the second layer (II) from an amorphous material, there are mentioned methods of glow discharge, sputtering, ion implantation, ion plating and electron-beaming.

The formation of the second layer according to the sputtering method can be carried out, for instance, in the two following ways:

The first way is that a target formed of Si is sputtered in an inert gas such as Ar or He or a gas mixture based on the inert gas in a vacuum deposition chamber for sputtering. In this case, an nitrogen(N)-introducing gas and, if necessary, hydrogen(H)-introducing or/and halogen(X)-introducing gases are fed into the chamber.

The second way is that a target made of $Si_3N_4$ two targets made of Si and $Si_3N_4$ respectively, or a target made of $Si-Si_3N_4$ mixture is used as a target for sputtering. When an nitrogen(N)-introducing gas, in this case, is fed into the deposition chamber for sputtering, the content of nitrogen atoms in the second layer can be readily controlled as desired by manipulating the flow of the feed gas.

The content of nitrogen atoms introduced into the second layer can be suitably controlled as intended by manipulating the flow of the N-introducing feed gas, as stated above, or adjusting the proportion of nitrogen atoms in the N-introducing target in the preparation thereof or further combining the above two methods.

Suitable material for use in the invention to supply silicon atoms (Si) during the formation of the second layer include gaseous or gasifiable hydrogenated silicons, e.g. $SiH_4$, $Si_2H_6$, $Si_3H_8$, and $Si_4H_{10}$. In particular, $SiH_4$ and $Si_2H_6$ are preferred because of the ease of handling for the layer formation and the high efficiency for Si supply.

When using the above hydrogenated silicon, it is possible to introduce H along with Si into the forming second layer under suitably selected conditions of layer formation.

Besides the above cited hydrogenated silicons, effective starting gas for Si supply include halogen(X)-containing silicon compounds, i.e. halogen-substitution derivatives of silanes or silicon halides, e.g. $SiF_4$, $Si_2F_6$, $SiCl_4$, and $SiF_4$.

Another group of effective starting materials for supplying Si to the second layer are gaseous or gasifiable silicon halides containing hydrogen (H) as a constituent atom, or halogen-substituted silanes, e.g. $SiH_2F_2$, $SiH_2I_2$, $SiH_2Cl_2$.

When using the above halogen-containing silicon compound, it is also possible, as stated above, to introduce halogen (X) atoms along with Si into the growing second layer under suitably selected conditions of layer formation.

Of the above raw materials, hydrogen-containing silicon halides (halogen-substituted silanes) are used as favorable starting materials for halogen introduction in the invention since these compounds in the formation of the second layer serve to introduce hydrogen atoms (H), which are very effective for controlling electrical or photoelectric properties of the layer, along with halogen atoms into the layer.

Effective starting gas for use in the invention to introduce halogen atoms (X) into the growing second layer include, besides the above-cited compounds, halogen gases, e.g. fluorine, chlorine, bromine, and iodine, interhalogen compounds, e.g. BrF, ClF, $ClF_3$, $BrF_5$, $BrF_3$, $IF_3$, $IF_7$, ICl, and IBr, and hydrogen halides, e.g. HF, HCl, HBr, and HI.

Effective starting gas for introducing nitrogen atoms (N) into the growing second layer include nitrogen compound constituted of N atoms or N and H atoms such as gaseous nitrogen and gaseous or gasifiable nitrides and azides, e.g. nitrogen ($N_2$), ammonia ($NH_3$), hydrozine ($H_2N.NH_2$), hydrogen azide ($HN_3$), and ammonium azide ($HN_4N_3$) Besides these compounds, nitrogen halides such as nitrogen trifluoride ($F_3N$) and dinitrogen tetrafluoride ($F_4N_2$) can be used as raw materials which serve to introduce halogen atoms in addition to nitrogen atoms.

Suitable diluent gases for use in the formation of the second layer according to the glow discharge method or sputtering methods are so-called rare gases, e.g. He, Ne, and Ar.

The second layer is formed with care so as to possess necessary characteristics as required.

That is, the substance constituted of Si and N and if necessary, H or/and X can take any form between crystalline and amorphous and exhibit any of conductor, semiconductor, and insulator properties depending upon operational conditions of the formation thereof. Accordingly, the operational conditions are strictly chosen so that $a-(Si_xN_{1-x})_y(H,X)_{1-y}$ having desired characteristics fitted to objects thereof will be obtained. For instance, when the second layer is formed aiming mainly at improvement of the voltage resistance, the $a-(Si_xN_{1-x})_y(H,X)_{1-y}$ is prepared in such amorphous form as to exhibit eminent electric insulation behavior under environmental service conditions.

When the second layer is formed aiming mainly at improvements of characteristics for continuous repeated operations and of resistance to service environments, the above requirements on electric insulation properties is loosened in some degree and $a-(Si_xN_{1-x})_y(H,X)_{1-y}$ is prepared in such amorphous form as to have a some degree of sensitivity to the light used for the irradiation.

The substrate temperature during the formation of the second layer (II) comprising $a-(Si_xN_{1-x})_y(H,X)_{1-y}$ on the first layer (I) is an important factor affecting the structure and properties of the resulting layer. Hence it is desired that the substrate temperature be exactly controlled so that an $a-(Si_xN_{1-x})_y(H,X)_{1-y}$ having intended characteristics will be formed as desired.

The formation of the second layer (II) is performed after proper selection of the optimum range of substrate temperature as well as the method of forming the layer for achieving intended purposes thereof effectively. In general, the substrate temperature is in the range of suitably 20° to 400° C., more suitably 50° to 350° C., and most suitably 100° to 300° C. For the formation of the second layer (II), the glow discharge method and the sputtering method are advantageous in that the fine control of the layer composition and the control of the layer thickness are relatively easy as compared with other methods, while the electric discharge power, similarly to the substrate temperature, is an important factor affecting characteristics of the resulting $a-(Si_xN_{1-x})_y(H,X)_{1-y}$.

The electric discharge power is desirably 1.0–300 W, preferably 2.0–250 W, particularly preferably 5.0–200 W, for effective formation of $a-(Si_xN_{1-x})_y(H,X)_{1-y}$ with good producitivity so as to give such characteristics thereto as to achieve objects of the invention.

Gas pressure in the deposition chamber is desirably 0.01–1 Torr, preferably 0.1–0.5 Torr.

While the above ranges of substrate temperature and of electric discharge power are desirable, the optimum ranges of these factors affecting the layer formation are decided not independently of each other but desirably depending upon organic correlation therebetween so as to result in the second layer (II) having desired characteristics.

The content of nitrogen atoms in the second layer (II), similarly to the above noted conditions of the layer formation, is another important factor to give the layer desired characteristics for achieving objects of the invention. This nitrogen atom content is suitably chosen according to the nature and characteristics of the amorphous material cnstructing the second layer (II).

That is, the amorphous materials represented by the general formula $a-(Si_xN_{1-x})_y(H,X)_{1-y}$ are roughly classified into amorphous materials constituted of silicon and nitrogen atoms (hereinafter these materials are represented by "$a-Si_aN_{1-a}$", wherein $0<a<1$), those constituted of silicon, nitrogen, and hydrogen atoms (hereinafter these materials are represented by "$a-(Si_bN_{1-b})_cH_{1-c}$", wherein $0<b, c<1$), and those constituted of silicon, nitrogen, and halogen atoms and if necessary, hydrogen atoms (hereinafter these materials are represented by "$a-(Si_dN_{1-d})_e(H,X)_{1-e}$", wherein $0<d, e<1$).

When the second layer (II) consisted of $a-Si_aN_{1-a}$, the content of nitrogen atoms therein is desirably $1\times10^{-3}$–60 atomic %, preferably 1–50 atomic %, particularly preferably 10–45 atomic %. Expressing this in terms of a of $a-Si_aN_{1-a}$, a is desirably 0.4–0.99999, preferably 0.5–0.99, particularly preferably 0.55–0.9.

When the second layer consisted of $a-(Si_bN_{1-b})_cH_{1-c}$, the content of nitrogen atoms therein is desirably $1\times10^{-3}$–55 atomic %, preferably 1–55 atomic %, particularly preferably 10–55 atomic %. The content of hydrogen atoms therein is desirably 1–40 atomic %, preferably 2–35 atomic %, particularly preferably 5–30 atomic %. When the hydrogen atom content is in these ranges, the photoconductive member is sufficiently adaptable for practical use.

Expressing these contents in terms of b and c of $a-(Si_bN_{1-b})_cH_{1-c}$, b is desirably 0.45–0.99999, preferably 0.45–0.99, particularly preferably 0.45–0.9, and c is desirably 0.6–0.99, preferably 0.65–0.98, particularly preferably 0.7–0.95.

When the second layer (II) consisted of $a-(Si_dN_{1-d})_e(H,X)_{1-e}$, the content of nitrogen atoms therein is desirably $1\times10^{-3}$–60 atomic %, preferably 1–60 atomic %, particularly preferably 10–55 atomic %. The content of halogen atoms therein is desirably 1–20 atomic %, preferably 1–18 atomic %, particularly preferably 2–15 atomic %. When the halogen atom content is in these ranges, the photoconductive member is sufficiently adaptable for practical use. The content of hydrogen atoms incorporated as required in the second layer is desirably up to 19 atomic %, preferably up to 13 atomic %.

Expressing these contents in terms of d and e of $a(-Si_dN_{1-d})_e(H,X)_{1-e}$, d is desirably 0.4–0.99999, preferably 0.4–0.99, particularly preferably 0.45 –0.9, and e is desirably 0.8–0.99, preferably 0.82–0.99, particularly preferably 0.85–0.98.

The range of thickness of the second layer (II) in the invention is also one of the important factors to effective achievement of objects of the invention. The range is suitably chosen according to intended purposes so as to achieve objects of the invention effectively.

The thickness of the second layer (II) needs to be properly chosen in consideration of the relation to the thickness of the first layer (I) and the organic relation with characteristics required for these layers. In addition to these, the economy including production efficiency and mass productivity is desirably taken into account for choosing the thickness.

The thickness of the second layer (II) is desirably 0.003–30μ, preferably 0.004–20μ, particularly preferably 0.005–10μ.

Another preferred embodiment of the second layer (II) consists of an amorphous material containing silicon atoms (Si), oxygen atoms (O), and if necessary, hydrogen atoms (H) or/and halogen atoms (X) (hereinafter this amorphous material is represented by the formula $a-(Si_xO_{1-x})_y(H,X)_{1-y}$, wherein $0<x$, $y<1$). The second layer (II) of this type can be formed according to the glow discharge method, sputtering method, ion implantation method, ion plating method, electron beam method, etc. In practice, one of these methods is suitably chosen depending upon such factors as production conditions, degree of investement on equipment, production scale, characteristics required for the photoconductive member to be produced, and so forth. In general, the glow discharge method and the sputtering method are favorable in that operational conditions for producing the photoconductive member having required characteristics are relatively easy to control and oxygen and halogen atoms, together with silicon atoms, can be easily introduced into the second layer (II) to be formed.

The second layer (II) may also be formed by combined application of glow discharge and sputtering methods in one deposition chamber.

The formation of the second layer according to the glow discharge method can be accomplished by feeding a starting gas suitable for forming $a-(Si_xO_{1-x})_y(H,X)_{1-y}$, mixed, if necessary, with a diluent gas in a predetermined mixing ratio, into a vacuum deposition chamber in which a substrate overlaid with a first layer has been fixed, and generating a glow discharge in the chamber to form a plasmic atmosphere of fed gas, thereby depositing $a-(Si_xO_{1-x})_y(H,X)_{1-y}$ on the first layer (I).

In the invention, most of the compounds gaseous or gasifiable having at least one of silicon (Si), oxygen (O), hydrogen (H), and halogen (X) as a constituent atom can be used as a starting gas for the formation of a $O_{1-x})_y(H,X)_{1-y}$.

When a gas having Si as a constituent atom is employed as a starting gas out of Si, O, H and X the following mixtures of gases can be used each in intended mixing proportions as the feed for the formation of the second layer: (1) a mixture of a gas having Si as a constituent atom, a gas having O as a constituent atom, and if necessary, a gas having H as a constituent atom or-/and a gas having X as a constituent atom; (2) a mixture of a gas having Si as a constituent atom with a gas having O and H as constituent atoms or/and a gas having O and X as constituent atoms; and (3) a mixture of a gas having Si as a constituent atom and either a gas having Si, O, and H as constituent atoms or a gas having Si, O, and X as constituent atoms.

Besides the above, the following mixtures can also be used as the raw material: a mixture of a gas having Si and H as constituent atoms and a gas having O as a constituent atom; and a mixture of a gas having Si and X as constituent atoms and a gas having O as a constituent atom.

Suitable halogens (X) for a constituent of the second layer are F, Cl, Br, and I; in particular F and Cl are favorable.

Effective raw materials for use in the invention to form the second layer are compounds gaseous at ordinary temperature and pressure or readily gasifiable.

The formation of the second layer (II) according to the sputtering method is carried out, for instance, in the two following ways:

The first way is that a target formed of Si is sputtered in an inert gas such as Ar or He or a gas mixture based on the inert gas in a vacuum deposition chamber for sputtering. In this case, an oxygen atom (O)-introducing gas and if necessary, hydrogen atom (H)-introducing or/and halogen atom (X)-introducing gases are fed into the chamber.

The second way is that a target made of $SiO_2$, two targets made of Si and $SiO_2$ respectively, or a target made of $Si-SiO_2$ mixture is used for sputtering. In this case, the content of oxygen atoms (O) introduced into the second layer can be controlled with ease as desired by using additionally an oxygen (O)-introducing gaseous raw material and regulating the flow of the feed gas, or by adjusting the oxygen content in the oxygen (O)-introducing target in the preparation thereof. These two control methods can be combined.

Effective Si-supply materials for use in this embodiment include gaseous or gasifiable silanes, e.g. $SiH_4$, $Si_2H_6$, $Si_3H_8$, and $Si_4H_{10}$, among which $SiH_4$ and $Si_2H_6$ are particularly preferred because of the ease of handling for the layer formation and the high efficiency of Si-introduction. When these materials are used, H can be introduced together with Si in the growing second layer (II) by suitable selection of layer forming conditions.

Besides the above silanes, effective raw material for Si introduction include halogen (X)-containing silicon compounds such as halogen-substituted silanes or silicon halides, e.g. $SiF_4$, $Si_2F_6$, $SiCl_4$, and $SiBr_4$.

Other examples of the effective raw material for Si introduction into the second layer (II) are halogenated compounds, gaseous or gasifiable, having hydrogen as a constituent atom, such as halogen-substituted silanes, e.g. $SiH_2F_2$, $SiH_2I_2$, $SiH_2Cl_2$, $SiHCl_3$, $SiH_2Br_2$, and $SiHBr_3$.

Also when these halogen(X)-containing silicon compounds are used, X together with Si can be introduced into the growing second layer by suitable selection of layer forming conditions.

The hydrogen-containing silicon halides (halogen-substituted silanes), among the above cited raw materials, are favorably used since these compounds serve to introduce hydrogen atom (H) which are very effective in controlling electric or photoelectric properties of the second layer (II), along with halogen atoms (X) into the layer during formation thereof.

Effective halogen(X)-introducing raw materials used for the second layer (II) formation include, for example, besides the above compounds; halogens such as $F_2$, $Cl_2$, $Br_2$, and $I_2$; interhalogen compounds such as BrF, ClF, $ClF_3$, $BrF_5$, $BrF_3$, $IF_3$, $IF_7$, ICl, and IBr; and hydrogen halides such as HF, HCl, HBr, and HI.

Effective oxygen(O)-introducing raw materials used for the second layer (II) formation include; compounds constituted of oxygen atoms (O) or oxygen (O) and nitrogen (N) atoms, e.g. oxygen ($O_2$), ozone ($O_3$), nitrogen monoxide (NO), nitrogen dioxide ($NO_2$), nitrogen suboxide ($N_2O$), dinitrogen trioxide ($N_2O_3$), dinitrogen tetroxide ($N_2O_4$), dinitrogen pentaoxide ($N_2O_5$), and nitrogen trioxide; and lower silaxanes, which are constituted of silicon (Si), oxygen (O), and hydrogen (H) atoms, e.g. disiloxane ($H_3Si.O.SiCH_3$) and trisiloxane ($H_3Si.O.SiH_2.O.SiCH_3$).

Suitable diluent gases for use in the formation of the second layer (II) according to the glow discharge method or sputtering method are rare gases, e.g. He, Ne, and Ar.

The second layer is formed with care so as to have necessary characteristics as intended. That is, the second layer material constituted of Si, O, and if necessary, H or/and X takes any form ranging from crystalline to amorphous and exhibits any of electrical properties of conductor, semiconductor, and insulator depending upon operational conditions of the formation thereof. Accordingly, the operational conditions are strictly chosen so that $a-(Si_xO_{1-x})_y(H,X)_{1-y}$ having desired characteristics fitted to objects thereof will be obtained. For instance, when the second layer (II) is formed aiming mainly at improvement of the voltage resistance, the $a-(Si_xO_{1-x})_y(H,X)_{1-y}$ is prepared in amorphous form so as to exhibit eminent electric insulation properties in service environments.

When the second layer is formed aiming at improvements of characteristics for continuous repeated operations and of resistance to service environments, the above requirement on electric insulation properties is somewhat loosed and the $a-(Si_xO_{1-x})_y(H,X)_{1-y}$ is prepared in amorphous form so as to have a some degree of sensitivity to the light used for the irradiation.

The substrate temperature during the formation of the second layer (II) consisted of $a-(Si_xO_{1-x})_y(H,X)_{1-y}$ on the first layer (I) is an important factor affecting the structure and properties of the resulting layer. Accordingly, it is desired that the substrate temperature be exactly controlled so that an $a-(Si_xO_{1-x})_y(H,X)_{1-y}$ having intended characteristics may be formed as desired.

The formation of the second layer is performed after proper selection of the optimum range of substrate temperature as well as the method of forming the second layer for achieving intended purposes effectively. In general, the temperature range is 20°–400° C., more suitably 50°–350° C., and most suitably 100°–300° C. For the formation of the second layer, the glow discharge method and the sputtering method are advantageous in that the fine control of the layer composition and the control of the layer thickness are relatively easy as compared with other methods, the electric discharge power, similarly to the substrate temperature, is one of the important factors affecting characteristics of the resulting $a-(Si_xO_{1-x})_y(H,X)_{1-y}$.

The electric discharge power is desirably 1.0–300 W, preferably 2.0–250 W, particularly preferably 5.0–200 W, for performing effective, good productivity formation of $a-(Si_xO_{1-x})_y(H,X)_{1-y}$ which has such characteristics as to achieve objects of the invention.

Gas pressure in the deposition chamber is desirably 0.01–1 Torr, preferably 0.1–0.5 Torr.

While the above ranges of substrate temperature and of electric discharge power are desirable, the optimum ranges of these factors affecting the layer formation are decided not independently of each other but dependently upon organic correlation therebetween so as to give the second layer (II) having desired characteristics.

The content of oxygen atoms in the second layer (II), similarly to the above noted conditions of the second layer formation, is an important factor to give the second layer (II) desired characteristics for achieving objects of the invention. This oxygen atom content is suitably chosen according to the nature and characteristics of the amorphous material composing the second layer.

That is, the amorphous materials represented by the general formula $a-(Si_xO_{1-x})_y(H,X)_{1-y}$ are roughly classified into amorphous materials constituted of silicon and oxygen atoms (hereinafter these materials are represented by "$a-Si_aO_{1-a}$", (wherein $0<a<1$), those constituted of silicon, oxygen, and hydrogen atoms (hereinafter these materials are represented by "$a-(Si_bO_{1-b})_cH_{1-c}$", wherein $0<b, c<1$), and those constituted of silicon, oxygen, and halogen atoms, and if necessary, further hydrogen atoms (hereinafter these materials are represented by "$a-(Si_dO_{1-d})_e(H,X)_{1-e}$", wherein $0<d, e<1$).

When the second layer (II) is constituted of $a-Si_aO_{1-a}$, the oxygen content in this layer is expressed in terms of a of $a-Si_aO_{1-a}$, as follows: a is desirably 0.33–0.99999, preferably 0.5–0.99, particularly preferably 0.6–0.9.

When the second layer consisted is $a-(Si_bO_{1-b})_cH_{1-c}$, the oxygen content in this layer is expressed in terms of b and c of $a-(Si_bO_{1-b})_cH_{1-c}$ as follows: b is desirably 0.33–0.99999, preferably 0.5–0.99, particularly preferably 0.6–0.9 and c is desirably 0.6–0.99, preferably 0.65–0.98, particularly preferably 0.7–0.95.

When the second layer (II) consists of $a-(Si_dO_{1-d})_e(H,X)_{1-e}$, the oxygen content in this layer is expressed in terms of d and e of $a-(Si_dO_{1-d})_e(H,X)_{1-e}$ as follows: d is desirably 0.33–0.99999, preferably 0.5–0.99, particularly preferably 0.6–0.9 and e is desirably 0.8–0.99, preferably 0.82–0.99, particularly preferably 0.85–0.98.

The thickness range of the second layer (II) is also an important factor to effective achievement of objects of the invention. That is, this thickness is suitably chosen so that objects of the invention will be achieved effectively. When choosing the thickness, it is necessary to take into account the content of oxygen atoms in the second layer (II), the relation to the thickness of the first layer (I), and also the organic connection with characteristics required for the layer region. In addition, it is desirable to consider the economy including production efficiency and mass-productivity.

In general, the thickness of the second layer is desirably 0.003–30μ, preferably 0.004–20μ, particularly preferably 0.005–10μ.

The second layer may also be composed of a mixture of (1) an amorphous material which has silicon atoms as matrix and contains carbon atoms with (2) an amorphous material which has silicon atoms as matrix and contains oxygen atoms.

The substrate used in the invention may be either conductive or nonconductive electrically. Suitable materials for the conductive substrate include metals and alloys, e.g. NiCr, Stainless steel, Al, Cr, Au, Nb, Ta, V, Ti, Pt, and Pd. For the nonconductive (insulating) substrate, there are commonly used films or sheets of synthetic resins, e.g. polyester, polyethylene, polycarbonate, cellulose acetate, polypropylene, poly(vinyl chloride), poly(vinylidene chloride), polystyrene, and polyamide; glass and ceramic plates; and paper. Desirably, at least one side of the insulating substrate is treated to give conductivity. Then, the treated surface is overlaid with other functional layers.

For example, when the substrate is made of glass, conductivity is given to one side of the substrate by covering it with a film of NiCr, Al, Cr, Mo, Au, Ir, Nb, Ta, V, Ti, Pt, Pd, $In_2O_3$, $SnO_2$, or ITO ($In_2O_3+SnO_2$). When the substrate is a film of synthetic resin, e.g. a polyester film, one side of the substrate is covered with a film of metal such as NiCr, Al, Ag, Pd, Zn, Ni, Au, Cr, Mo, Ir, Nb, Ta, V, Ti, or Pt by vacuum deposition, electron-beam vapor deposition, or sputtering or a foil of the above metal is laminated upon one side of the substrate; thus conductivity is given. The substrate may take any possible form such as cylindrical, belt-like, plate-like, or some other form. The shape of the substrate is suitably chosen; for instance, when the photoconductive member 100 shown in FIG. 1 is used as an electrophotographic image forming member, the substrate thereof is desired to be in the form of endless belt or cylinder. The thickness of the substrate is suitably chosen so that an intended photoconductive member will be formed. When flexibility is required for the photoconductive member, the thickness of the substrate is minimized within the limit of sufficient functions retained by the substrate. However, the thickness, even in such a case, is desirably to be $10\mu$ or more in view of difficulties in the fabrication, handling, and mechanical strength of the substrate.

The process for producing the photoconductive member of the invention is outlined below by way of an example.

FIG. 11 shows an apparatus for the production of the photoconductive member of the invention.

Bombs 1102–1105 are filled with gaseous raw materials for the formation of photoconductive members of the invention. For example, the bomb 1102 is filled with He-diluted $SiH_4$ gas (99.999% purity, hereinafter designated as $SiH_4$/He), bomb 1103 with He-diluted $GeH_4$ gas (99.999% purity, hereinafter designated as $GeH_4$/He), bomb 1104 with He-diluted $B_2H_6$ gas (99.99% purity, hereinafter designated as $B_2H_6$/He), bomb 1105 with $C_2H_4$ gas (99.999% purity), and bomb 1106 with $H_2$ gas (99.999% purity).

For introducing these gas into the reaction chamber 1101; the valves 1122–1126 of the bombs 1102–1106 and the leak valve 1135 are confirmed to be closed; inflow valves 1112–1116, outflow valves 1117–1121, and auxiliary valves 1132 and 1133 are confirmed to be opened; then the main valve 1134 is opened to evacuate the reaction chamber 1101 and all the pipes; and when the vacuum gage 1136 indicates a vacuum of about $5 \times 10^{-6}$ Torr, the auxiliary valves 1132 and 1133 and the outflow valves 1117–1121 are closed.

An example of the formation of a light receiving layer on a cylindrical substrate 1137 is given below. The valves 1122–1125 are opened, the pressures at outlet pressure gages are adjusted to 1 Kg/cm$^2$, and the inflow valves 1112–1115 are gradually opened to introduce $SiH_4$/He gas from the bomb 1102, $GeH_4$/He gas from the bomb 1103, $B_2H_2$/He gas if necessary from the bomb 1104, and $C_2H_4$ gas from the bomb 1105 into mass-flow controllers 1107–1110. Then the outflow valves 1117–1120 and the auxiliary valve 1132 are gradually opened to introduce each gas into the reaction chamber 1101. At this time, the outflow valves 1117–1120 are regulated to adjust proportions of $SiH_4$/He gas, $GeH_4$/He gas and $C_2H_4$ gas flows, and when boron atoms (B) are incorporated into the forming layer, the proportion of $B_2H_6$/He gas flow to intended values. Additionally, the opening of the main valve 1134 is regulated to adjust the pressure in the reaction chamber 1101 to an intended value while reading the indication of the vacuum gage 1136. After confirmation that the substrate 1137 is heated by the heater 1138 and set to a prescribed temperature between 50° and 400° C., the power source 1140 is set to a prescribed value to generate a glow discharge in the reaction chamber 1101, and at the same time the flow of $GeH_4$/He gas is gradually varied with time according to a predetermined flow rate changing curve by regulating the outflow valve 1118 manually or with an external driving motor, whereby the distribution of Ge atoms in the resulting layer is controlled.

In this way, a layer region (N) of a layer region (B,C) of desired thickness comprising a—$SiGe(H,X)$ is formed on the substrate 1137. In the layer region, carbon atoms (C) or carbon (C) and boron (B) atoms are contained and germanium atoms are distributed according to the predetermined distribution curve.

Then, an upper layer region comprising a—$SiGe(H,X)$, wherein one or more of the species of boron atoms (B) and carbon atoms are contained and germanium atoms are distributed according to the predetermined distribution curve, is formed on the layer region (N) or (B, C) in the same manner under the same conditions as the above except that one or both of the outflow valves 1119 and 1120 are closed completely at the time the thickness of the layer region (N) or (B, C) reaches the intended value and that conditions of electric discharge are altered as required. Thus, the formation of a light receiving layer is completed.

In the formation of the light receiving layer, the laminar section (B) containing boron atoms and the laminar section (C) containing carbon atoms can be controlled each to a desired thickness by stopping the introduction of $B_2H_6$/He gas or $C_2H_4$ gas into the reaction chamber 1101 at a desired time after the initiation of forming the layer.

A desired distribution state of carbon atoms in the layer region (C) can be obtained by controlling the flow of $C_2H_4$ gas entering the reaction chamber 1101 according to a predetermined flow rate changing curve.

In corporation of halogen atoms into the light receiving layer can be accomplished by adding, for example, $SiF_4$ to the above gas mixture and glow discharge is generated.

For incorporating halogen atoms and none of hydrogen atoms into the light receiving layer, the $SiF_4$/He gas and $GeF_4$/He gas are used in place of the $SiF_4$/He gas and $GeH_4$/He gas.

For the purpose of completing a light receiving layer by utilizing the thus formed layer as a first layer and forming a second layer thereupon, the second layer is formed by feeding either $SiH_4$ gas and $NH_3$ gas or $SiH_4$ gas and NO gas, diluted if necessary with a rare gas such as He with the same valve operations as in the formation of the first layer, and generating a glow discharge under prescribed conditions. For using these gases, an $NH_3$ gas bomb or an NO gas bomb is added or substituted for a bomb not to be used.

Incorporation of halogen atoms into the second layer, the second layer is formed by using, for example, $SiF_4$ gas together with $C_2H_4$ gas, $SiF_4$ gas together with NO gas, or $SiH_4$ in addition these gases.

Needless to say, the outflow valves except those for the gases required to use are all closed during operation. In order to avoid the remaining of the gases used for the preceding formation of a layer, in the reaction chamber 1101 and in the lines from the outflow valves 1117–1121 to the reaction chamber 1101, the outflow valve 1117–1121 are closed, the auxiliary valves 1132 and 1133 are opened, the main valve 1134 is fully opened, the reaction chamber and said spaces of the pipe lines are once evacuated to a high vacuum. This procedure is performed as occasion demands.

The content of carbon or oxygen atoms in the second layer (II) can be controlled as desired by suitable manipulation of the flow ratio of $SiH_4$ gas to $NH_3$ gas or the flow ratio of $SiH_4$ gas to NO gas, introduced into the reaction chamber 1101 when the layer is formed by glow discharge, or by suitable adjustment of the area ratio of a silicon target to either a silicon nitride target or an $SiO_2$ target or suitable adjustment of the mixing ratio of silicon powder to either graphite powder or $SiO_2$ powder in the preparation of these targets when the layer is formed by sputtering. The content of halogen atoms (X) in the second layer (II) can be controlled as desired by suitable regulation of the flow of a halogen-introducing gas, e.g. $SiF_4$ gas fed into the reaction chamber 1101.

It is desirable to rotate the substrate at a constant speed by means of the motor 1139 during layer formation, for the purpose of uniforming the layer formation.

The following examples illustrate the invention in more detail.

EXAMPLE 1

Figure 12:
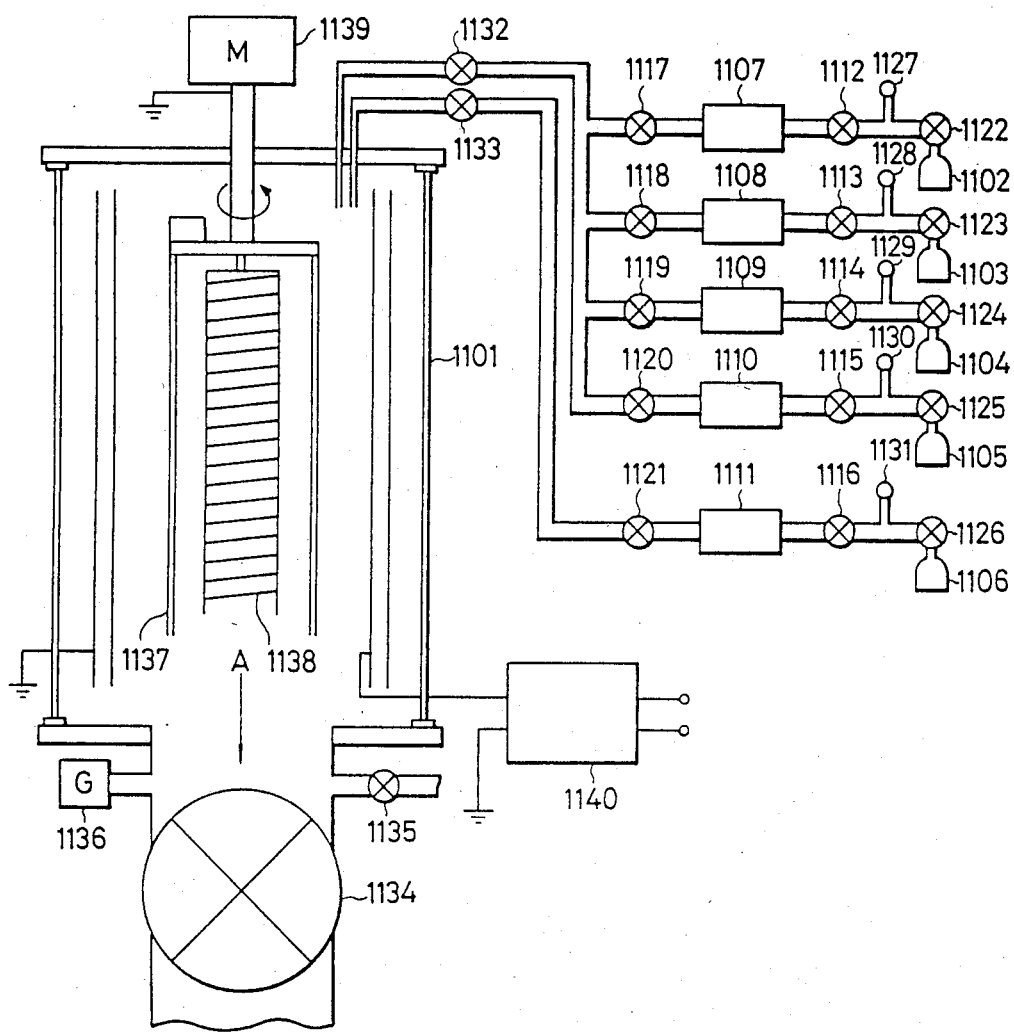
FIG. 12 is a schematic view illustrating the apparatus used for preparing photoconductive members of the invention.
Figure 13:
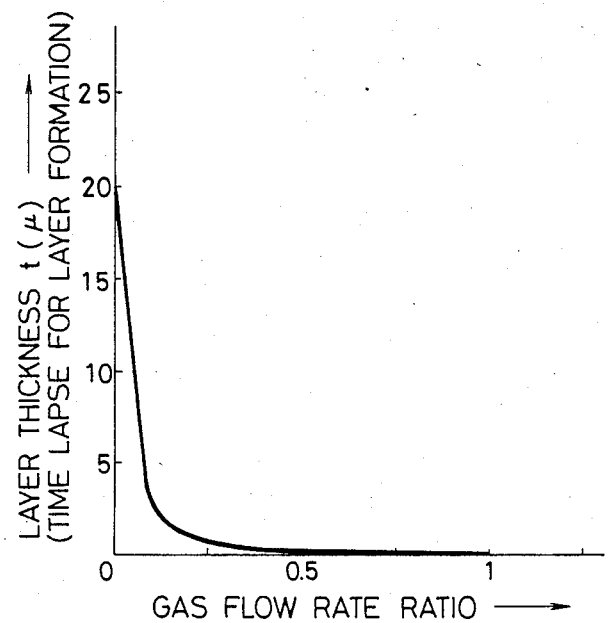
FIGS. 13 to 57 illustrate the changing curves of the gas flow ratio in the Examples of the invention.

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table A-1 following the changing curve of the gas flow rate ratio as shown in FIG. 13, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 2

Figure 14:
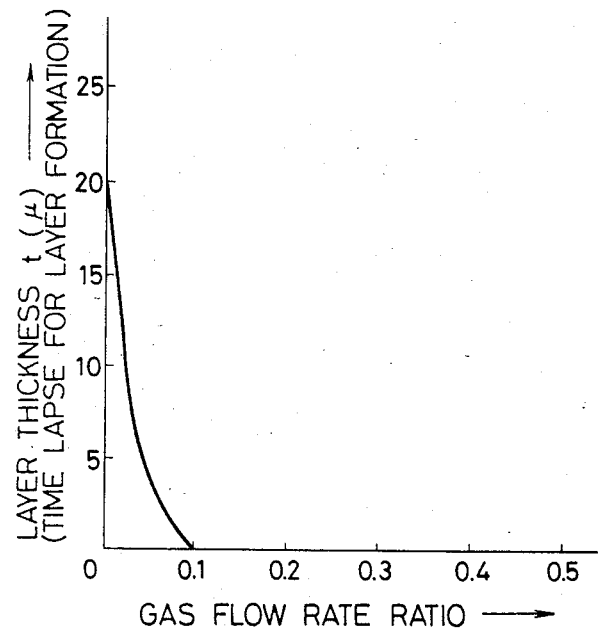

By the preparation device as shown in FIG. 12, layers were formed by changing the gas flow rate ratio of $GeH_4$/He gas to $SiH_4$/He gas along with the lapse of time for forming the layer under the condition of Table A-2 following the changing curve of the gas flow rate ratio as shown in FIG. 14 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 3

Figure 15:
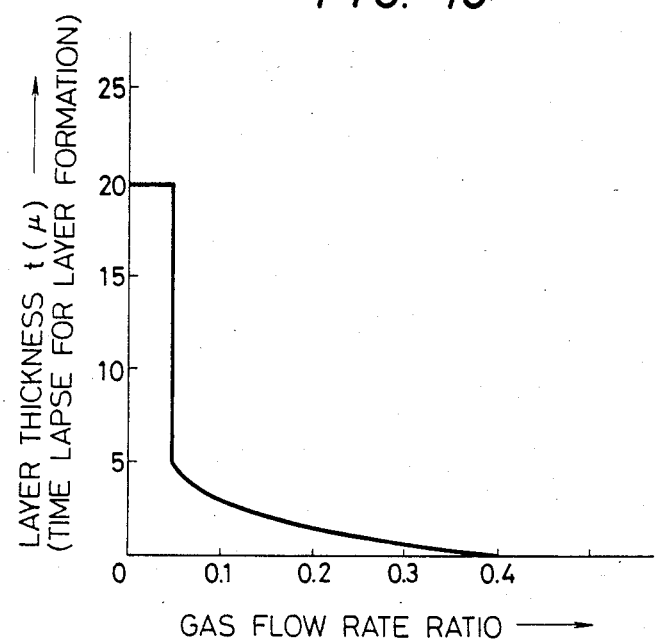

By the preparation device as shown in FIG. 12, layers were formed by changing the gas flow rate ratio of $GeH_4$/He gas to $SiH_4$/He gas along with the lapse of time for forming the layer under the condition of Table A-3 following the changing curve of the gas flow rate ratio as shown in FIG. 15 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 4

Figure 16:
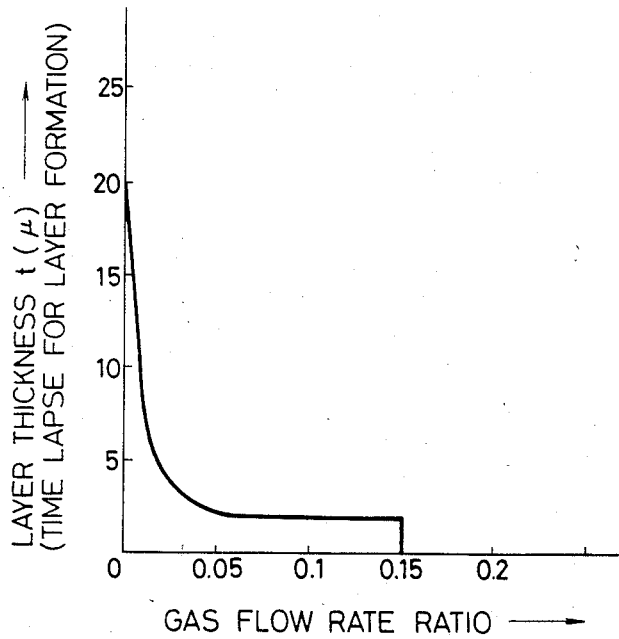

By the preparation device as shown in FIG. 12, layers were formed by changing the gas flow rate ratio of $GeH_4$/He gas to $SiH_4$/He gas along with the lapse of time for forming the layer under the condition of Table A-4 following the changing curve of the gas flow rate ratio as shown in FIG. 16 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 5

Figure 17:
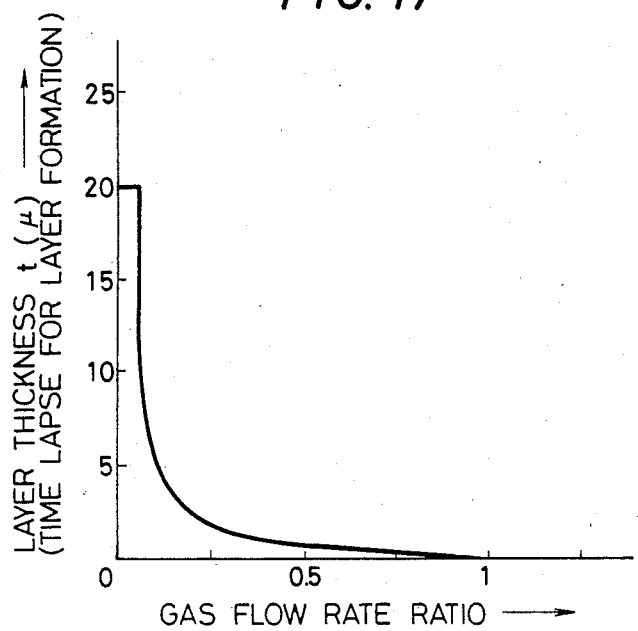

By the preparation device as shown in FIG. 12, layers were formed by changing the gas flow rate ratio of $GeH_4$/He gas to $SiH_4$/He gas along with the lapse of time for forming the layer under the condition of Table A-5 following the changing curve of the gas flow rate ratio as shown in FIG. 17 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 6

Figure 18:
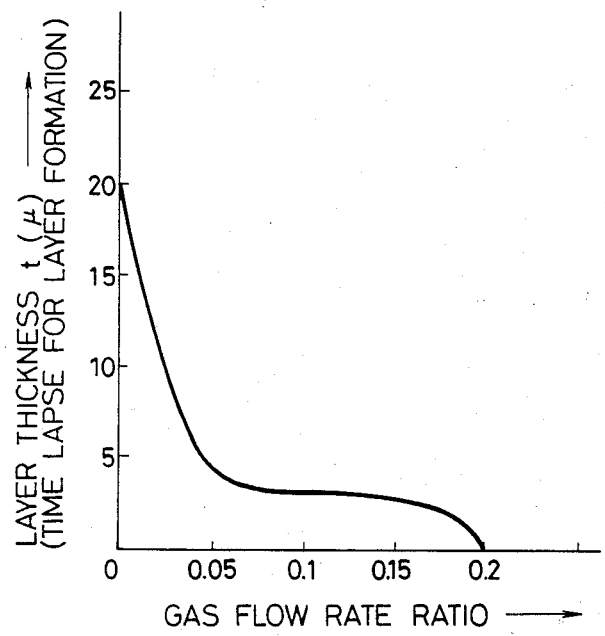

By the preparation device as shown in FIG. 12, layers were formed by changing the gas flow rate rario of $GeH_4$/He gas to $SiH_4$/He gas along with the lapse of time for forming the layer under the condition of Table A-6 following the changing curve of the gas flow rate ratio as shown in FIG. 18 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 7

Figure 19:
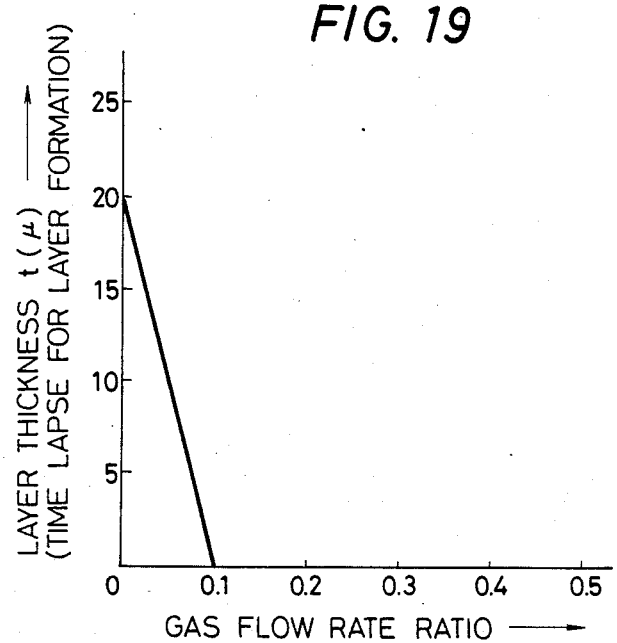

By the preparation device as shown in FIG. 12, layers were formed by changing the gas flow rate ratio of $GeH_4$/He gas to $SiH_4$/He gas along with the lapse of time for forming the layer under the condition of Table A-7 following the changing curve of the gas flow rate ratio as shown in FIG. 19 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 8

Layers were formed under the same conditions as Example 1 except that $Si_2H_6$/He gas was used in place of $SiH_4$/He gas used in Example 1 and that the operating condition was changed to that as shown in Table A-8. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 9

Layers were formed under the same conditions as Example 1 except that $SiF_4$/He gas was used in place of $SiH_4$/He gas used in Example 1 and that the operating condition was changed to that as shown in Table A-9. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 10

Layers were formed under the same conditions as Example 1 except that ($SiH_4$/He+$SiF_4$/He) gas was used in place of $SiH_4$/He gas used in Example 1 and that the operating condition was changed to that as shown in Table A-10. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 11

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table A-11 following the changing curve of the gas flow rate ratio as shown in FIG. 13, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 12

Figure 20:
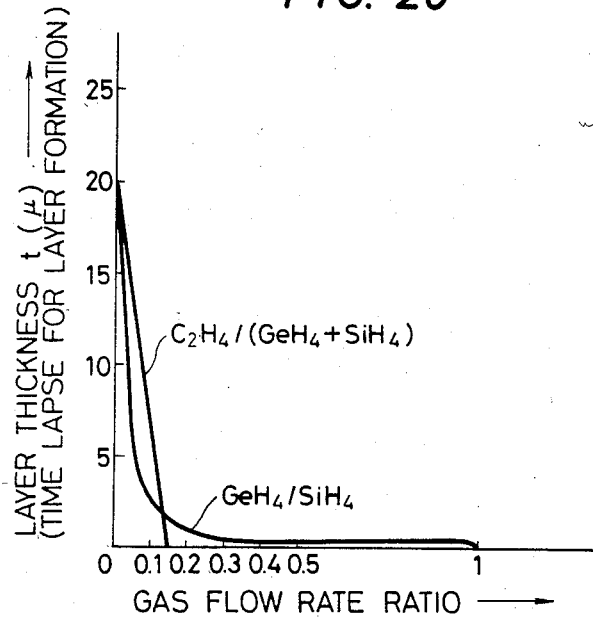

By the preparation device as shown in FIG. 12, layers were formed on an Al cylinder substrate by changing the gas flow rate ratio of $GeH_4$/He gas to $SiH_4$/He gas and that of $C_2H_4$ gas to $SiH_4$/He gas along with the lapse of time for forming the layer under the condition of Table A-12 following the changing curve of the gas flow rate ratio as shown in FIG. 20, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 13

Electrophotographic image forming members were produced under the same conditions as in Example 1 except that, upon formation of a first layer, flow rate ratio of $C_2H_4$ to ($SiH_4$+$GeH_4$) in Example 1 was changed as shown in Table A-13.

Using the resulting image forming members, image formation was effected on a transfer paper according to the same procedure and under the same conditions as in Example 1, whereby the results as shown in Table A-13 were obtained.

EXAMPLE 14

Electrophotographic image forming members were produced under the same conditions as in Example 1 except that the thickness of the first layer in Example 1 was changed as shown in Table A-14.

Using the resulting image forming members, image formations were effected on a transfer paper according to the same procedure and under the same conditions as in Example 1, whereby the results as shown in Table A-14 were obtained.

EXAMPLE 15

Toner images were formed under the same conditions for a toner image formation as in Example 1 except that electrostatic images were formed by using GaAs type semiconductor layer (10 mW) of 810 nm in place of a tungsten lamp used in Examples 1-10. The electrophotographic image forming members produced under the conditions of Examples 1-10 were evaluated as to quality of the transferred toner images. The images were clear images of high quality excellent in resolution with good gradation producibility.

The common layer forming conditions in Examples 1-15 of the present invention are as follows.
Substrate temperature:
  Layer containing germanium atom (Ge) . . . about 200° C.
  Layer not containing germanium atom (Ge) . . . about 250° C.
Discharge frequency: 13.56 MHz
Inner pressure in reaction chamber upon reaction: 0.3 Torr

EXAMPLE 16

Figure 21:
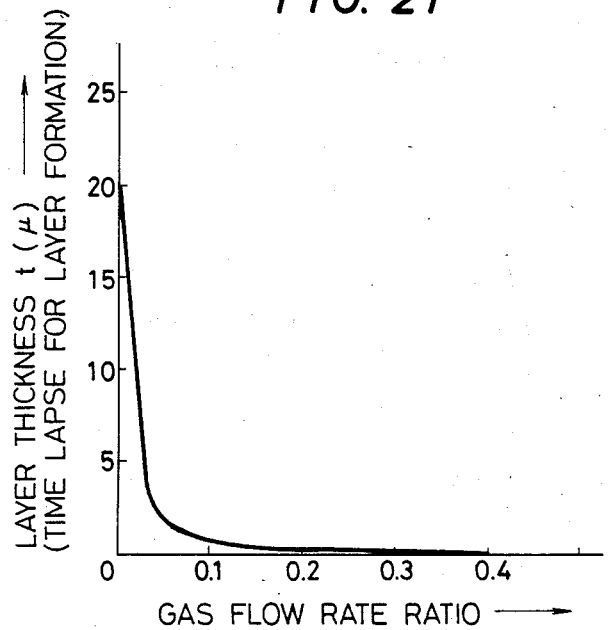

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table B-1 following the changing curve of the gas flow rate ratio as shown in FIG. 21, and thereby, an electrophotographic image forming member was produced.

The resulting image forming member was set in an experimental device for charging and exposure, and corona charging was effected at $\oplus$ 5.0 KV for 0.3 second, followed immediately by irradiation of a light image from a tungsten lamp source at a dose of 2 lux.sec through a transmissive type test chart.

Immediately thereafter, by cascading on the image forming member surface with $\ominus$ charged developer (containing toner and carrier), a good toner image was obtained on the image forming member surface. When the toner image on the image forming member was transferred to a transfer paper by corona charging at $\oplus$ 5.0 kV, there was obtained a clear image of high density excellent in resolution with good gradation reproducibility.

EXAMPLE 17

Figure 22:
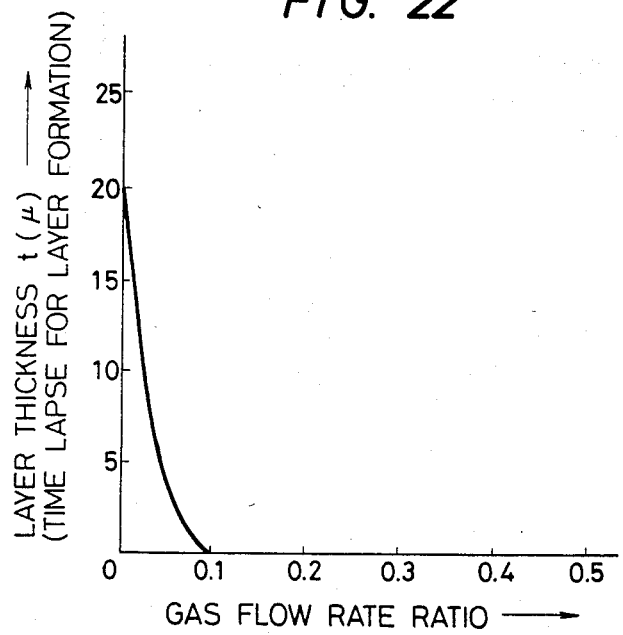

By the preparation device as shown in FIG. 12, layers were formed by changing the gas flow rate ratio of GeH$_4$/He gas to SiH$_4$/He gas along with the lapse of time for forming the layer under the condition of Table B-2 following the changing curve of the gas flow rate ratio as shown in FIG. 22 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 18

Figure 23:
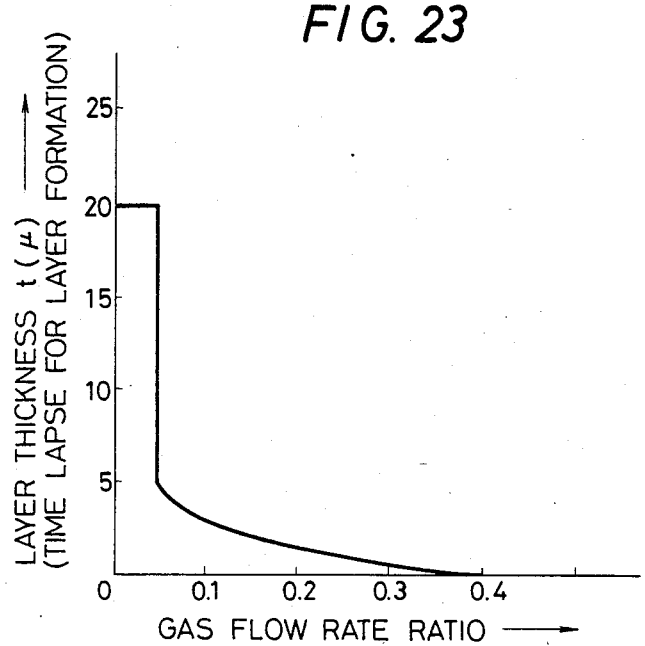

By the preparation device as shown in FIG. 12, layers were formed by changing the gas flow rate ratio of GeH$_4$/He gas to SiH$_4$/He gas along with the lapse of time for forming the layer under the condition of Table B-3 following the changing curve of the gas flow rate ratio as shown in FIG. 23 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 19

Figure 24:
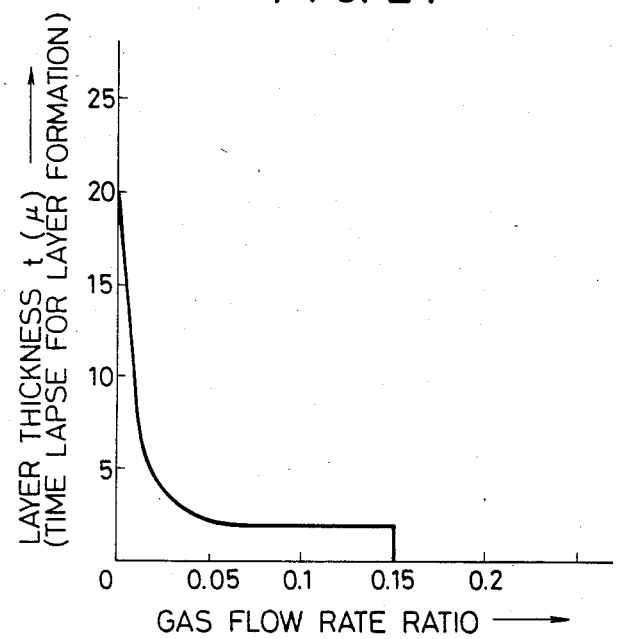

By the preparation device as shown in FIG. 12, layers were formed by changing the gas flow rate ratio of GeH$_4$/He gas to SiH$_4$/He gas along with the lapse of time for forming the layer under the condition of Table B-4 following the changing curve of the gas flow rate ratio as shown in FIG. 24 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 20

Figure 25:
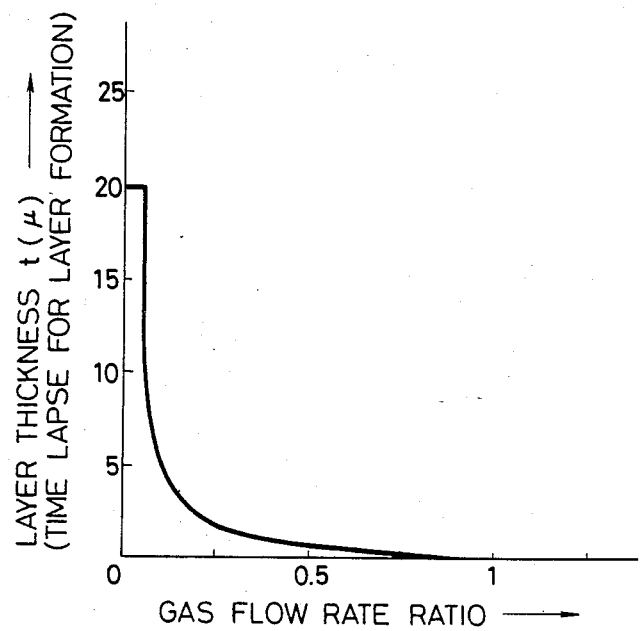

By the preparation device as shown in FIG. 12, layers were formed by changing the gas flow rate ratio of GeH$_4$/He gas to SiH$_4$/He gas along with the lapse of time for forming the layer under the condition of Table B-5 following the changing curve of the gas flow rate ratio as shown in FIG. 25 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 21

Figure 26:
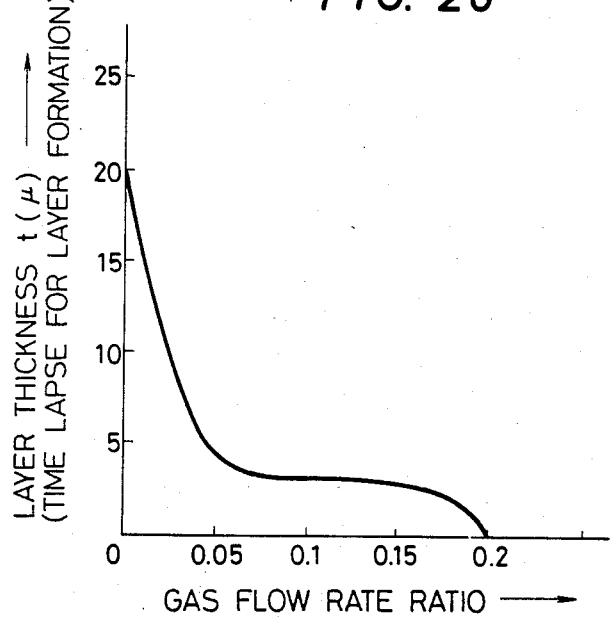

By the preparation device as shown in FIG. 12, layers were formed by changing the gas flow rate ratio of GeH$_4$/He gas to SiH$_4$/He gas along with the lapse of time for forming the layer under the condition of Table B-6 following the changing curve of the gas flow rate ratio as shown in FIG. 26 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 22

Figure 27:
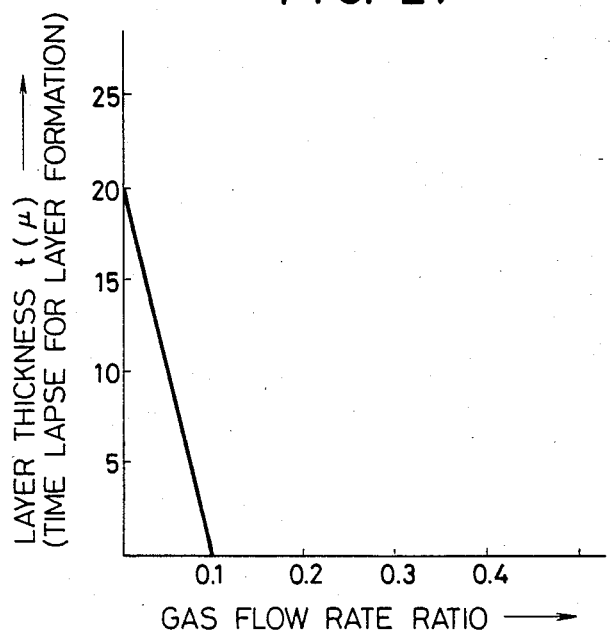

By the preparation device as shown in FIG. 12, layers were formed by changing the gas flow rate ratio of GeH$_4$/He gas to SiH$_4$/He gas along with the lapse of time for forming the layer under the condition of Table B-7 following the changing curve of the gas flow rate ratio as shown in FIG. 27 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 23

Layers were formed under the same conditions as Example 16 except that conditions as shown in Table B-8 –Table B-10 were used in place of the condition of Table B-1 used in Example 16. Thereby, electrophotographic image forming member (Sample Nos. 801–803) were produced.

Using each of the resulting image forming members, image formation was effected on the transfer paper according to the same procedure and under the same conditions as in Example 16, whereby a very clear image quality was obtained.

EXAMPLE 24

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table B-11 following the changing curve of the gas flow rate ratio as shown in FIG. 21, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 25

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table B-12 following the changing curve of the gas flow rate ratio as shown in FIG. 21, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surafce. When the toner image on the image forming member was transferred to a transfer paper by corona charging at ⊖ 5.0 kV, there was obtained a clear image of high density excellent in resolution with good gradation reproducibility.

EXAMPLE 26

By the preparation device as shown in FIG. 12, layers were formed by changing the gas flow rate ratio of $GeH_4$/He gas to $SiH_4$/He gas along with the lapse of time for forming the layer under the condition of Table B-13 following the changing curve of the gas flow rate ratio as shown in FIG. 22 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 27

By the preparation device as shown in FIG. 12, layers were formed by changing the gas flow rate ratio of $GeH_4$/He gas to $SiH_4$/He gas and that of $C_2H_4$ gas to $SiH_4$/He gas along with the lapse of time for forming the layer under the condition of Table B-14 following the changing curve of the gas flow rate ratio as shown in FIG. 23 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 28

By the preparation device as shown in FIG. 12, layers were formed by changing the gas flow rate ratio of $GeH_4$/He gas to $SiH_4$/He gas and that of $C_2H_4$ gas to $SiH_4$/He gas along with the lapse of time for forming the layer under the condition of Table B-15 following the changing curve of the gas flow rate ratio as shown in FIG. 24 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 29

By the preparation device as shown in FIG. 12, layers were formed by changing the gas flow rate ratio of $GeH_4$/He gas to $SiH_4$/He gas along with the lapse of time for forming the layer under the condition of Table B-16 following the changing curve of the gas flow rate ratio as shown in FIG. 25 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 30

By the preparation device as shown in FIG. 12, layers were formed by changing the gas flow rate ratio of $GeH_4$/He gas to $SiH_4$/He gas along with the lapse of time for forming the layer under the condition of Table B-17 following the changing curve of the gas flow rate ratio as shown in FIG. 26 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 31

By the preparation device as shown in FIG. 12, layers were formed by changing the gas flow rate ratio of $GeH_4$/He gas to $SiH_4$/He gas along with the lapse of time for forming the layer under the condition of Table B-18 following the changing curve of the gas flow rate ratio as shown in FIG. 27 and other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 32

Layers were formed under the same conditions as Example 25 except that each conditions as shown in Table B-19 –Table B-21 were used in place of the condition of Table B-12 used in Example 25. Thereby, electrophotographic image forming members (Sample Nos. 1901-1903) were produced.

Using each of the resulting image forming members, image formation was effected on the transfer paper according to the same procedure and under the same conditions as in Example 25, whereby a very clear image quality was obtained.

EXAMPLE 33

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table B-22 following the changing curve of the gas flow rate ratio as shown in FIG. 21, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 34

Toner images were formed under the same conditions for a toner image formation as in Examples 16 and 25 except that electrostatic images were formed by using GaAs type semiconductor laser (10 mW) of 810 nm in place of a tungsten lamp used in Examples 16 and 25. The electrophotographic image forming members produced under the conditions of Examples 16 and 25 were evaluated as to quality of the transferred toner images. The images were clear images of high quality excellent in resolution with good gradation reproducibility.

The common layer forming conditions in Examples 16-34 of the present invention are as follows.
Substrate temperature: Layer containing germanium atom (Ge) . . . about 200° C.
Discharge frequency: 13.56 MHz
Inner pressure in reaction chamber upon reaction: 0.3 Torr

EXAMPLE 35

Figure 28:
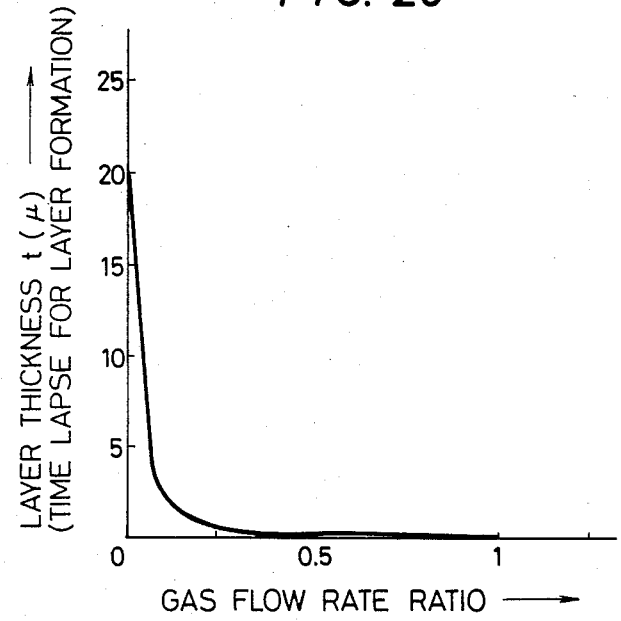

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table C-1 following the changing curve of the gas flow rate ratio as shown in FIG. 28, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0 kV, there was obtained a clear image of high density excellent in resolution with good gradation reproducibility.

EXAMPLE 36

Figure 29:
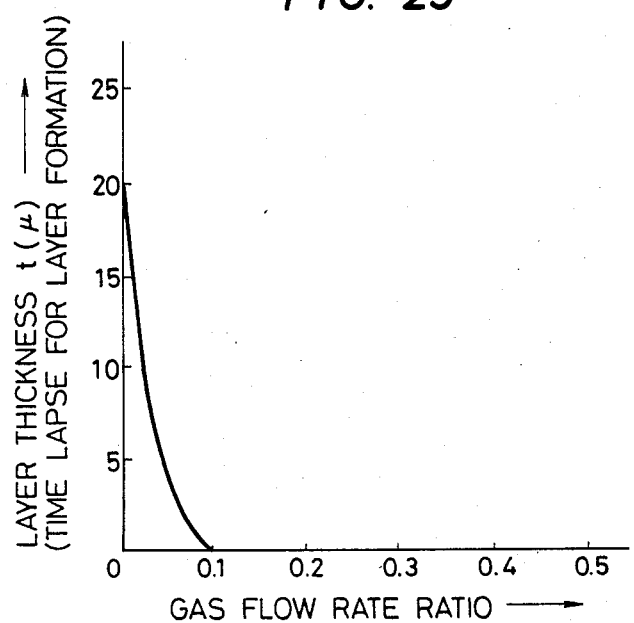

By the preparation device as shown in FIG. 12, layers were formed by changing the gas flow rate ratio of GeH$_4$/He gas to SiH$_4$/He gas along with the lapse of time for forming the layer under the condition of Table C-2 following the changing curve of the gas flow rate ratio as shown in FIG. 29 and other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 37

Figure 30:
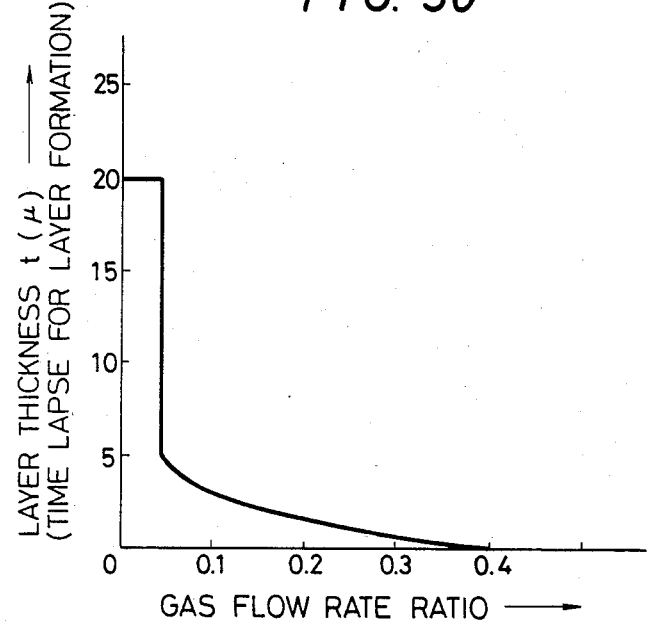

By the preparation device as shown in FIG. 12, layers were formed by changing the gas flow rate ratio of GeH$_4$/He gas to SiH$_4$/He gas along with the lapse of time for forming the layer under the condition of Table C-3 following the changing curve of the gas flow rate ratio as shown in FIG. 30 and other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 38

Figure 31:
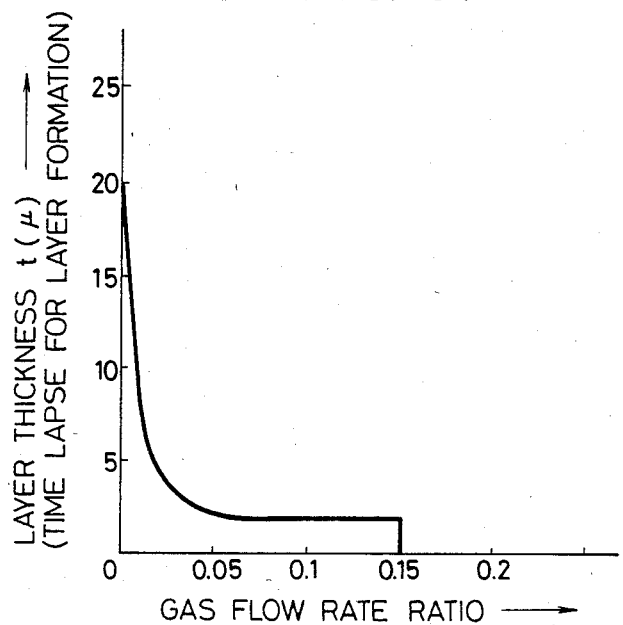

By the preparation device as shown in FIG. 12, layers were formed by changing the gas flow rate ratio of GeH$_4$/He gas to SiH$_4$/He gas along with the lapse of time for forming the layer under the condition of Table C-4 following the changing curve of the gas flow rate ratio as shown in FIG. 31 and other conditions were the same as in Example 35. Thereby, an electrophotographic image forming member was produced.

Using the resulting image forming member, image formation was effected on a transfer paper according to the same procedure and under the same condutions as in Example 35, whereby a very clear image quality was obtained.

EXAMPLE 39

Figure 32:
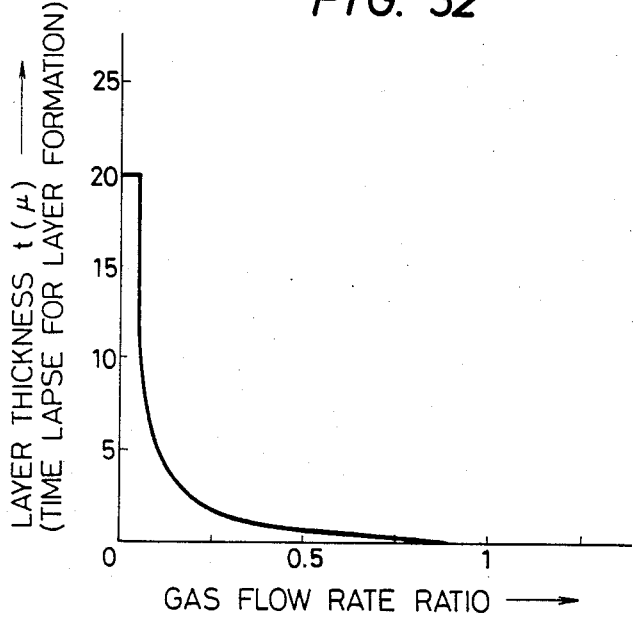

By the preparation device as shown in FIG. 12, layers were formed by changing the gas flow rate ratio of GeH$_4$/He gas to SiH$_4$/He gas along with the lapse of time for forming the layer under the condition of Table C-5 following the changing curve of the gas flow rate ratio as shown in FIG. 32 and other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 40

Figure 33:
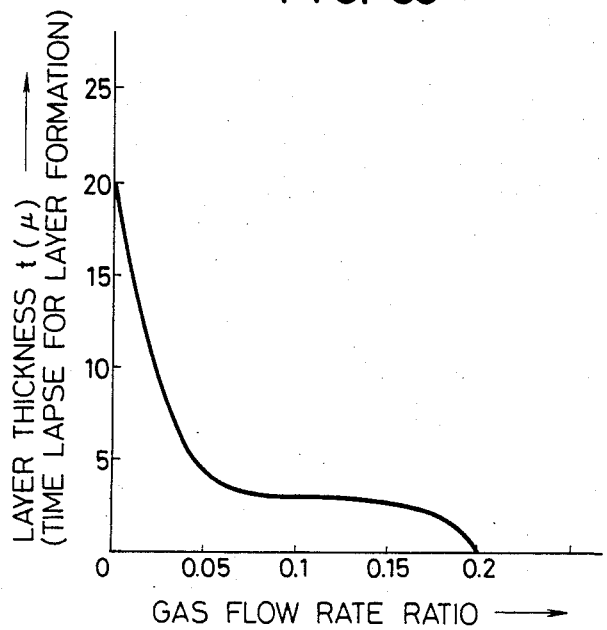

By the preparation device as shown in FIG. 12, layers were formed by changing the gas flow rate ratio of $GeH_4/He$ gas to $SiH_4/He$ gas along with the lapse of time for forming the layer under the condition of Table C-6 following the changing curve of the gas flow raqe ratio as shown in FIG. 33 and other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 41

Figure 34:
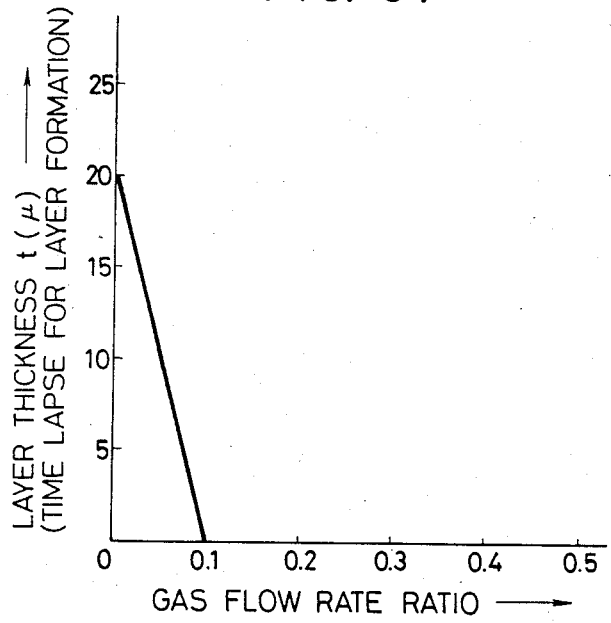

By the preparation device as shown in FIG. 12, layers were formed by changing the gas flow rate ratio of $GeH_4/He$ gas to $SiH_4/He$ gas along with the lapse of time for forming the layer under the condition of Table C-7 following the changing curve of the gas flow rate ratio as shown in FIG. 34 and other conditions were the same as in Example 35. Thereby, an electrophotgraphic image forming member was produced.

Using the resulting image forming member, image formation was effected on a transfer paper according to the same procedure and under the same conditions as in Example 35, whereby a very clear image quality was obtained.

EXAMPLE 42

Layers were formed under the same conditions as Example 35 except that $Si_2H_6/He$ gas was used in place of $SiH_4/He$ gas used in Example 35 and that the operating condition was changed to that as shown in Table C-8. Thereby, an electrophotographic image forming member was produced.

Using the resulting image forming member, image formation was effected on the transfer paper according to the same procedure and under the same conditions as in Example 35, whereby a very clear image quality was obtained.

EXAMPLE 43

Layers were formed under the same conditions as Example 35 except that $SiF_4/He$ gas was used in place of $SiH_4/He$ gas used in Example 35 and that the operating condition was changed to that as shown in Table C-9. Thereby, an electrophotographic image forming member was produced.

Using the resulting image forming member, image formation was effected on the transfer paper according to the same procedure and under the same conditions as in Example 35, whereby a very clear image quality was obtained.

EXAMPLE 44

Layers were formed under the same conditions as Example 35 except that $(SiH_4/He+SiF_4/He)$ gas was used in place of $SiH_4/He$ gas used in Example 35 and that the operating condition was changed to that as shown in Table C-10. Thereby, an electrophotographic image forming member was produced.

Using the resulting image forming member, image formation was effected on the transfer paper according to the same procedure and under the same conditions as in Example 35, whereby a very clear image quality was obtained.

EXAMPLE 45

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table C-11 following the charging curve of the gas flow rate ratio as shown in FIG. 28, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 46

Figure 35:
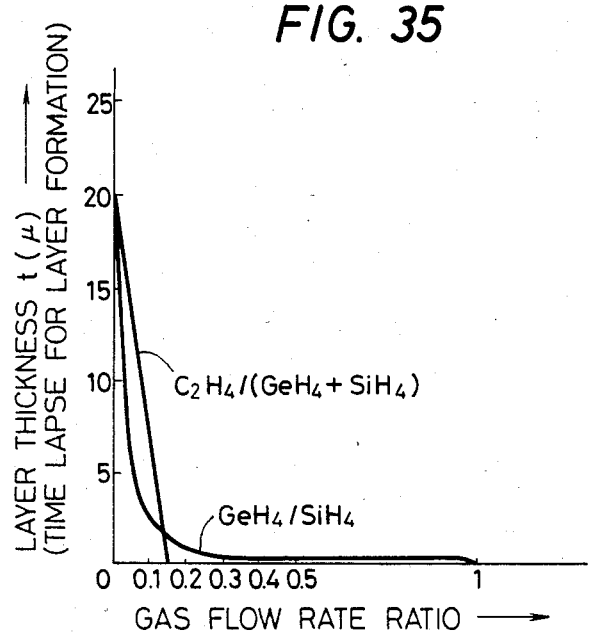

By the preparation device as shown in FIG. 12, layers were formed on an Al cylinder substrate by changing the gas flow rate ratio of $GeH_4/He$ gas to $SiH_4/He$ gas and that of $C_2H_4$ gas to $SiH_4/He$ gas along with the lapse of time for forming the layer under the condition of Table C-12 following the changing curve of the gas flow rate ratio as shown in FIG. 35, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 47

Electrophotographic image forming members were produced under the same conditions as in Example 35 except that, upon formation of a first layer, flow rate ratio of $C_2H_4$ to $(SiH_4+GeH_4)$ in Example 35 was changed as shown in Table C-13.

Using the resulting image forming members, image formation was effected on a transfer paper according to the same procedure and under the same conditions as in Example 35, whereby the results as shown in Table C-13 were obtained.

EXAMPLE 48

Electrophotographic image forming members were produced under the same conditions as in Example 35 except that the thickness of the first layer in Example 35 was changed as shown in Table C-14.

Using the resulting image forming members, image formations were effected on a transfer paper according to the same procedure and under the same conditions as in Example 35, whereby the results as shown in Table C-14 were obtained.

EXAMPLE 49

Toner images were formed under the same conditions for a toner image formation as in Example 35 except that electrostatic images were formed by using GaAs type semiconductor laser (10 mW) of 810 nm in place of a tungsten lamp used in Examples 35–44. The electrophotographic image forming members produced under the conditions of Examples 35–44 were evaluated as to quality of the transferred toner images. The images were clear images of high quality excellent in resolution with good gradation reproducibility.

EXAMPLE 50

Electrophotographic image forming members (Sample Nos. 12-201-12-208, 12-301-12-308, . . . , 12-10-01-12-1008; 72 Samples) were produced under the same conditions and according to the same procedure as in Examples 36–44 except that the conditions for formation of layer (II) were changed to those as shown in Table C-15.

The resulting electrophotographic image forming members were set individually in a reproduction device and then corona charging was effected at $\ominus$ 5 kV for 0.2 second, followed immediately by irradiation of a light image from a tungsten lamp source at a dose of 1.0 lux.sec. A latent image was developed with $\oplus$ charged developer (containing toner and carrier) and transferred to a plain paper. The transferred image was very good. The toner remaining the electrophotographic image forming member without being transferred was scraped by an elastic blade. The above-described series of process steps were repeated 100,000 times or more. No deterioration in the image quality was observed at any stage of the process. Evaluation for the overall image quality and durability for repetition of copying of the samples were shown in Table C-15A.

EXAMPLE 51

Each of image forming members was produced according to the same procedure as in Example 35 except that, upon formation of layer (II), the mixing ratio of Ar to $NH_3$ amd the targer area ratio of silicon wafer to silicon nitride were changed, and the content ratio of silicon atom to nitrogen atom in the layer (II) was changed. The resulting image forming members were evaluated for the image quality after about 50,000 repetitions of image formation, development and cleaning as described in Example 35. Whereby the results as shown in Table C-16 were obtained.

EXAMPLE 52

Each of image forming members was produced according to the same procedure as in Example 35 except that, upon formation of layer (II), the flow rate ratio of $SiH_4$ gas to $NH_3$ gas was changed and the content ratio of silicon atom to nitrogen atom in the layer (II) was changed. The resulting image forming members were evaluated for the image quality after about 50,000 repetitions of process up to a transfer as described in Example 35. Whereby the results as shown in Table C-17 were obtained.

EXAMPLE 53

Each of image forming members was produced according to the same procedure as in Example 35 except that, upon formation of layer (II), the flow rate ratio of $SiH_4$ gas : $SiF_4$ gas : $NH_3$ gas was changed and the content ratio of silicon atom to nitrogen atom in the layer (II) was changed. The resulting image forming members were evaluated for the image quality after about 50,000 repetitions of image formation, development and cleaning as described in Example 35. Whereby the results as shown in Table C-18 were obtained.

EXAMPLE 54

Each of image forming members was produced according to the same procedure as in Example 35 except that the layer thickness of layer (II) was changed. Image formation, development and cleaning as described in Example 35 were repeated. Whereby the results as shown in Table C-19 were obtained.

The common layer forming conditions in Examples 35–54 of the present invention are as follows.
Substrate temperature;
  Layer containing germanium atom (Ge) . . . about 200° C.
  Layer not containing germanium atom (Ge) . . . about 250° C.
Discharge frequency: 13.56 MHz
Inner pressure in reaction chamber upon reaction: 0.3 Torr

EXAMPLE 55

Figure 36:
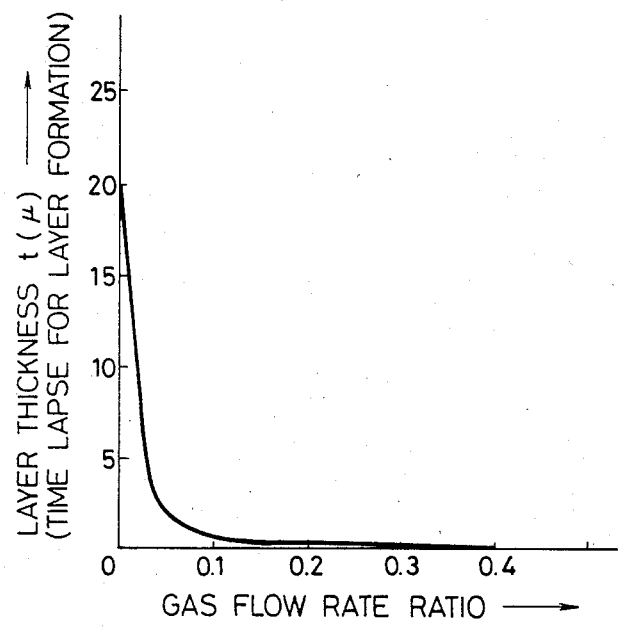

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table D-1 following the changing curve of the gas flow rate ratio as shown in FIG. 36, and thereby, an electrophotographic image forming member was produced.

The resulting image forming member was set in an experimental device for charging and exposure, and corona charging was effected at $\oplus$ 5.0 kV for 0.3 second, followed immediately by irradiation of a light image from a tungsten lamp source at a dose of 2 lux·sec through a transmissive type test chart.

Immediately thereafter, by cascading on the image forming member surface with $\ominus$ charged developer (containing toner and carrier), a good toner image was obtained on the image forming member surface. When the toner image on the image forming member was transferred to a transfer paper by corona charging at $\oplus$ 5.0 kV, there was obtained a clear image of high density excellent in resolution with good gradation reproducibility.

EXAMPLE 56

Figure 37:
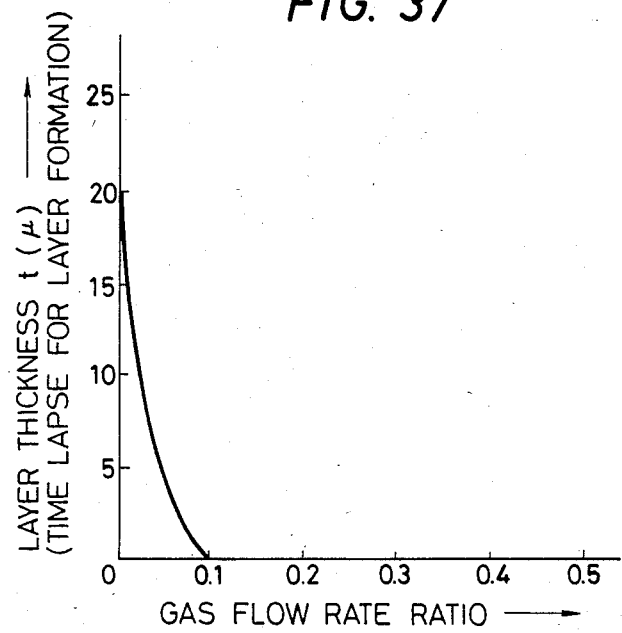

By the preparation device as shown in FIG. 12, layers were formed by changing the gas flow rate ratio of GeH₄/He gas to SiH₄/He gas along with the lapse of time for forming the layer under the condition of Table D-2 following the changing curve of the gas flow rate ratio as shown in FIG. 37 and other conditions were the same as in Example 55. Thereby, an electrophogographic image forming member was produced.

Using the resulting image forming member, image formation was effected on a transfer paper according to the same precedure and under the same conditions as in Example 55, whereby a very clear image quality was obtained.

EXAMPLE 57

Figure 38:
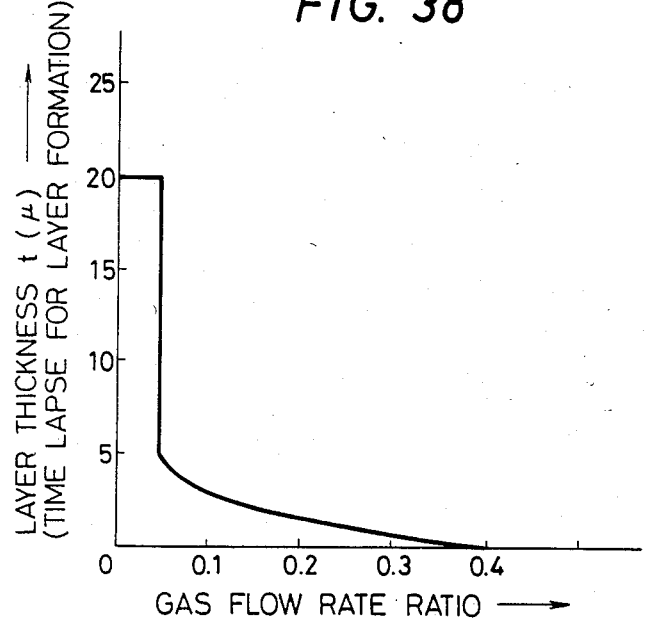

By the preparation device as shown in FIG. 12, layers were formed by changing the gas flow rate ratio of GeH₄/He gas to SiH₄/He gas along with the lapse of time for forming the layer under the condition of Table D-3 following the changing curve of the gas flow rate ratio as shown in FIG. 38 and other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 58

Figure 39:
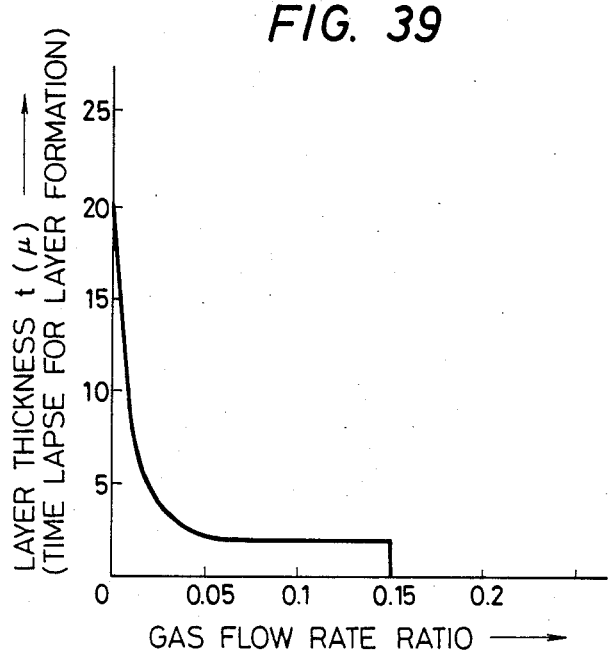

By the preparation device as shown in FIG. 12, layers were formed by changing the gas flow rate ratio of GeH₄/He gas to SiH₄/He gas along with the lapse of time for forming the layer under the condition of Table D-4 following the changing curve of the gas flow rate ratio as shown in FIG. 39 and other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 59

Figure 40:
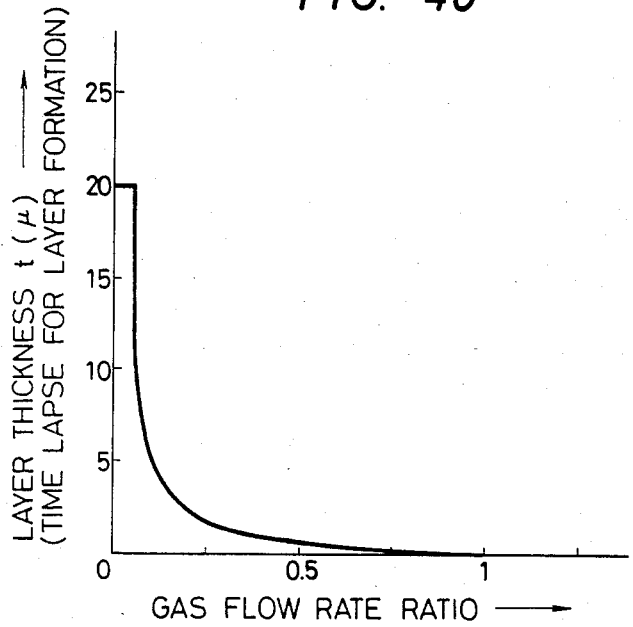

By the preparation device as shown in FIG. 12, layers were formed by changing the gas flow rate ratio of GeH₄/He gas to SiH₄ /He gas along with the lapse of time for forming the layer under the condition of Table D-5 following the changing curve of the gas flow rate ratio as shown in FIG. 40 and other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 60

Figure 41:
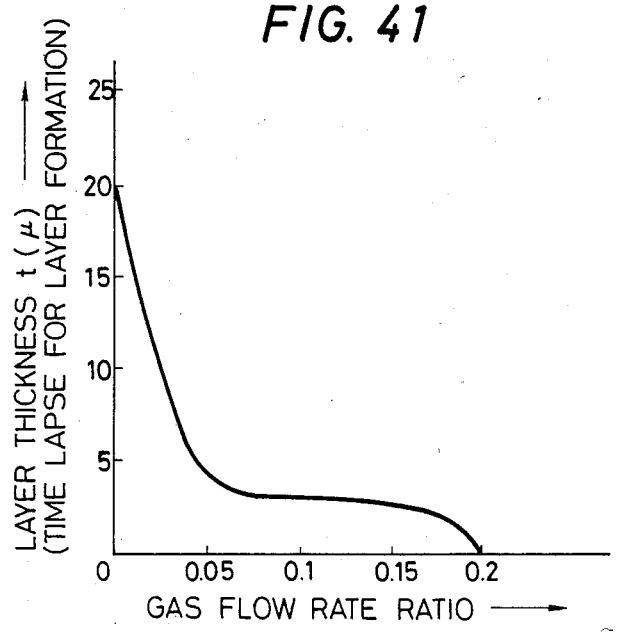

By the preparation device as shown in FIG. 12, layers were formed by changing the gas flow rate ratio of GeH₄/He gas to SiH₄/He gas along with the lapse of time for forming the layer under the condition of Table D-6 following the changing curve of the gas flow rate ratio as shown in FIG. 41 and other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 61

Figure 42:
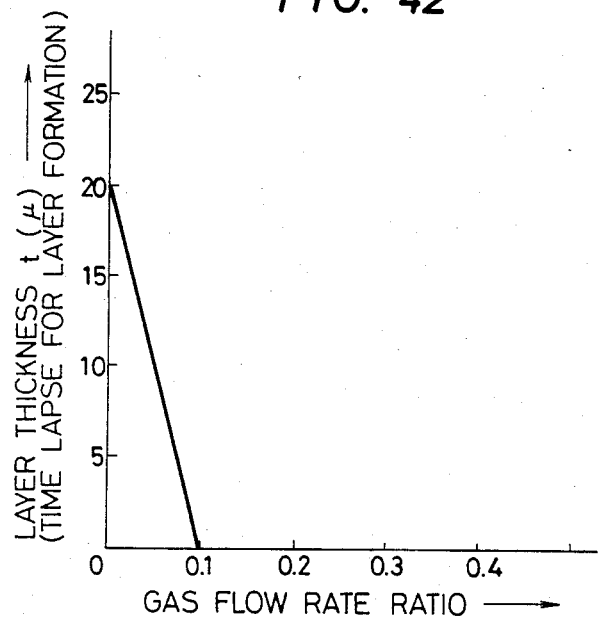

By the preparation device as shown in FIG. 12, layers were formed by changing the gas flow rate ratio of GeH₄/He gas to SiH₄/He gas along with the lapse of time for forming the layer under the condition of Table D-7 following the changing curve of the gas flow rate ratio as shown in FIG. 42 and other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 62

Layers were formed under the same conditions as Example 55 except that conditions as shown in Table D-8 –Table D-10 were used in place of the condition of Table D-1 used in Example 55. Thereby, electrophotographic image forming members (Sample Nos. 801–803) were produced.

Using each of the resulting image forming members, image formation was effected on the transfer paper according to the same procedure and under the same conditions as in Example 55, whereby a very clear image quality was obtained.

EXAMPLE 63

By the preparation device as shown in FIG. 12, layers were formed on an Al cylinder substrate by changing the gas flow rate ratio of GeH₄/He gas to SiH₄/He gas along with the lapse of time for forming the layer under the condition of Table D-11 following the changing curve of the gas flow rate ratio as shown in FIG. 36, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 64

By the preparation device as shown in FIG. 12, layers were formed on an Al cylinder substrate by changing the gas flow rate ratio of GeH₄/He gas to SiH₄/He gas along with the lapse of time for forming the layer under the condition of Table D-12 following the changing curve of the gas flow rate ratio as shown in FIG. 36, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 65

By the preparation device as shown in FIG. 12, layers were formed by changing the gas flow rate ratio of GeH$_4$/He gas to SiH$_4$/He gas along with the lapse of time for forming the layer under the condition of Table D-13 following the changing curve of the gas flow rate ratio as shown in FIG. 37 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 66

By the preparation device as shown in FIG. 12, layers were formed by changing the gas flow rate ratio of GeH$_4$/He gas to SiH$_4$/He gas and that of C$_2$H$_4$ gas to SiH$_4$/He gas along with the lapse of time for forming the layer under the condition of Table D-14 following the changing curve of the gas flow rate ratio as shown in FIG. 38 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 67

By the preparation device as shown in FIG. 12, layers were formed by changing the gas flow rate ratio of GeH$_4$/He gas to SiH$_4$/He gas and that of C$_2$H$_4$ gas to SiH$_4$/He gas along with the lapse of time for forming the layer under the condition of Table D-15 following the changing curve of the gas flow rate ratio as shown in FIG. 39 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 68

By the preparation device as shown in FIG. 12, layers were formed by changing the gas flow rate ratio of GeH$_4$/He gas to SiH$_4$/He gas along with the lapse of time for forming the layer under the condition of Table D-16 following the changing curve of the gas flow rate ratio as shown in FIG. 40 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 69

By the preparation device as shown in FIG. 12, layers were formed by changing the gas flow rate ratio of GeH$_4$/He gas to SiH$_4$/He gas along with the lapse of time for forming the layer under the condition of Table D-17 following the changing curve of the gas flow rate ratio as shown in FIG. 41 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 70

By the preparation device as shown in FIG. 12, layers were formed by changing the gas flow rate ratio of GeH$_4$/He gas to SiH$_4$/He gas along with the lapse of time for forming the layer under the condition of Table D-18 following the changing curve of the gas flow rate ratio as shown in FIG. 42 and other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 71

Layers were formed under the same conditions as Example 64 except that conditions as shown in Table D-19–Table D-21 were used in place of the condition of Table D-12 used in Example 64. Thereby, electrophotographic image forming members (Sample Nos. 1901–1903) were produced.

Using each of the resulting image forming members, image formation was effected on the transfer paper according to the same procedure and under the same conditions as in Example 64, whereby a very clear image quality was obtained.

EXAMPLE 72

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table D-22 following the changing curve of the gas flow rate ratio as shown in FIG. 36, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a does of 2 lux·sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 73

Toner images were formed under the same conditions for a toner image formation as in Examples 55 and 64 except that electrostatic images were formed by using GaAs type semiconductor laser (10 mW) of 810 nm in place of a tungsten lamp used in Examples 55 and 64. The electrophotographic image forming members produced under the conditions of Examples 55 and 64 were evaluated as to quality of the transferred toner images. The images were clear images of high quality excellent in resolution with good gradation reproducibility.

EXAMPLE 74

Electrophotographic image forming members (Sample Nos. 12-201-12-208, 12-301-12-308, ..., 12-10-01-12-1008; 72 Samples) were produced under the same conditions and according to the same procedure as in Examples 56-64 except that the condntions for formation of layer (II) were changed to those as shown in Table D-23.

The resulting electrophotographic image forming members were set individually in a reproduction device and then corona charging was effected at ⊖ 5 kV for 0.2 second, followed immediately by irradiation of a light image from a tungsten lamp source at a dose of 1.0 lux·sec. A latent image was developed with ⊕ charged developer (containing toner and carrier) and transferred to a plain paper. The transferred image was very good. The toner remaining on the electrophotographic image forming member without being transferred was scraped by an elastic blade. The above-described series of process steps were repeated 100,000 times or more. No deterioration in the image quality could be observed of any stage of the process steps. Evaluation for the overall image quality and durability for repetition of copying of the samples were shown in Table D-23A.

EXAMPLE 75

Each of image forming members was produced according to the same procedure as in Example 55 except that, upon formation of layer (II), the mixing ratio of Ar to NH$_3$ and the target area ratio of silicon wafer to silicon nitride were changed, and the content ratio of silicon atom to nitrogen atom in the layer (II) was changed. The resulting image forming members were evaluated for the image quality after about 50,000 repetitions of image formation, development and cleaning as described in Example 55. Whereby the results as shown in Table D-24 were obtained.

EXAMPLE 76

Each of image forming members was produced according to the same procedure as in Example 55 except that, upon formation of layer (II), the flow rate ratio of SiH$_4$ gas to NH$_3$ gas was changed and the content ratio of silicon atom to nitrogen atom in the layer (II) was changed. The resulting image forming members were evaluated for the image quality after about 50,000 repetitions of process up to a transfer as described in Example 55. Whereby the results as shown in Table D-25 were obtained.

EXAMPLE 77

Each of image forming members was produced according to the same procedure as in Example 55 except that, upon formation of layer (II), the flow rate ratio of SiH$_4$ gas : SiF$_4$ gas : NH$_3$ gas was changed and the content ratio of silicon atom to nitrogen atom in the layer (II) was changed. The resulting image forming members were evaluated for the image quality after about 50,000 repetitions of image formation, development and cleaning as described in Example 55. Whereby the results as shown in Table D-26 were obtained.

EXAMPLE 78

Each of image forming members was produced according to the same procedure as in Example 55 except that the layer thickness of layer (II) was changed. Image formation, development and cleaning as described in Example 55 were repeated. Whereby the results as shown in Table D-27 were obtained.

The common layer forming conditions in Examples 55-78 of the present invention are as follows.

Substrate temperature: Layer containing germanium atom (Ge) ... about 200° C.

Discharge frequency: 13.56 MHz

Inner pressure in reaction chamber upon reaction: 0.3 Torr

EXAMPLE 79

Figure 43:
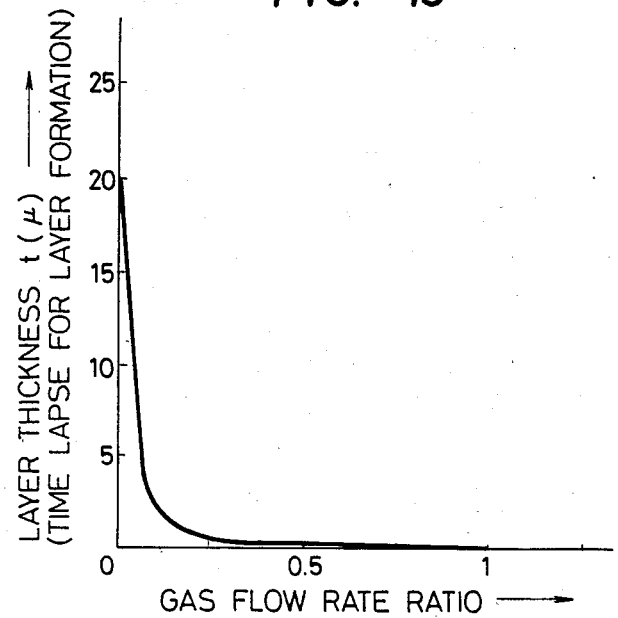

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table E-1 following the changing curve of the gas flow rate ratio as shown in FIG. 43, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 80

Figure 44:
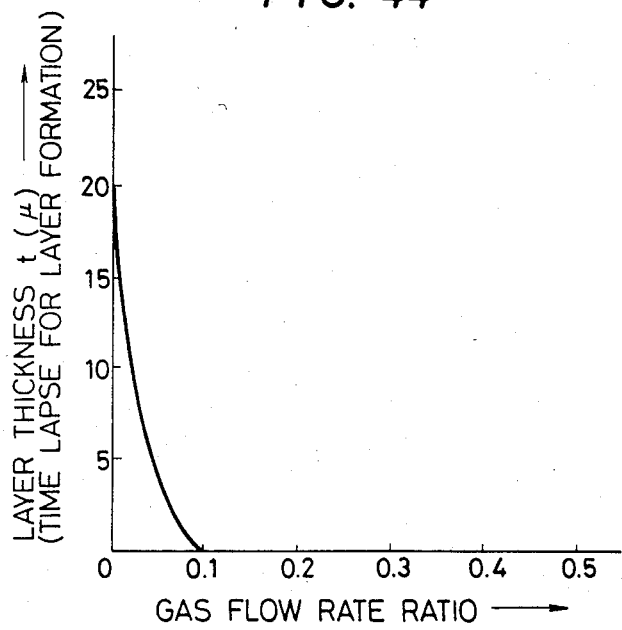

By the preparation device as shown in FIG. 12, layers were formed by changing the gas flow rate ratio of GeH$_4$/He gas to SiH$_4$/He gas along with the lapse of time for forming the layer under the condition of Table E-2 following the changing curve of the gas flow rate ratio as shown in FIG. 44 and other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 81

Figure 45:
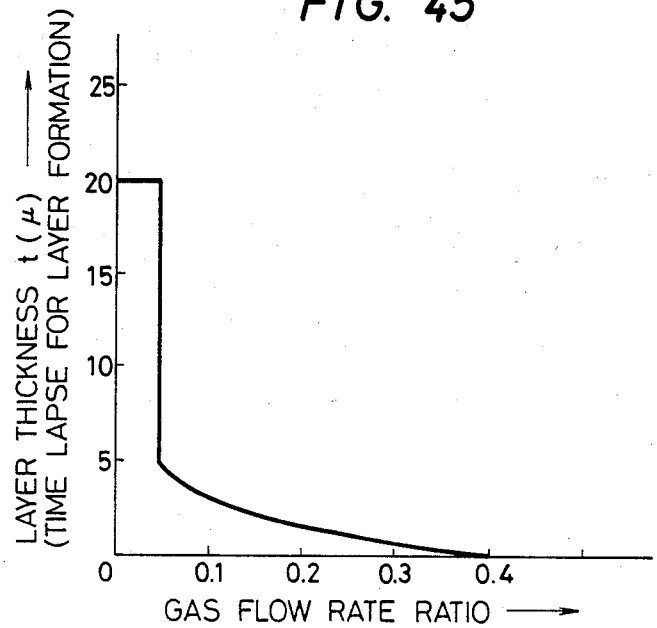

By the preparation device as shown in FIG. 12, layers were formed by changing the gas flow rate ratio of GeH$_4$/He gas to SiH$_4$/He gas along with the lapse of time for forming the layer under the condition of Table E-3 following the changing curve of the gas flow rate ratio as shown in FIG. 45 and other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 82

Figure 46:
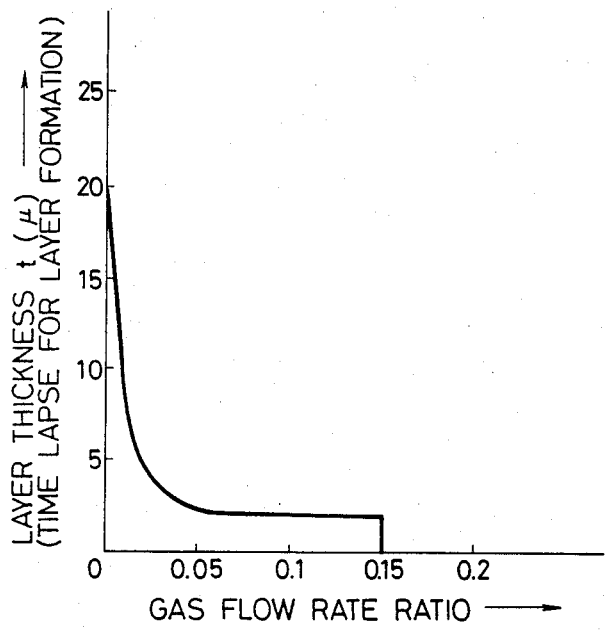

By the preparation device as shown in FIG. 12, layers were formed by changing the gas flow rate ratio of GeH$_4$/He gas to SiH$_4$/He gas along with the lapse of time for forming the layer under the condition of Table E-4 following the changing curve of the gas flow rate ratio as shown in FIG. 46 and other conditions were the same as in Example 79. Thereby, an electrophotographic image forming member was produced.

Using the resulting image forming member, image formation was effected on a transfer paper according to the same procedure and under the same conditions as in example 79, whereby a very clear image quality was obtained.

EXAMPLE 83

Figure 47:
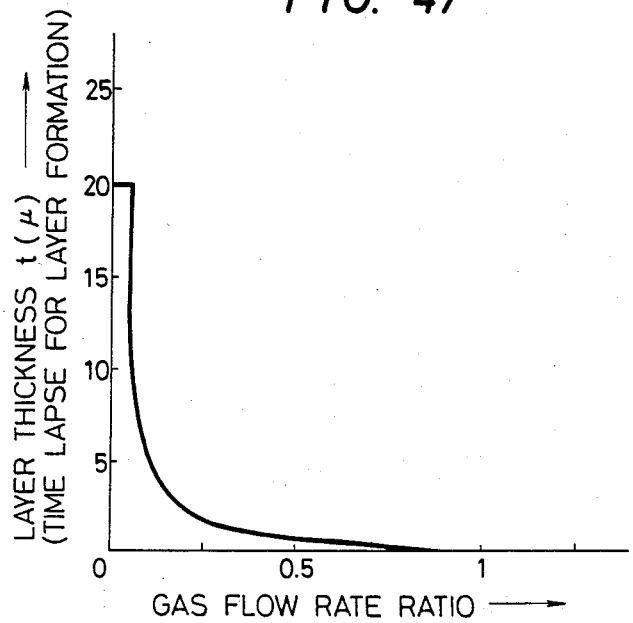

By the preparation device as shown in FIG. 12, layers were formed by changing the gas flow rate ratio of GeH$_4$/He gas to SiH$_4$/He gas along with the lapse of time for forming the layer under the condition of Table E-5 following the changing curve of the gas flow rate ratio as shown in FIG. 47 and other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 84

Figure 48:
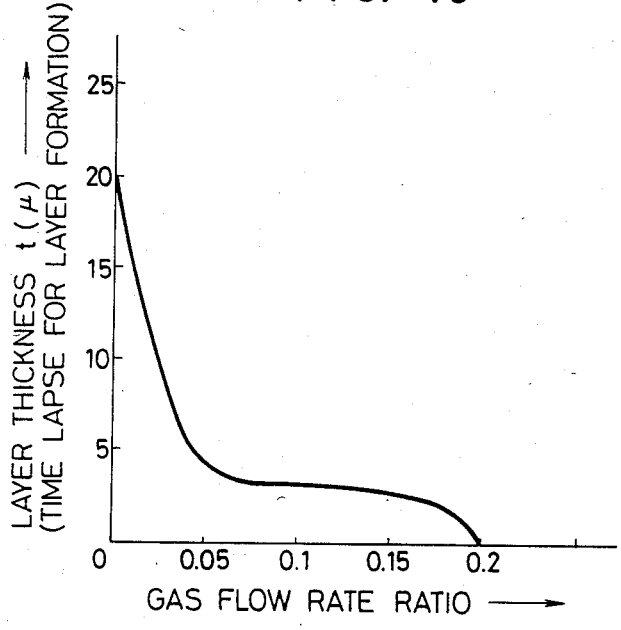

By the preparation device as shown in FIG. 12, layers were formed by changing the gas flow rate ratio of GeH$_4$/He gas to SiH$_4$/He gas along with the lapse of time for forming the layer under the condition of Table E-6 following the changing curve of the gas flow rate ratio as shown in FIG. 48 and other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 85

Figure 49:
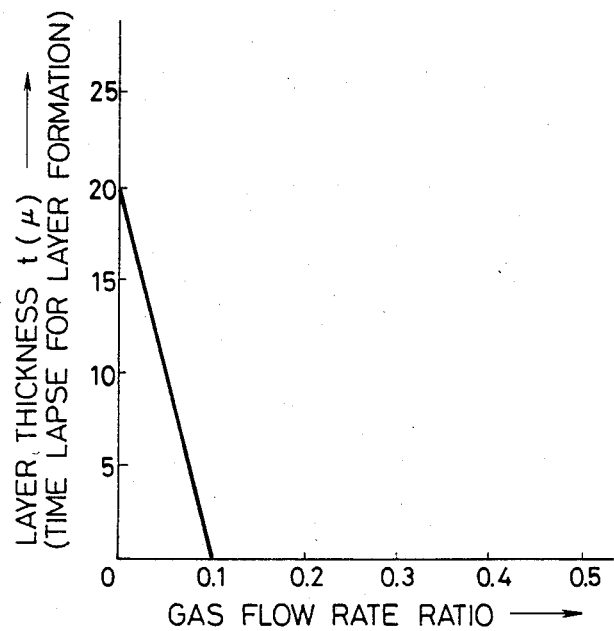

By the preparation device as shown in FIG. 12, layers were formed by changing the gas flow rate ratio of GeH$_4$/He gas to SiH$_4$/He gas along with the laspe of time for forming the layer under the condition of Table E-7 following the changing curve of the gas flow rate ratio as shown in FIG. 49 and other conditions were the same as in Example 79. Thereby, an electropohtographic image forming member was produced.

Using the resulting image forming member, image formation was effected on a transfer paper according to the same porcedure and under the same conditions as in Example 79, whereby a very clear image quality was obtained.

EXAMPLE 86

Layers were formed under the same conditions as Example 79 except that Si$_2$H$_6$/He gas was used in place of SiH$_4$/He gas used in Example 79 and that the operating condition was changed to that as shown in Table E-8. Thereby, an electrophotographic image forming member was produced.

Using the resulting image forming member, image formation was effected on the transfer paper according to the same procedure and under the same conditions as in Example 79, whereby a very clear image quality was obtained.

EXAMPLE 87

Layers were formed under the same conditions as Example 79 except that SiF$_4$/He gas was used in place of SiH$_4$/He gas used in Example 79 and that the operating condition was changed to that as shown in Table E-9. Thereby, an electrophotographic image forming member was produced.

Using the resulting image forming member, image formation was effected on the transfer paper according to the same procedure and under the same conditions as in Example 79, whereby a very clear image quality was obtained.

EXAMPLE 88

Layers were formed under the same conditions as Example 79 except that (SiH$_4$/He+SiF$_4$/He) gas was used in place of SiH$_4$/He gas used in Example 79 and that the operating condition was changed to that as shown in Table E-10. Thereby, an electrophotographic image forming member was produced.

Using the resulting image forming member, image formation was effected on the transfer paper according to the same procedure and under the same conditions as in Example 79, whereby a very clear image quality was obtained.

EXAMPLE 89

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table E-11 following the changing curve of the gas flow rate ratio as shown in FIG. 43, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 90

Figure 50:
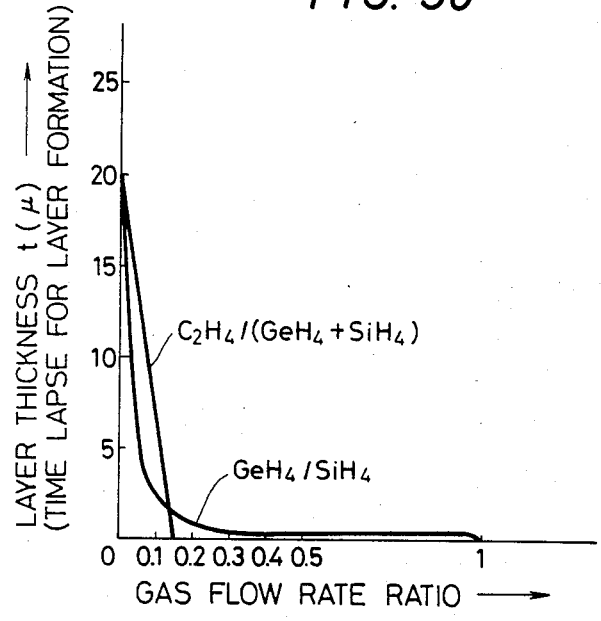

By the preparation device as shown in FIG. 12, layers were formed on an Al cylinder substrate by changing the gas flow rate ratio of $GeH_4$/He gas to $SiH_4$/He gas and that of $C_2H_4$ gas to $SiH_4$/He gas along with the lapse of time for forming the layer under the condition of Table E-12 following the changing curve of the gas flow rate ratio as shown in FIG. 50, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 91

Electrophotographic image forming members were produced under the same conditions as in Example 79 except that, upon formation of a first layer, flow rate ratio of $C_2H_4$ to $(SiH_4+GeH_4)$ in Example 79 was changed as shown in Table E-13.

Using the resulting image forming members, image formation was effected on a transfer paper according to the same procedure and under the same conditions as in Example 79, whereby the results as shown in Table E-13 were obtained.

EXAMPLE 92

Electrophotographic image forming members were produced under the same conditions as in Example 79 except that the thickness of the first layer in Example 79 was changed as shown in Table E-14.

Using the resulting image forming members, image formation were effected on a transfer paper according to the same procedure and under the same conditions as in Example 79, whereby the results as shown in Table E-14 were obtained.

EXAMPLE 93

Toner images were formed under the same conditions for a toner image formation as in Example 79 except that electrostatic images were formed by using GaAs type semiconductor laser (10 mW) of 810 nm in place of a tungsten lamp used in Examples 79–88. The electrophotographic image forming members produced under the conditions of Examples 79–88 were evaluated as to quality of the transferred toner images. The images were clear images of high quality excellent in resolution with good gradation reproducibility.

EXAMPLE 94

Electrophotographic image forming members (Sample Nos. 15-201–15-208, 15-301–15-308, ..., 5-1001-1-5-1008; 72 Samples) were produced under the same conditions and according to the same procedure as in Examples 80–88 except that the conditions for formation of layer (II) were changed to those as shown in Table E-15.

The resulting electrophotographic image forming members were set individually in a reproduction device and then corona charging was effected at ⊖ 5 kV for 0.2 second, followed immediately by irradiation of a light image from a tungsten lamp source at a dose of 1.0 lux·sec. A latent image was developed with ⊕ charged developer (containing toner and carrier) and transferred to a plain paper. The transferred image was very good. The toner remaining on the electrophotographic image forming member without being transferred was scraped by an elastic blade. The above-described series of process steps were repeated 100,000 times or more. No deterioration in the image quality could be observed of any stage of the process steps. Evaluation for the overall image quality and durability for repetition of copying of the samples were shown in Table E-15A.

EXAMPLE 95

Each of image forming members was produced according to the same procedure as in Example 79 except that, upon formation of layer (II), the mixing ratio of Ar to No and the target area ratio of silicon wafer to $SiO_2$ were changed, and the content ratio of silicon atom to oxygen atom in the layer (II) was changed. The resulting image forming members were evaluated for the image quality after about 50,000 repetitions of image formation, development and cleaning as described in Example 79. Whereby the results as shown in Table E-16 were obtained.

EXAMPLE 96

Each of image forming members was produced according to the same procedure as in Example 79 except that, upon formation of layer (II), the flow rate ratio of $SiH_4$ gas to NO gas was changed and the content ratio of silicon atom to oxygen atom in the layer (II) was changed. The resulting image forming members were evaluated for the image quality after about 50,000 repetitions of process up to a transfer as described in Example 79. Whereby the results as shown in Table E-17 were obtained.

EXAMPLE 97

Each of image forming members was produced according to the same procedure as in Example 79 except that, upon formation of layer (II), the flow rate ratio of $SiH_4$ gas: $SiF_4$ gas: NO gas was changed and the content ratio of silicon atom to oxygen atom in the layer (II) was changed. The resulting image forming members were evaluated for the image quality after about 50,000 repetitions of image formation, development and cleaning as described in Example 79. Whereby the results as shown in Table E-18 were obtained.

EXAMPLE 98

Each of image forming members was produced according to the same procedure as in Example 79 except that the layer thickness of layer (II) was changed. Image formation, development and cleaning as described in Example 79 were repeated. Whereby the results as shown in Table E-19 were obtained.

The common layer forming conditions in Examples 79–98 of the present invention are as follows.
Substrate temperature:
   Layer containing germanium atom (Ge) . . . about 200° C.
   Layer not containing germanium atom (Ge) . . . about 250° C.
Discharge frequency: 13.56 MHz
Inner pressure in reaction chamber upon reaction: 0.3 Torr

EXAMPLE 99

Figure 51:
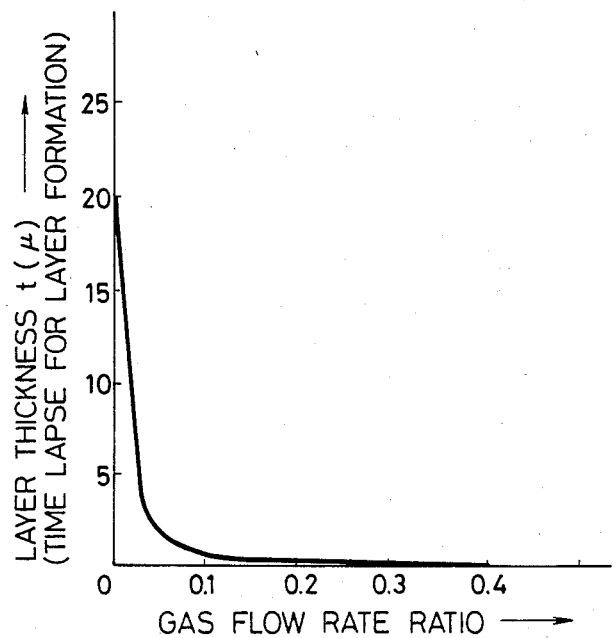

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table F-1 following the changing curve of the gas flow rate ratio as shown in FIG. 51, and thereby, an electrophotographic image forming member was produced.

The resulting image forming member was set in an experimental device for charging and exposure, and corona charging was effected at $\oplus$ 5.0 kV for 0.3 second, followed immediately by irradiation of a light image from a tungsten lamp source at a dose of 2 lux·sec through a transmissive type test chart.

Immediately thereafter, by cascading on the image forming member surface with $\ominus$ charged developer (containing toner and carrier), a good toner image was obtained on the image forming member surface. When the toner image on the image forming member was transferred to a transfer paper by corona charging at $\oplus$ 5.0 kV, there was obtained a clear image of high density excellent in resolution with good gradation reproducibility.

EXAMPLE 100

Figure 52:
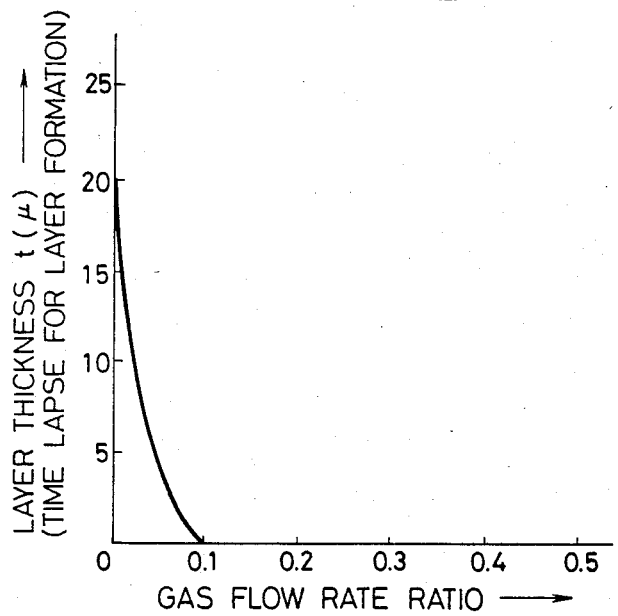

By the preparation device as shown in FIG. 12, layers were formed by changing the gas flow rate ratio of GeH$_4$/He gas to SiH$_4$/He gas along with the lapse of time for forming the layer under the condition of Table F-2 following the changing curve of the gas flow rate ratio as shown in FIG. 52 and other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 101

Figure 53:
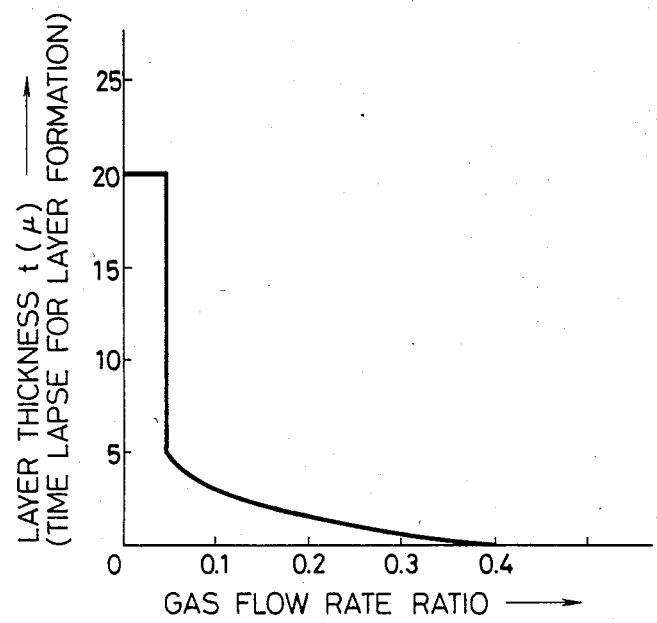

By the preparation device as shown in FIG. 12, layers were formed by changing the gas flow rate ratio of GeH$_4$/He gas to SiH$_4$/He gas along with the lapse of time for forming the layer under the condition of Table F-3 following the changing curve of the gas flow rate ratio as shown in FIG. 53 and other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 102

Figure 54:
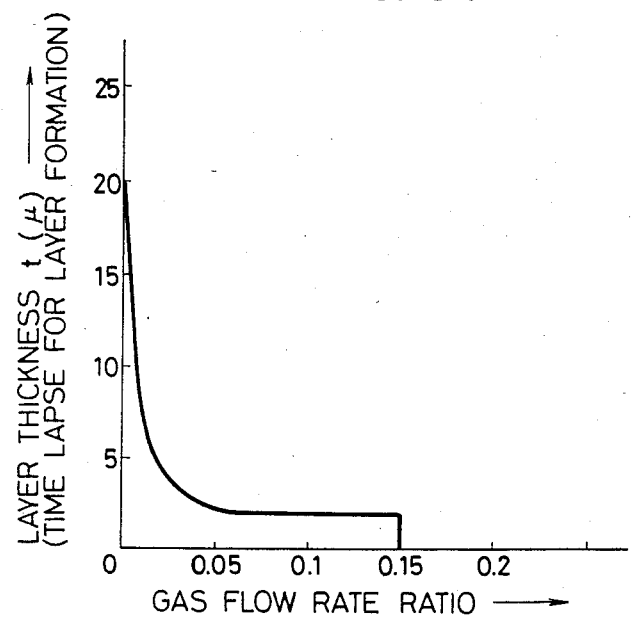

By the preparation device as shown in FIG. 12, layers were formed by changing the gas flow rate ratio of GEH$_4$/He gas to SiH$_4$/He gas along with the lapse of time for forming the layer under the condition of Table F-4 following the changing curve of the gas flow rate ratio as shown in FIG. 54 and other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 103

Figure 55:
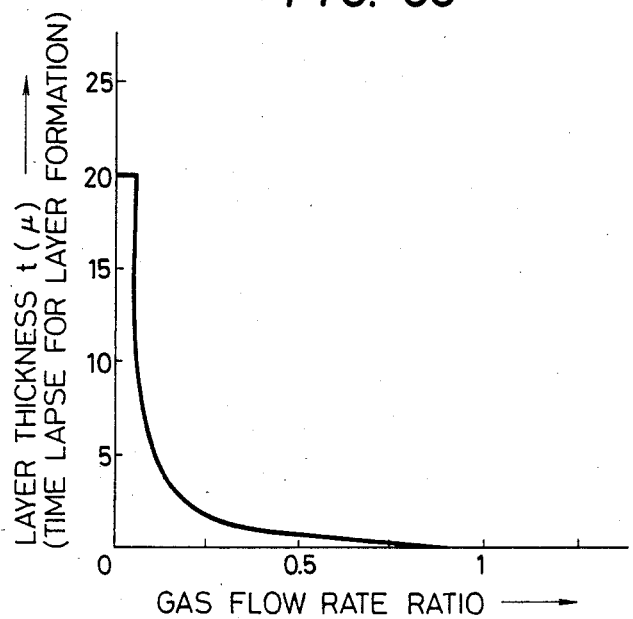

By the preparation device as shown in FIG. 12, layers were formed by changing the gas flow rate ratio of GeH$_4$/He gas to SiH$_4$/He gas along with the lapse of time for forming the layer under the condition of Table F-5 following the changing curve of the gas flow rate ratio as shown in FIG. 55 and other conditions were the same as in Example 99. Thereby, an electrophotographic image forming member was produced.

Using the resulting image forming member, image formation was effected on a transfer paper according to the same porcedure and under the same conditions as in Example 99, whereby a very clear image quality was obtained.

EXAMPLE 104

Figure 56:
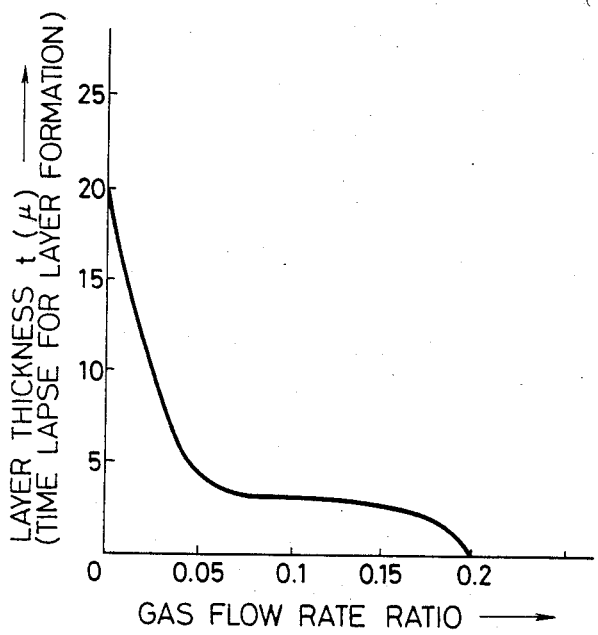

By the preparation device as shown in FIG. 12, layers were formed by changing the gas flow rate ratio of GeH$_4$/He gas to SiH$_4$/He gas along with the lapse of time for forming the layer under the condition of Table F-6 following the changing curve of the gas flow rate ratio as shown in FIG. 56 and other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 105

By the preparation device as shown in FIG. 12, layers were formed by changing the gas flow rate ratio of GeH$_4$/He gas to SiH$_4$/He gas along with the lapse of time for forming the layer under the condition of Table F-7 following the changing curve of the gas flow rate ratio as shown in FIG. 59 and other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 106

Layers were formed under the same conditions as Example 99 except that each conditions as shown in Table F-8–Table F-10 were used in place of the condition of Table F-1 used in Example 99. Thereby, electrophotographic image forming members (Sample Nos. 801-803) were produced.

Using each of the resulting image forming members, image formation was effected on the transfer paper according to the same procedure and under the same conditions as in Example 99, whereby a very clear image quality was obtained.

EXAMPLE 107

By the preparation device as shown in FIG. 12, layers were formed on an Al cylinder substrate by changing the gas flow rate ratio of $GeH_4/He$ gas to $SiG_4/He$ gas along with the lapse of time for forming the layer under the condition of Table F-11 following the changing curve of the gas flow rate ratio as shown in FIG. 51, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 108

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table F-12 following the changing curve of the gas flow rate ratio as shown in FIG. 51, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 kV, there was obtained a clear image of high density excellent in resolution with good gradation reproducibility.

EXAMPLE 109

By the preparation device as shown in FIG. 12, layers were formed by changing the gas flow rate ratio of $GeH_4/He$ gas to $SiH_4/He$ gas along with the lapse of time for forming the layer under the conditions of Table F-13 following the changing curve of the gas flow rate ratio as shown in FIG. 52 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 110

By the preparation device as shown in FIG. 12, layers were formed by changing the gas flow rate ratio of $GeH_4/He$ gas to $SiH_4/He$ gas and that of $C_2H_4$ gas to $SiH_4/He$ gas along with the lapse of time for forming the layer under the condition of Table F-14 following the changing curve of the gas flow rate ratio as shown in FIG. 53 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 111

By the preparation device as shown in FIG. 12, layers were formed by changing the gas flow rate ratio of $GeH_4/He$ gas to $SiH_4/He$ gas and that of $C_2H_4$ gas to $SiH_4/He$ gas along with the lapse of time for forming the layer under the condition of Table F-15 following the changing curve of the gas flow rate ratio as shown in FIG. 54 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 112

By the preparation device as shown in FIG. 12, layers were formed by changing the gas flow rate ratio of $GeH_4/He$ gas to $SiH_4/He$ gas along with the lapse of time for forming the layer under the condition of Table F-16 following the changing curve of the gas flow rate ratio as shown in FIG. 55 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 113

By the preparation device as shown in FIG. 12, layers were formed by changing the gas flow rate ratio of $GeH_4/He$ gas to $SiH_4/He$ gas along with the lapse of time for forming the layer under the condition of Table F-17 following the changing curve of the gas flow rate ratio as shown in FIG. 56 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 114

Figure 57:
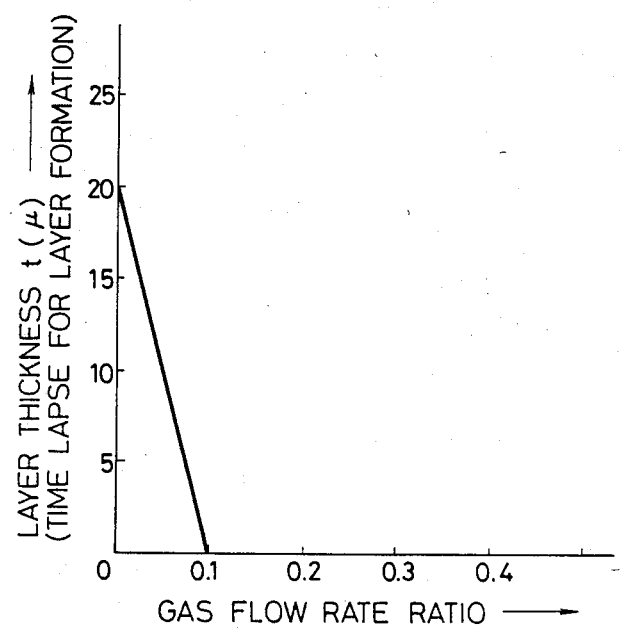

By the preparation device as shown in FIG. 12, layers were formed by changing the gas flow rate ratio of GeH$_4$/He gas to SiH$_4$/He gas along with the lapse of time for forming the layer under the condition of Table F-18 following the changing curve of the gas flow rate ratio as shown in FIG. 57 and other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 115

Layers were formed under the same conditions as Example 108 except that each conditions as shown in Table F-19 ∝ Table F-21 were used in place of the condition of Table F-12 used in Example 108. Thereby, electrophotographic image forming members (Sample Nos. 1901–1903) were produced.

Using each of the resulting image forming members, image formation was effected on the transfer paper according to the same procedure and under the same conditions as in Example 108, whereby a very clear image quality was obtained.

EXAMPLE 116

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table F-22 following the changing curve of the gas flow rate ratio as shown in FIG. 51, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a dose of 2 lux·sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 117

Toner images were formed under the same conditions for a toner image formation as in Examples 99 and 108 except that electrostatic images were formed by using GaAs type semiconductor layer (10 mW) of 810 nm in place of a tungsten lamp used in Examples 99 and 108. The electrophotographic image forming members produced under the conditions of Examples 99 and 108 were evaluated as to quality of the transferred toner images. The images were clear images of high quality excellent in resolution with good gradation reproducibility.

EXAMPLE 118

Electrophotographic image forming members (Sample Nos. 15-201-15-208, 15-301-15-308, . . . , 15-10-01-15-1008; 72 Samples) were produced under the same conditions and according to the same procedure as in Examples 100–108 except that the conditions for formation of layer (II) were changed to those as shown in Table F-23.

The resulting electrophotographic image forming members were set individually in a reproduction device and then corona charging was effected at ⊖ 5 kV for 0.2 second, followed immediately by irradiation of a light image from a tungsten lamp source at a dose of 1.0 lux·sec. A latent image was developed with ⊕ charged developer (containing toner and carrier) and transferred to a plain paper. The transferred image was very good. The toner remaining on the electrophotographic image forming member without being transferred was scraped by an elastic blade. The above-described series of process steps were repeated 100,000 times or more. No deterioration in the image quality could be observed of any stage of the process steps. Evaluation for the overall image quality and durability for repetition of copying of the samples were shown in Table F-23A.

EXAMPLE 119

Each of image forming members was produced according to the same procedure as in Example 99 except that, upon formation of layer (II), the mixing ratio of Ar to NO and the target area ratio of silicon wafer to SiO$_2$ were changed, and the content ratio of silicon atom to oxygen atom in the layer (II) was changed. The resulting image forming members were evaluated for the image quality after about 50,000 repetitions of image formation, development and cleaning as described in Example 99. Whereby the results as shown in Table F-24 were obtained.

EXAMPLE 120

Each of image forming members was produced according to the same procedure as in Example 99 except that, upon formation of layer (II), the flow rate ratio of SiH$_4$ gas to NO gas was changed and the content ratio of silicon atom to oxygen atom in the layer (II) was changed. The resulting image forming members were evaluated for the image quality after about 50,000 repetitions of process up to a transfer as described in Example 99. Whereby the results as shown in Table F-25 were obtained.

EXAMPLE 121

Each of image forming members was produced according to the same procedure as in Example 99 except that, upon formation of layer (II), the flow rate ratio of SiH$_4$ gas: SiF$_4$ gas: NO gas was changed and the content ratio of silicon atom to oxygen atom in the layer (II) was changed. The resulting image forming members were evaluated for the image quality after about 50,000 repetitions of image formation, development and cleaning as described in Example 99. Whereby the results as shown in Table F-26 were obtained.

EXAMPLE 122

Each of image forming members was produced according to the same procedure as in Example 99 except that the layer thickness of layer (II) was changed. Image formation, development and cleaning as described in Example 99 were repeated. Whereby the results as shown in Table F-27 were obtained.

The common layer forming conditions in Examples 99–122 of the present invention as as follows.
Substrate temperature:

Layer containing germanium atom (Ge) ... about 200° C.
Layer not containing germanium atom (Ge) ... about Discharge frequency: 13.56 MHz
Inner pressure in reaction chamber upon reaction: 0.3 Torr

TABLE A-1

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/1~2/10<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 2/10~0 | 0.18 | 5 | 19 |

TABLE A-2

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/10~4/100<br>C$_2$H$_4$/(GeH$_4$ + SiH$_4$) = 2/100 | 0.18 | 5 | 5 |
| Second layer | SiH$_4$/He = 0.05<br>GeH$_4$/He = 0.05 | SiH$_4$ + GeH$_4$ = 50 | GeH$_4$/SiH$_4$ = 4/100~0 | 0.18 | 5 | 15 |

TABLE A-3

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 4/10~2/10<br>C$_2$H$_4$/(GeH$_4$ + SiH$_4$) = 3/100 | 0.18 | 5 | 1.5 |
| Second layer | SiH$_4$/He = 0.05<br>GeH$_4$/He = 0.05 | SiH$_4$ + GeH$_4$ = 50 | GeH$_4$/SiH$_4$ = 2/10~2/1000 | 0.18 | 5 | 18.5 |

TABLE A-4

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 15/100<br>C$_2$H$_4$/(GeH$_4$ + SiH$_4$) = 4/100 | 0.18 | 5 | 2 |
| Second layer | SiH$_4$/He = 0.05<br>GeH$_4$/He = 0.05 | SiH$_4$ + GeH$_4$ = 50 | GeH$_4$/SiH$_4$ = 15/100~0 | 0.18 | 5 | 18 |

TABLE A-5

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1~5/10<br>C$_2$H$_4$/(GeH$_4$ + SiH$_4$) = 5/100 | 0.18 | 5 | 0.5 |
| Second layer | SiH$_4$/He = 0.05<br>GeH$_4$/He = 0.05 | SiH$_4$ + GeH$_4$ = 50 | GeH$_4$/SiH$_4$ = 5/10~0 | 0.18 | 5 | 19.5 |

250° C.

TABLE A-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 2/10~5/100<br>C$_2$H$_4$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 5/100~0 | 0.18 | 5 | 16 |

TABLE A-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$C_2H_4$ | $SiH_4 + GeH_4 = 50$ | $GeH_4/SiH_4 = 1/10 \sim 8/100$<br>$C_2H_4/(GeH_4 + SiH_4) = 3/100$ | 0.18 | 5 | 4 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 16 |

TABLE A-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $Si_2H_6/He = 0.05$<br>$GeH_4/He = 0.05$<br>$C_2H_4$ | $Si_2H_6 + GeH_4 = 50$ | $GeH_4/Si_2H_6 = 1/1 \sim 2/10$<br>$C_2H_4/(GeH_4 + Si_2H_6) = 3/100$ | 0.18 | 5 | 1 |
| Second layer | $Si_2H_6/He = 0.05$<br>$GeH_4/He = 0.05$ | $Si_2H_6 + GeH_4 = 50$ | $GeH_4/Si_2H_6 = 2/10 \sim 0$ | 0.18 | 5 | 19 |

TABLE A-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiF_4/He = 0.05$<br>$GeH_4/He = 0.05$<br>$C_2H_4$ | $SiF_4 + GeH_4 = 50$ | $GeH_4/SiF_4 = 1/1 \sim 2/10$<br>$C_2H_4/(GeH_4 + SiF_4) = 3/100$ | 0.18 | 5 | 1 |
| Second layer | $SiF_4/He = 0.05$<br>$GeH_4/He = 0.05$ | $SiF_4 + GeH_4 = 50$ | $GeH_4/SiF_4 = 2/10 \sim 0$ | 0.18 | 5 | 19 |

TABLE A-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$SiF_4/He = 0.05$<br>$GeH_4/He = 0.05$<br>$C_2H_4$ | $SiH_4 + SiF_4 + GeH_4 = 50$ | $GeH_4/(SiH_4 + SiF_4) = 1/10 \sim 2 \sim 10$<br>$C_2H_4/(GeH_4 + SiH_4 + SiF_4) = 3/100$ | 0.18 | 5 | 1 |
| Second layer | $SiH_4/He = 0.05$<br>$SiF_4/He = 0.05$<br>$GeH_4/He = 0.05$ | $SiF_4 + Si_2F_8 + GeH_4 = 50$ | $GeH_4/(SiH_4 + SiF_4) = 2/10 \sim 0$ | 0.18 | 5 | 19 |

TABLE A-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$C_2H_4$ | $SiH_4 + GeH_4 = 50$ | $GeH_4/SiH_4 = 1/1 \sim 2/10$<br>$C_2H_4/(GeH_4 + SiH_4) = 2/100$ | 0.18 | 5 | 1 |
| Second layer | $SiH_4/He = 0.05$<br>$GeH_4/He = 0.05$<br>$C_2H_4$ | $SiH_4 + GeH_4 = 50$ | $GeH_4/SiH_4 = 2/10 \sim 0$<br>$C_2H_4/(GeH_4 + SiH_4) = 1/100$ | 0.18 | 5 | 19 |

TABLE A-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$C_2H_4$ | $SiH_4 + GeH_4 = 50$ | $GeH_4/SiH_4 = 1/1 \sim 5/100$<br>$C_2H_4/(GeH_4 + SiH_4) = 15/100 \sim 1/10$ | 0.18 | 5 | 7 |
| Second layer | $SiH_4/He = 0.05$<br>$GeH_4/He = 0.05$<br>$C_2H_4$ | $SiH_4 + GeH_4 = 50$ | $GeH_4/SiH_4 = 5/100 \sim 0$<br>$C_2H_4/(GeH_4 + SiH_4) = 1/10 \sim 0$ | 0.18 | 5 | 13 |

TABLE A-13

| Sample NO. | 1301 | 1302 | 1303 | 1304 | 1305 | 1306 | 1307 | 1308 |
|---|---|---|---|---|---|---|---|---|
| $C_2H_4/(GeH_4 + SiH_4)$ Flow rate ratio | 1/1000 | 5/1000 | 9/1000 | 2/100 | 3/100 | 5/100 | 8/100 | 1/10 |
| C content (atomic %) | 0.1 | 0.5 | 0.89 | 1.96 | 2.9 | 4.76 | 7.4 | 9.1 |
| Evaluation | Δ | O | O | ⊚ | ⊚ | O | O | Δ |

⊚ Excellent
O Good
Δ Practically satisfactory

TABLE A-14

| Sample NO. | 1401 | 1402 | 1403 | 1404 | 1405 | 1406 | 1407 | 1408 |
|---|---|---|---|---|---|---|---|---|
| Layer thickness | 30Å | 500Å | 0.1μ | 0.3μ | 0.8μ | 3μ | 4μ | 5μ |
| Evaluation | Δ | O | ⊚ | ⊚ | ⊚ | O | O | Δ |

⊚ Excellent
O Good
Δ Practically satisfactory

TABLE B-1

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 8 \sim 100$<br>$B_2H_6/(GeH_4 + SiH_4) = 8 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 19 |

TABLE B-2

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/10 \sim 8 \sim 100$<br>$B_2H_6/(GeH_4 + SiH_4) = 5 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 19 |

TABLE B-3

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 33 \sim 100$<br>$B_2H_6/(GeH_4 + SiH_4) = 1 \times 10^{-3}$<br>$C_2H_4/(GeH_4 + SiH_4) = 2/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 33/100 \sim 4/100$ | 0.18 | 5 | 19.5 |

TABLE B-4

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 15/100$<br>$B_2H_6/(GeH_4 + SiH_4) = 5 \times 10^{-4}$<br>$C_2H_4/(GeH_4 + SiH_4) = 3/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 15/100 \sim 0$ | 0.18 | 5 | 19.5 |

TABLE B-5

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 1/1 \sim 6/10$<br>$B_2H_6/(GeH_4 + SiH_4) = 2 \times 10^{-3}$<br>$C_2H_4/(GeH_4 + SiH_4) = 3/100$ | 0.18 | 5 | 1 |

TABLE B-5-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Second layer | C$_2$H$_4$<br>SiH$_4$/He = 0.05<br>GeH$_4$/He = 0.05 | SiH$_4$ + GeH$_4$ = 50 | GeH$_4$/SiH$_4$ = 6/10~5/1000 | 0.18 | 5 | 19 |

TABLE B-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 195/1000~0 | 0.18 | 5 | 19 |

TABLE B-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 95/100~0 | 0.18 | 5 | 19 |

TABLE B-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | Si$_2$H$_6$/He = 0.05<br>GeH$_4$/He = 0.05<br>B$_2$H$_6$/He = 10$^{-3}$<br>C$_2$H$_4$ | Si$_2$H$_6$ + GeH$_4$ = 50 | GeH$_4$/Si$_2$H$_6$ = 4/10~8/100<br>B$_2$H$_6$/(GeH$_4$ + Si$_2$H$_6$) = 8 × 10$^{-3}$<br>C$_2$H$_4$/(GeH$_4$ + Si$_2$H$_6$) = 3/100 | 0.18 | 5 | 1 |
| Second layer | Si$_2$H$_6$/He = 0.05<br>GeH$_4$/He = 0.05 | Si$_2$H$_6$ + GeH$_4$ = 55 | GeH$_4$/Si$_2$H$_6$ = 8/100~0 | 0.18 | 5 | 19 |

TABLE B-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiF$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiF$_4$ = 1/10~8/100<br>B$_2$H$_6$/(GeH$_4$ + SiF$_4$) = 5 × 10$^{-3}$<br>C$_2$H$_4$/(GeH$_4$ + SiF$_4$) = 3/100 | 0.18 | 5 | 1 |
| Second layer | SiF$_4$/He = 0.05<br>GeH$_4$/He = 0.05 | SiF$_4$ + GeH$_4$ = 50 | GeH$_4$/SiF$_4$ = 8/100~0 | 0.18 | 5 | 19 |

TABLE B-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>SiF$_4$/He = 0.05<br>GeH$_4$/He = 0.05<br>B$_2$H$_6$/He = 10$^{-3}$<br>C$_2$H$_4$ | SiH$_4$ + SiF$_4$ + GeH$_4$ = 50 | GeH$_4$/(SiH$_4$ + SiF$_4$) = 8/10~33/100<br>B$_2$H$_6$/(GeH$_4$ + SiH$_4$ + SiF$_4$) = 1 × 10$^{-3}$<br>C$_2$H$_4$/(GeH$_4$ + SiH$_4$ + SiF$_4$) = 2 × 100 | 0.18 | 5 | 0.5 |
| Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiF$_4$ + SiF$_4$) = 4/10~33/100 | 0.18 | 5 | 19.5 |

TABLE B-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$PH_3/He = 10^{-3}$<br>$C_2H_4$ | $SiH_4 + GeH_4 = 50$ | $GeH_4/SiH_4 = 4/10 \sim 8/100$<br>$PH_3/(GeH_4 + SiH_4) = 1 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 19 |

TABLE B-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 0$<br>$B_2H_6/(GeH_4 + SiH_4) = 8 \times 10^{-3}$<br>$C_2H_4/(GeH_4 + SiH_4) = 1/100$ | 0.18 | 5 | 20 |

TABLE B-13

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/10 \sim 0$<br>$B_2H_6/(GeH_4 + SiH_4) = 5 \times 10^{-3}$<br>$C_2H_4/(GeH_4 + SiH_4) = 1/100$ | 0.18 | 5 | 20 |

TABLE B-14

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 4/100$<br>$B_2H_6/(GeH_4 + SiH_4) = 1 \times 10^{-3}$<br>$C_2H_4/(GeH_4 + SiH_4) = 2/100 \sim 0$ | 0.18 | 5 | 20 |

The flow rate ratio ($C_2H_4/(GeH_4 + SiH_4)$) was reduced linearly.

TABLE B-15

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 15/100 \sim 0$<br>$B_2H_6/(GeH_4 + SiH_4) = 5 \times 10^{-4}$<br>$C_2H_4/(GeH_4 + SiH_4) = 3/100 \sim 0$ | 0.18 | 5 | 20 |

The flow rate ratio $C_2H_4/(GeH_4 + SiH_4)$ was reduced linearly.

TABLE B-16

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/1 \sim 6/10$<br>$B_2H_6/(GeH_4 + SiH_4) = 2 \times 10^{-3}$<br>$C_2H_4/(GeH_4 + SiH_4) = 3 \times 100$ | 0.18 | 5 | 1 |
| Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 6/10 \sim 5/1000$<br>$B_2H_6/(GeH_4 + SiH_4) = 2 \times 10^{-3}$ | 0.18 | 5 | 19 |

TABLE B-17

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 2/10 \sim 195/1000$<br>$B_2H_6/(GeH_4 + SiH_4) = 5 \times 10^{-3}$<br>$C_2H_4/(GeH_4 + SiH_4) = 3/100$ | 0.18 | 5 | 15 |

TABLE B-17-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Second layer | C$_2$H$_4$<br>SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 195/1000~0<br>B$_2$H$_6$/(GeH$_4$ + SiH$_4$) = 5 × 10$^{-3}$ | 0.18 | 5 | 19 |

TABLE B-18

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 95/100~0<br>B$_2$H$_6$/(GeH$_4$ + SiH$_4$) = 2 × 10$^{-3}$ | 0.18 | 5 | 19 |

TABLE B-19

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3 × 100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 8 × 10$^{-3}$ | 0.18 | 5 | 19 |

(The flow rate ratio C$_2$H$_4$/(GeH$_4$ + SiH$_4$) was reduced linearly.)

TABLE B-20

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>C$_2$H$_4$/(GeH$_4$ + SiH$_4$) = 3 × 100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 5 × 10$^{-3}$ | 0.18 | 5 | 19 |

(The flow rate ratio C$_2$H$_4$/(GeH$_4$ + SiH$_4$) was reduced linearly.)

TABLE B-21

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>C$_2$H$_4$/(GeH$_4$ + SiH$_4$) = 2 × 100 | 0.18 | 5 | 0.5 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 33/100~0<br>B$_2$H$_6$/(GeH$_4$ + SiH$_4$) = 1 × 10$^{-3}$ | 0.18 | 5 | 19.5 |

(The flow rate ratio C$_2$H$_4$/(GeH$_4$ + SiH$_4$) was reduced linearly.)

TABLE B-22

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3/100 | 0.18 | 5 | 15 |
| Second layer | SiH$_4$/He = 0.05<br>GeH$_4$/He = 0.05 | SiH$_4$ + GeH$_4$ = 50 | GeH$_4$/SiH$_4$ = 8/100~0<br>PH$_3$/(GeH$_4$ + SiH$_4$) = 1 × 10$^{-5}$ | 0.18 | 5 | 5 |

TABLE B-22-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | $PH_3/He = 10^{-3}$ | | | | | |

TABLE C-1

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $C_2H_4$ | $SiH_4 + GeH_4 = 50$ | $GeH_4/SiH_4 = 1/1 \sim 2/10$ $C_2H_4/(GeH_4 + SiH_4) = 3/100$ | 0.18 | 5 | 1 |
| Second layer | $SiH_4/He = 0.05$ $GeH_4/He = 0.05$ | $SiH_4 + GeH_4 = 50$ | $GeH_4/SiH_4 = 2/10 \sim 0$ | 0.18 | 5 | 19 |
| Layer (II) | $SiH_4/He = 0.05$ $NH_3$ | $SiH_4 = 100$ | $SiH_4/NH_3 = 1/30$ | 0.18 | 10 | 0.5 |

TABLE C-2

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $C_2H_4$ | $SiH_4 + GeH_4 = 50$ | $GeH_4/SiH_4 = 1/10 \sim 4/100$ $C_2H_4/(GeH_4 + SiH_4) = 2/100$ | 0.18 | 5 | 5 |
| Second layer | $SiH_4/He = 0.05$ $GeH_4/He = 0.05$ | $SiH_4 + GeH_4 = 50$ | $GeH_4/SiH_4 = 4/100 \sim 0$ | 0.18 | 5 | 15 |

TABLE C-3

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $C_2H_4$ | $SiH_4 + GeH_4 = 50$ | $GeH_4/SiH_4 = 4/10 \sim 2/10$ $C_2H_4/(GeH_4 + SiH_4) = 3/100$ | 0.18 | 5 | 1.5 |
| Second layer | $SiH_4/He = 0.05$ $GeH_4/He = 0.05$ | $SiH_4 + GeH_4 = 50$ | $GeH_4/SiH_4 = 2/10 \sim 2/1000$ | 0.18 | 5 | 18.5 |

TABLE C-4

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $C_2H_4$ | $SiH_4 + GeH_4 = 50$ | $GeH_4/SiH_4 = 15/100$ $C_2H_4/(GeH_4 + SiH_4) = 4/100$ | 0.18 | 5 | 2 |
| Second layer | $SiH_4/He = 0.05$ $GeH_4/He = 0.05$ | $SiH_4 + GeH_4 = 50$ | $GeH_4/SiH_4 = 5/100 \sim 0$ | 0.18 | 5 | 18 |

TABLE C-5

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $C_2H_4$ | $SiH_4 + GeH_4 = 50$ | $GeH_4/SiH_4 = 1 \sim 5/10$ $C_2H_4/(GeH_4 + SiH_4) = 5/100$ | 0.18 | 5 | 0.5 |
| Second layer | $SiH_4/He = 0.05$ $GeH_4/He = 0.05$ | $SiH_4 + GeH_4 = 50$ | $GeH_4/SiH_4 = 5/10 \sim 0$ | 0.18 | 5 | 19.5 |

TABLE C-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 2/10~5/100<br>C$_2$H$_4$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 5/100~0 | 0.18 | 5 | 16 |

TABLE C-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/10~8/100<br>C$_2$H$_4$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 16 |

TABLE C-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | Si$_2$H$_6$ + GeH$_4$ = 50 | GeH$_4$/Si$_2$H$_6$ = 1/1~2/10<br>C$_2$H$_4$/(GeH$_4$ + Si$_2$H$_6$) = 3/100 | 0.18 | 5 | 1 |
| Second layer | Si$_2$H$_6$/He = 0.05<br>GeH$_4$/He = 0.05 | Si$_2$H$_6$ + GeH$_4$ = 50 | GeH$_4$/Si$_2$H$_6$ = 2/10~0 | 0.18 | 5 | 19 |

TABLE C-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiF$_4$/He = 0.05<br>GeH$_4$/He = 0.05<br>C$_2$H$_4$ | SiF$_4$ + GeH$_4$ = 50 | GeH$_4$/SiF$_4$ = 1/1~2/10<br>C$_2$H$_4$/(GeH$_4$ + SiF$_4$) = 3/100 | 0.18 | 5 | 1 |
| Second layer | SiF$_4$/He = 0.05<br>GeH$_4$/He = 0.05 | SiF$_4$ + GeH$_4$ = 50 | GeH$_4$/SiF$_4$ = 2/10~0 | 0.18 | 5 | 19 |

TABLE C-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>SiF$_4$/He = 0.05<br>GeH$_4$/He = 0.05<br>C$_2$H$_4$ | SiH$_4$ + SiF$_4$ + GeH$_4$ = 50 | GeH$_4$/(SiH$_4$ + SiF$_4$) = 1/1~2/10<br>C$_2$H$_4$/(GeH$_4$ + SiH$_4$ + SiF$_4$) = 3/100 | 0.18 | 5 | 1 |
| Second layer | SiH$_4$/He = 0.05<br>SiF$_4$/He = 0.05<br>GeH$_4$/He = 0.05 | SiF$_4$ + Si$_2$F$_8$ + GeH$_4$ = 50 | GeH$_4$/(SiH$_4$ + SiF$_4$) = 2/10~0 | 0.18 | 5 | 19 |

TABLE C-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/1~2/10<br>C$_2$H$_4$/(GeH$_4$ + SiH$_4$) = 2/100 | 0.18 | 5 | 1 |
| Second layer | SiH$_4$/He = 0.05<br>GeH$_4$/He = 0.05<br>C$_2$H$_4$ | SiH$_4$ + GeH$_4$ = 50 | GeH$_4$/SiH$_4$ = 2/10~0<br>C$_2$H$_4$/(GeH$_4$ + SiH$_4$) = 1/100 | 0.18 | 5 | 19 |
| Layer (II) | SiH$_4$/He = 0.5 | SiH$_4$ = 100 | SiH$_4$/NH$_3$ = 1/30 | 0.18 | 10 | 0.5 |

TABLE C-11-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | NH$_3$ | | | | | |

TABLE C-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/1~5/100<br>C$_2$H$_4$/(GeH$_4$ + SiH$_4$) = 15/100~1/10 | 0.18 | 5 | 7 |
| Second layer | SiH$_4$/He = 0.05<br>GeH$_4$/He = 0.05<br>C$_2$H$_4$ | SiH$_4$ + GeH$_4$ = 50 | GeH$_4$/SiH$_4$ = 5/100~0<br>C$_2$H$_4$/(GeH$_4$/SiH$_4$) = 1/10~0 | 0.18 | 5 | 13 |
| Layer (II) | SiH$_4$/He = 0.5<br>NH$_3$ | SiH$_4$ = 100 | SiH$_4$/NH$_3$ = 1/30 | 0.18 | 10 | 0.5 |

TABLE C-13

| | Sample NO. | | | | | | | |
|---|---|---|---|---|---|---|---|---|
| | 1301 | 1302 | 1303 | 1304 | 1305 | 1306 | 1307 | 1308 |
| C$_2$H$_4$/(GeH$_4$ + SiH$_4$) (Flow rate ratio) | 1/1000 | 5/1000 | 9/1000 | 2/100 | 3/100 | 5/100 | 8/100 | 1/10 |
| C content (atomic %) | 0.1 | 0.5 | 0.89 | 1.96 | 2.9 | 4.76 | 7.4 | 9.1 |
| Evaluation | Δ | ○ | ○ | ◎ | ◎ | ○ | ○ | Δ |

◎ Excellent
○ Good
Δ Practically satisfactory

TABLE C-14

| | Sample NO. | | | | | | | |
|---|---|---|---|---|---|---|---|---|
| | 1401 | 1402 | 1403 | 1404 | 1405 | 1406 | 1407 | 1408 |
| Layer thickness | 30 Å | 500 Å | 0.1$\mu$ | 0.3$\mu$ | 0.8$\mu$ | 3$\mu$ | 4$\mu$ | 5$\mu$ |
| Evaluation | Δ | ○ | ◎ | ◎ | ◎ | ○ | ○ | Δ |

◎ Excellent
○ Good
Δ Practically satisfactory

TABLE C-15

| Conditions | Gases employed | Flow rate (SCCM) | Flow rate ratio or Area ratio | Discharging power (W/cm$^2$) | Layer thickness ($\mu$) |
|---|---|---|---|---|---|
| 12-1 | Ar(NH$_3$/Ar) | 200(1/1) | Si wafer:<br>Silicon nitride = 1:30 | 0.3 | 0.5 |
| 12-2 | Ar(NH$_3$/Ar) | 200(1/1) | Si wafer:<br>Silicon nitride = 1:60 | 0.3 | 0.3 |
| 12-3 | Ar(NH$_3$/Ar) | 200(1/1) | Si wafer:<br>Silicon nitride = 6:4 | 0.3 | 1.0 |
| 12-4 | SiH$_4$/He = 1<br>NH$_3$ | SiH$_4$ = 15 | SiH$_4$:NH$_3$ = 1:100 | 0.18 | 0.3 |
| 12-5 | SiH$_4$/He = 0.5<br>NH$_3$ | SiH$_4$ = 100 | SiH$_4$:NH$_3$ = 1:30 | 0.18 | 1.5 |
| 12-6 | SiH$_4$/He = 0.5<br>SiF$_4$/He = 0.5<br>NH$_3$ | SiH$_4$ + SiF$_4$ = 150 | SiH$_4$:SiF$_4$:NH$_3$ = 1:1:60 | 0.18 | 0.5 |
| 12-7 | SiH$_4$/He = 0.5<br>SiF$_4$/He = 0.5<br>NH$_3$ | SiH$_4$ + SiF$_4$ = 15 | SiH$_4$:SiF$_4$:NH$_3$ = 2:1:90 | 0.18 | 0.3 |
| 12-8 | SiH$_4$/He = 0.5<br>SiF$_4$/He = 0.5<br>NH$_3$ | SiH$_4$ + SiF$_4$ = 150 | SiH$_4$:SiF$_4$:NH$_3$ = 1:1:20 | 0.18 | 1.5 |

TABLE C-15A

| Preparation conditions for layer (II) | Sample No./Evaluation | | | | | | | | |
|---|---|---|---|---|---|---|---|---|---|
| 12-1 | 12-201<br>○ ○ | 12-301<br>○ ○ | 12-401<br>○ ○ | 12-501<br>○ ○ | 12-601<br>○ ○ | 12-701<br>○ ○ | 12-801<br>○ ○ | 12-901<br>○ ○ | 12-1001<br>○ ○ |
| 12-2 | 12-202<br>○ ○ | 12-302<br>○ ○ | 12-402<br>○ ○ | 12-502<br>○ ○ | 12-602<br>○ ○ | 12-702<br>○ ○ | 12-802<br>○ ○ | 12-902<br>○ ○ | 12-1002<br>○ ○ |

TABLE C-15A-continued

| 12-3 | 12-203 ○○ | 12-303 ○○ | 12-403 ○○ | 12-503 ○○ | 12-603 ○○ | 12-703 ○○ | 12-803 ○○ | 12-903 ○○ | 12-1003 ○○ |
|---|---|---|---|---|---|---|---|---|---|
| 12-4 | 12-204 ◎◎ | 12-304 ◎◎ | 12-404 ◎◎ | 12-504 ◎◎ | 12-604 ◎◎ | 12-704 ◎◎ | 12-804 ◎◎ | 12-904 ◎◎ | 12-1004 ◎◎ |
| 12-5 | 12-205 ◎◎ | 12-305 ◎◎ | 12-405 ◎◎ | 12-505 ◎◎ | 12-605 ◎◎ | 12-705 ◎◎ | 12-805 ◎◎ | 12-905 ◎◎ | 12-1005 ◎◎ |
| 12-6 | 12-206 ◎◎ | 12-306 ◎◎ | 12-406 ◎◎ | 12-506 ◎◎ | 12-606 ◎◎ | 12-706 ◎◎ | 12-806 ◎◎ | 12-906 ◎◎ | 12-1006 ◎◎ |
| 12-7 | 12-207 ○○ | 12-307 ○○ | 12-407 ○○ | 12-507 ○○ | 12-607 ○○ | 12-707 ○○ | 12-807 ○○ | 12-907 ○○ | 12-1007 ○○ |
| 12-8 | 12-208 ○○ | 12-308 ○○ | 12-408 ○○ | 12-508 ○○ | 12-608 ○○ | 12-708 ○○ | 12-808 ○○ | 12-908 ○○ | 12-1008 ○○ |

Evaluation standard
◎ Excellent
○ Good

Sample NO.
Overall image evaluation   Durability evaluation

TABLE C-16

| | Sample NO. | | | | | | |
|---|---|---|---|---|---|---|---|
| | 1401 | 1402 | 1403 | 1404 | 1405 | 1406 | 1407 |
| $Si:Si_3N_4$ (Target area ratio) | 9:1 | 6.5:3.5 | 4:10 | 2:60 | 1:100 | 1:100 | 1:100 |
| ($NH_3/Ar$) | (0/1) | (1/1) | (1/1) | (1/1) | (2/1) | (3/1) | (4/1) |
| Si:N (Content ratio) | 9.7:0.3 | 8.8:1.2 | 7.3:2.7 | 5.0:5.0 | 4.5:5.5 | 4:6 | 3:7 |
| Image quality evaluation | Δ | ⊚ | ◎ | ○ | ○ | Δ | X |

⊚ Very good
○ Good
Δ Sufficiently practically usable
X Image defect formed

TABLE C-17

| | Sample NO. | | | | | | | |
|---|---|---|---|---|---|---|---|---|
| | 1501 | 1502 | 1503 | 1504 | 1505 | 1506 | 1507 | 1508 |
| $SiH_4:NH_3$ (Flow rate ratio) | 9:1 | 1:3 | 1:10 | 1:30 | 1:100 | 1:1000 | 1:5000 | 1:10000 |
| Si:N (Content ratio) | 9.99:0.01 | 9.9:0.1 | 8.5:1.5 | 7.1:2.9 | 5:5 | 4.5:5.5 | 4:6 | 3.5:6.5 |
| Image quality evaluation | Δ | ⊚ | ⊚ | ⊚ | ○ | Δ | Δ | X |

⊚ Very good
○ Good
Δ Sufficiently practically usable
X Image defect formed

TABLE C-18

| | Sample NO. | | | | | | | |
|---|---|---|---|---|---|---|---|---|
| | 1601 | 1602 | 1603 | 1604 | 1605 | 1606 | 1607 | 1608 |
| $SiH_4:SiF_4:NH_3$ (Flow rate ratio) | 5:4:1 | 1:1:6 | 1:1:20 | 1:1:60 | 1:2:300 | 2:1:3000 | 1:1:1000 | 1:1:2000 |
| Si:N (Content ratio) | 9.89:0.11 | 9.8:0.2 | 8.4:1.6 | 7.0:3.0 | 5.1:4.9 | 4.6:5.4 | 4.1:5.9 | 3.6:6.4 |
| Image quality evaluation | Δ | ⊚ | ⊚ | ⊚ | ○ | Δ | Δ | X |

⊚ Very good
○ Good
Δ Sufficiently practically usable
X Image defect formed

TABLE C-19

| Sample NO. | Thickness of layer (II) | Results |
|---|---|---|
| 1601 | 0.001 | Image defect liable to occur |
| 1602 | 0.02 | No image defect during 20,000 repetitions |
| 1603 | 0.05 | Stable for 50,000 repetitions or more |
| 1604 | 1 | Stable for 200,000 repetition or more |

TABLE D-1

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $G_2H_4/SiH_4 = 4/10\sim8/100$<br>$B_2H_6/(GeH_4 + SiH_4) = 8 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100\sim0$ | 0.18 | 5 | 19 |
| Layer (II) | $SiH_4/He = 0.05$<br>$NH_3$ | $SiH_4 = 100$ | $SiH_4/NH_3 = 1/30$ | 0.18 | 10 | 0.5 |

TABLE D-2

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $G_2H_4/SiH_4 = 1/10\sim8/100$<br>$B_2H_6/(GeH_4 + SiH_4) = 5 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100\sim0$ | 0.18 | 5 | 19 |

TABLE D-3

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10\sim33/100$<br>$B_2H_6/(GeH_4 + SiH_4) = 1 \times 10^{-3}$<br>$C_2H_4/(GeH_4 + SiH_4) = 2/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 33/100\sim4/100$ | 0.18 | 5 | 19.5 |

TABLE D-4

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 15/100$<br>$B_2H_6/(GeH_4 + SiH_4) = 5 \times 10^{-4}$<br>$C_2H_4/(GeH_4 + SiH_4) = 3/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 15/100\sim0$ | 0.18 | 5 | 19.5 |

TABLE D-5

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/1\sim6/10$<br>$B_2H_6/(GeH_4 + SiH_4) = 2 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 6/10\sim5/1000$ | 0.18 | 5 | 19 |

TABLE D-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$<br>$GeH_4/He = 0.05$ | $SiH_4 + GeH_4 = 50$ | $GeH_4/SiH_4 = 2/10\sim195/1000$<br>$B_2H_6/(GeH_4 + SiH_4) = 5 \times 10^{-3}$ | 0.18 | 5 | 1 |

TABLE D-6-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | $B_2H_6/He = 10^{-3}$ $C_2H_4$ | | $C_2H_4/(GeH_4 + SiH_4) = 3/100$ | | | |
| Second layer | $SiH_4/He = 0.05$ $GeH_4/He = 0.05$ | $SiH_4 + GeH_4 = 50$ | $GeH_4/SiH_4 = 195/1000\sim0$ | 0.18 | 5 | 19 |

TABLE D-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $B_2H_6/He = 10^{-3}$ $C_2H_4$ | $SiH_4 + GeH_4 = 50$ | $GeH_4/SiH_4 = 1/10\sim95/100$ $B_2H_6/(GeH_4 + SiH_4) = 2 \times 10^{-3}$ $C_2H_4/(GeH_4 + SiH_4) = 3/100$ | 0.18 | 5 | 1 |
| Second layer | $SiH_4/He = 0.05$ $GeH_4/He = 0.05$ | $SiH_4 + GeH_4 = 50$ | $GeH_4/SiH_4 = 95/100\sim0$ | 0.18 | 5 | 19 |

TABLE D-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $Si_2H_6/He = 0.05$ $GeH_4/He = 0.05$ $B_2H_6/He = 10^{-3}$ $C_2H_4$ | $Si_2H_6 + GeH_4 = 50$ | $GeH_4/Si_2H_6 = 4/10\sim8/100$ $B_2H_6/(GeH_4 + Si_2H_6) = 8 \times 10^{-3}$ $C_2H_4/(GeH_4 + Si_2H_6) = 3/100$ | 0.18 | 5 | 1 |
| Second layer | $Si_2H_6/He = 0.05$ $GeH_4/He = 0.05$ | $Si_2H_6 + GeH_4 = 55$ | $GeH_4/Si_2H_6 = 8/100\sim\sim0$ | 0.18 | 5 | 19 |

TABLE D-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiF_4/He = 0.05$ $GeH_4/He = 0.05$ $B_2H_6/He = 10^{-3}$ $C_2H_4$ | $SiF_4 + GeH_4 = 50$ | $GeH_4/SiF_4 = 1/10\sim8/100$ $B_2H_6/(GeH_4 + SiF_4) = 5 \times 10^{-3}$ $C_2H_4/(GeH_4 + SiF_4) = 3/100$ | 0.18 | 5 | 1 |
| Second layer | $SiF_4/He = 0.05$ $GeH_4/He = 0.05$ | $SiF_4 + GeH_4 = 50$ | $GeH_4/SiF_4 = 8/100\sim0$ | 0.18 | 5 | 19 |

TABLE D-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $SiF_4/He = 0.05$ $GeH_4/He = 0.05$ $B_2H_6/He = 10^{-3}$ $C_2H_4$ | $SiH_4 + SiF_4 + GeH_4 = 50$ | $GeH_4/(SiH_4 + SiF_4) = 4/10\sim33/100$ $B_2H_6/(GeH_4 + SiH_4 + SiF_4) = 1 \times 10^{-3}$ $C_2H_4/(GeH_4 + SiH_4 + SiF_4) = 2/100$ | 0.18 | 5 | 0.5 |
| Second layer | $SiH_4/He = 0.05$ $SiF_4/He = 0.05$ $GeH_4/He = 0.05$ | $SiH_4 + SiF_4 + GeH_4 = 50$ | $GeH_4/(SiH_4 + SiF_4) = 4/10\sim33/100$ | 0.18 | 5 | 19.5 |

TABLE D-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $PH_3/He = 10^{-3}$ $C_2H_4$ | $SiH_4 + GeH_4 = 50$ | $GeH_4/SiH_4 = 4/10\sim8/100$ $PH_3/(GeH_4 + SiH_4) = 1 \times 10^{-3}$ $C_2H_4/(GeH_4 + SiH_4) = 3/100$ | 0.18 | 5 | 1 |
| Second layer | $SiH_4He = 0.05$ | $SiH_4 + GeH_4 = 50$ | $GeH_4/SiH_4 = 8/100\sim0$ | 0.18 | 5 | 19 |

TABLE D - 11-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (II) | GeH$_4$/He = 0.05<br>SiH$_4$/He = 0.5<br>NH$_3$ | SiH$_4$ = 100 | SiH$_4$/NH$_3$ = 1/30 | 0.18 | 8 | 0.5 |

TABLE D - 12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~0<br>B$_2$H$_6$/(GeH$_4$ + SiH$_4$) = 8 × 10$^{-3}$<br>C$_2$H$_4$/(GeH$_4$ + SiH$_4$) = 1/100 | 0.18 | 5 | 20 |
| Second layer | SiH$_4$/He = 0.5<br>NH$_3$ | SiH$_4$ = 100 | SiH$_4$/NH$_3$ = 1/30 | 0.18 | 7 | 0.5 |

TABLE D - 13

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~0<br>B$_2$H$_6$/(GeH$_4$ + SiH$_4$) = 5 × 10$^{-3}$<br>C$_2$H$_4$/(GeH$_4$ + SiH$_4$) = 1/100 | 0.18 | 5 | 20 |

TABLE D - 14

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~4/100<br>B$_2$H$_6$/(GeH$_4$ + SiH$_4$) = 1 × 10$^{-3}$<br>C$_2$H$_4$/(GeH$_4$ + SiH$_4$) = 2/100~0 | 0.18 | 5 | 20 |

[The flow rate ratio (C$_2$H$_4$ + SiH$_4$) was reduced linearly.]

TABLE D - 15

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 15/100~0<br>B$_2$H$_6$/(GeH$_4$ + SiH$_4$) = 5 × 10$^{-4}$<br>C$_2$H$_4$/(GeH$_4$ + SiH$_4$) = 3/100~0 | 0.18 | 5 | 20 |

[The flow rate ratio C$_2$H$_4$/(GeH$_4$ + SiH$_4$) was reduced linearly.]

TABLE D - 16

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/1~6/10<br>B$_2$H$_6$/(GeH$_4$ + SiH$_4$) = 2 × 10$^{-3}$<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 6/10~5/1000<br>B$_2$H$_6$/(GeH$_4$ + SiH$_4$) = 2 × 10$^{-3}$ | 0.18 | 5 | 19 |

TABLE D - 17

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>C$_2$H$_4$/(GeH$_4$ + SiH$_4$) = 2/100 | 0.18 | 5 | 15 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 195/1000~0<br>B$_2$H$_6$/(GeH$_4$ + SiH$_4$) = 5 × 10$^{-3}$ | 0.18 | 5 | 19 |

TABLE D - 18

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>C$_2$H$_4$(GeH$_4$ + SiH$_4$) = 3/100 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 95/100~0<br>B$_2$H$_6$/(GeH$_4$ + SiH$_4$) = 2 × 10$^{-3}$ | 0.18 | 5 | 19 |

TABLE D - 19

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 8 × 10$^{-3}$ | 0.18 | 5 | 19 |

[The flow rate ratio C$_2$H$_4$/(GeH$_4$ + SiH$_4$) was reduced linearly.]

TABLE D - 20

| Layer constitution | Gases employed | Flow rate (SCCM) | Flow rate ratio | Discharging power (W/cm$^2$) | Laye formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>C$_2$H$_4$/(GeH$_4$ + SiH$_4$) = 3/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 5 × 10$^{-3}$ | 0.18 | 5 | 19 |

[The flow rate ratio C$_2$H$_4$/(GeH$_4$ + SiH$_4$) was reduced linearly.]

TABLE D - 21

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>C$_2$H$_4$/(GeH$_4$ + SiH$_4$) = 2/100 | 0.18 | 5 | 0.5 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 33/100~0<br>B$_2$H$_6$/(GeH$_4$ + SiH$_4$) = 1 × 10$^{-3}$ | 0.18 | 5 | 19.5 |

[The flow rate ratio C$_2$H$_4$/(GeH$_4$ + SiH$_4$) was reduced linearly.]

TABLE D - 22

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | G$_2$H$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3/100 | 0.18 | 5 | 15 |
| Second layer | SiH$_4$/He = 0.05<br>GeH$_4$/He = 0.05<br>PH$_3$/He = 10$^{-3}$ | SiH$_4$ + GeH$_4$ = 50 | GeH$_4$/SiH$_4$ = 8/100~0<br>PH$_3$/(GeH$_4$ + SiH$_4$) = 1 × 10$^{-5}$ | 0.18 | 5 | 5 |
| Layer (II) | SiH$_4$/He = 0.5<br>NH$_3$ | SiH$_4$ = 100 | SiH$_4$/NH$_3$ = 1/30 | 0.18 | 10 | 0.5 |

TABLE D - 23

| Conditions | Gases employed | Flow rate (SCCM) | Flow rate ratio or Area ratio | Discharging power (W/cm$^2$) | Layer thickness ($\mu$) |
|---|---|---|---|---|---|
| 12-1 | Ar(NH$_3$/Ar) | 200 (1/1) | Si wafer: Silicon nitride = 1:30 | 0.3 | 0.5 |
| 12-2 | Ar(NH$_3$/Ar) | 200 (1/1) | Si wafer: Silicon nitride = 1:30 | 0.3 | 0.3 |
| 12-3 | Ar(NH$_3$/Ar) | 200 (1/1) | Si wafer: Silicon nitride = 6:4 | 0.3 | 1.0 |
| 12-4 | SiH$_4$/He = 1<br>NH$_3$ | SiH$_4$ = 15 | SiH$_4$:NH$_3$ = 1:100 | 0.18 | 0.3 |
| 12-5 | SiH$_4$/He = 0.5<br>NH$_3$ | SiH$_4$ = 100 | SiH$_4$:NH$_3$ = 1:30 | 0.18 | 1.5 |
| 12-6 | SiH$_4$/He = 0.5<br>SiF$_4$/He = 0.5<br>NH$_3$ | SiH$_4$ + SiF$_4$ = 150 | SiH$_4$:SiF$_4$:NH$_3$ = 1:1:60 | 0.18 | 0.5 |
| 12-7 | SiH$_4$/He = 0.5<br>SiF$_4$/He = 0.5<br>NH$_3$ | SiH$_4$ + SiF$_4$ = 15 | SiH$_4$:SiF$_4$:NH$_3$ = 2:1:90 | 0.18 | 0.3 |
| 12-8 | SiH$_4$/He = 0.5<br>SiF$_4$/He = 0.5<br>NH$_3$ | SiH$_4$ + SiF$_4$ = 150 | SiH$_4$:SiF$_4$:NH$_3$ = 1:1:20 | 0.18 | 1.5 |

TABLE D-23A

| Preparation conditions for layer (II) | Sample No./Evaluation | | | | | | | | |
|---|---|---|---|---|---|---|---|---|---|
| 12-1 | 12-201 ○ ○ | 12-301 ○ ○ | 12-401 ○ ○ | 12-501 ○ ○ | 12-601 ○ ○ | 12-701 ○ ○ | 12-801 ○ ○ | 12-901 ○ ○ | 12-1001 ○ ○ |
| 12-2 | 12-202 ○ ○ | 12-302 ○ ○ | 12-402 ○ ○ | 12-502 ○ ○ | 12-602 ○ ○ | 12-702 ○ ○ | 12-802 ○ ○ | 12-902 ○ ○ | 12-1002 ○ ○ |
| 12-3 | 12-203 ○ ○ | 12-303 ○ ○ | 12-403 ○ ○ | 12-503 ○ ○ | 12-603 ○ ○ | 12-703 ○ ○ | 12-803 ○ ○ | 12-903 ○ ○ | 12-1003 ○ ○ |
| 12-4 | 12-204 ◎ ◎ | 12-304 ◎ ◎ | 12-404 ◎ ◎ | 12-504 ◎ ◎ | 12-604 ◎ ◎ | 12-704 ◎ ◎ | 12-804 ◎ ◎ | 12-904 ◎ ◎ | 12-1004 ◎ ◎ |
| 12-5 | 12-205 ◎ ◎ | 12-305 ◎ ◎ | 12-405 ◎ ◎ | 12-505 ◎ ◎ | 12-605 ◎ ◎ | 12-705 ◎ ◎ | 12-805 ◎ ◎ | 12-905 ◎ ◎ | 12-1005 ◎ ◎ |
| 12-6 | 12-206 ◎ ◎ | 12-306 ◎ ◎ | 12-406 ◎ ◎ | 12-506 ◎ ◎ | 12-606 ◎ ◎ | 12-706 ◎ ◎ | 12-806 ◎ ◎ | 12-906 ◎ ◎ | 12-1006 ◎ ◎ |
| 12-7 | 12-207 ◎ ◎ | 12-307 ◎ ◎ | 12-407 ◎ ◎ | 12-507 ◎ ◎ | 12-607 ◎ ◎ | 12-707 ◎ ◎ | 12-807 ◎ ◎ | 12-907 ◎ ◎ | 12-1007 ◎ ◎ |
| 12-8 | 12-208 ○ ○ | 12-308 ○ ○ | 12-408 ○ ○ | 12-508 ○ ○ | 12-608 ○ ○ | 12-708 ○ ○ | 12-808 ○ ○ | 12-908 ○ ○ | 12-1008 ○ ○ |

Evaluation standard
◎. Excellent
○. Good

Sample No.
| Overall image evaluation | Durability evaluation |
|---|---|

TABLE D-24

| Sample No | 1401 | 1402 | 1403 | 1404 | 1405 | 1406 | 1407 |
|---|---|---|---|---|---|---|---|
| Si:Si$_3$N$_4$ Target area ratio (NH$_3$/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:N (Content ratio) | 9.7:0.3 | 8.8:1.2 | 7.3:2.7 | 5.0:5.0 | 4.5:5.5 | 4:6 | 3:7 |
| Image quality evaluation | Δ | ◎ | ◎ | ○ | ○ | Δ | X |

◎ Very good
○ Good
Δ Sufficiently practically usable
X Image defect formed

TABLE D-25

| Sample No | 1501 | 1502 | 1503 | 1504 | 1505 | 1506 | 1507 | 1508 |
|---|---|---|---|---|---|---|---|---|
| Si:Si$_3$N$_4$ (Flow rate ratio) | 9:1 | 1:3 | 1:10 | 1:30 | 1:100 | 1:1000 | 1:5000 | 1:10000 |
| Si:N (Content ratio) | 9.99:0.01 | 9.9:0.1 | 8.5:1.5 | 7.1:2.9 | 5:5 | 4.5:5.5 | 4:6 | 3.5:6.5 |
| Image quality evaluation | ∆ | ⊚ | ⊚ | ⊚ | ○ | ∆ | ∆ | X |

⊚ Very good
○ Good
∆ Practically satisfactory
X Image defect formed

TABLE D-26

| Sample No | 1601 | 1602 | 1603 | 1604 | 1605 | 1606 | 1607 | 1608 |
|---|---|---|---|---|---|---|---|---|
| SiH$_4$:SiF$_4$:NH$_3$ (Flow rate ratio) | 5:4:1 | 1:1:6 | 1:1:20 | 1:1:60 | 1.2:300 | 2:1:3000 | 1:1:1000 | 1:1:2000 |
| Si:N (Content ratio) | 9.89:0.11 | 9.8:0.2 | 8.4:1.6 | 7.0:3.0 | 5.1:4.9 | 4.6:5.4 | 4.1:5.9 | 3.6:6.4 |
| Image quality evaluation | ∆ | ⊚ | ⊚ | ⊚ | ○ | ∆ | ∆ | X |

⊚ Very good
○ Good
∆ Practically satisfactory
X Image defect formed

TABLE D-27

| Sample No | Thickness of layer (II) (µ) | Results |
|---|---|---|
| 1601 | 0.001 | Image defect liable to occur |
| 1602 | 0.02 | No image defect during 20,000 repetitions |
| 1603 | 0.05 | Stable for 50,000 repetitions or more |
| 1604 | 1 | Stable for 200,000 repetitions or more |

TABLE E-1

| Layer constitution | Gases employed | Flow rate (SCCM) | Flow rate ratio | Discharging power (W/cm$^2$) | Layer formation rate (Å/sec) | Layer thickness (µ) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ 32 50 | GeH$_4$/SiH$_4$ = 1/1~2/10<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 2/10~0 | 0.18 | 5 | 19 |
| Layer (II) | SiH$_4$/He = 0.5<br>NO | SiH$_4$ = 100 | SiH$_4$/NO = 1 | 0.18 | 10 | 0.5 |

TABLE E-2

| Layer constitution | Gases employed | Flow rate (SCCM) | Flow rate ratio | Discharging power (W/cm$^2$) | Layer formation rate (Å/sec) | Layer thickness (µ) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/10~4/100<br>C$_2$H$_4$/(GeH$_4$ + SiH$_4$) = 2/100 | 0.18 | 5 | 5 |
| Second layer | SiH$_4$/He = 0.05<br>GeH$_4$/He = 0.05 | SiH$_4$ + GeH$_4$ = 50 | GeH$_4$/SiH$_4$ = 4/100~0 | 0.18 | 5 | 15 |

TABLE E-3

| Layer constitution | Gases employed | Flow rate (SCCM) | Flow rate ratio | Discharging power (W/cm$^2$) | Layer formation rate (Å/sec) | Layer thickness (µ) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 4/10~2/10<br>C$_2$H$_4$/(GeH$_4$ + SiH$_4$) = 3/100 | 0.18 | 5 | 1.5 |
| Second layer | SiH$_4$/He = 0.05<br>GeH$_4$/He = 0.05 | SiH$_4$ + GeH$_4$ = 50 | GeH$_4$/SiH$_4$ = 2/10~2/1000 | 0.18 | 5 | 18.5 |

TABLE E-4

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 15/100<br>C$_2$H$_4$/(GeH$_4$ + SiH$_4$) = 4/100 | 0.18 | 5 | 2 |
| Second layer | SiH$_4$/He = 0.05<br>GeH$_4$/He = 0.05 | SiH$_4$ + GeH$_4$ = 50 | GeH$_4$/SiH$_4$ = 15/100~0 | 0.18 | 5 | 18 |

TABLE E-5

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1~5/10<br>C$_2$H$_4$/(GeH$_4$ + SiH$_4$) = 5/100 | 0.18 | 5 | 0.5 |
| Second layer | SiH$_4$/He = 0.05<br>GeH$_4$/He = 0.05 | SiH$_4$ + GeH$_4$ = 50 | GeH$_4$/SiH$_4$ = 5/10~0 | 0.18 | 5 | 19.5 |

TABLE E-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 2/10~5/100<br>C$_2$H$_4$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 5/100~0 | 0.18 | 5 | 16 |

TABLE E-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/10~8/100<br>C$_2$H$_4$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 16 |

TABLE E-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | Si$_2$H$_6$/He = 0.05<br>GeH$_4$/He = 0.05<br>C$_2$H$_4$ | Si$_2$H$_6$ + GeH$_4$ = 50 | GeH$_4$/Si$_2$H$_6$ = 1/1~2/10<br>C$_2$H$_4$/(GeH$_4$ + Si$_2$H$_6$) = 3/100 | 0.18 | 5 | 1 |
| Second layer | Si$_2$H$_6$/He = 0.05<br>GeH$_4$/He = 0.05 | Si$_2$H$_6$ + GeH$_4$ = 50 | GeH$_4$/Si$_2$H$_6$ = 2/10~0 | 0.18 | 5 | 19 |

TABLE E-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiF$_4$/He = 0.05<br>GeH$_4$/He = 0.05<br>C$_2$H$_4$ | SiF$_4$ + GeH$_4$ = 50 | GeH$_4$/SiF$_4$ = 1/1~2/10<br>C$_2$H$_4$/(GeH$_4$ + SiF$_4$) = 3/100 | 0.18 | 5 | 1 |
| Second layer | SiF$_4$/He = 0.05<br>GeH$_4$/He = 0.05 | SiF$_4$ + GeH$_4$ = 50 | GeH$_4$/SiF$_4$ = 2/10~0 | 0.18 | 5 | 19 |

TABLE E-10

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | SiH$_4$/He = 0.05<br>SiF$_4$/He = 0.05<br>GeH$_4$/He = 0.05<br>C$_2$H$_4$ | SiH$_4$ + SiF$_4$ +<br>GeH$_4$ = 50 | GeH$_4$/(SiH$_4$ + SiF$_4$) = 1/1~2/10<br>C$_2$H$_4$/(GeH$_4$ + SiH$_4$ + SiF$_4$) = 3/100 | 0.18 | 5 | 1 |
| Second layer | SiH$_4$/He = 0.05<br>SiF$_4$/He = 0.05<br>GeH$_4$/He = 0.05 | SiF$_4$ + Si$_2$F$_8$ +<br>GeH$_4$ = 50 | GeH$_4$/(SiH$_4$ + SiF$_4$) = 2/10~0 | 0.18 | 5 | 19 |

TABLE E-11

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/Si$_1$H$_4$ = 1/1~2/10<br>C$_2$H$_4$/(GeH$_4$ + SiH$_4$) = 2/100 | 0.18 | 5 | 1 |
| Second layer | SiH$_4$/He = 0.05<br>GeH$_4$/He = 0.05<br>C$_2$H$_4$ | SiH$_4$ + GeH$_4$ = 50 | GeH$_4$/SiH$_4$ = 2/10~0<br>C$_2$H$_4$/(GeH$_4$ + SiH$_4$) = 1/100 | 0.18 | 5 | 19 |
| Layer (II) | SiH$_4$/He = 0.5<br>NO | SiH$_4$ = 100 | SiH$_4$/NO = 1 | 0.18 | 10 | 0.5 |

TABLE E-12

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | SiH$_4$/He = 0.05<br>GeH$_4$/He = 0.05<br>C$_2$H$_4$ | SiH$_4$ + GeH$_4$ = 50 | GeH$_4$/SiH$_4$ = 1/1~5/100<br>C$_2$H$_4$/(GeH$_4$ + SiH$_4$) = 15/100~1/10 | 0.18 | 5 | 1 |
| Second layer | SiH$_4$/He = 0.05<br>GeH$_4$/He = 0.05<br>C$_2$H$_4$ | SiH$_4$ + GeH$_4$ = 50 | GeH$_4$/SiH$_4$ = 5/100~0<br>C$_2$H$_4$/(GeH$_4$ + SiH$_4$) = 1/10~0 | 0.18 | 5 | 13 |
| Layer (II) | SiH$_4$/He = 0.5<br>NO | SiH$_4$ = 100 | SiH$_4$/NO = 1 | 0.18 | 10 | 0.5 |

TABLE E-13

| Sample No. | 1301 | 1302 | 1303 | 1304 | 1305 | 1306 | 1307 | 1308 |
|---|---|---|---|---|---|---|---|---|
| C$_2$H$_4$/(GeH$_4$ + SiH$_4$) Flow rate ratio | 1/1000 | 5/1000 | 9/1000 | 2/100 | 3/100 | 5/100 | 8/100 | 1/10 |
| C content (atomic %) | 0.1 | 0.5 | 0.89 | 1.96 | 2.9 | 4.76 | 7.4 | 9.1 |
| Evaluation | Δ | O | O | ⊚ | ⊚ | O | O | Δ |

⊚ Excellent
O Good
Δ Practically satisfactory

TABLE E-14

| Sample No. | 1401 | 1402 | 1403 | 1404 | 1405 | 1406 | 1407 | 1408 |
|---|---|---|---|---|---|---|---|---|
| Layer thickness | 30Å | 500Å | 0.1μ | 0.3μ | 0.8μ | 3μ | 4μ | 5μ |
| Evaluation | Δ | O | ⊚ | ⊚ | ⊚ | O | O | Δ |

⊚ Excellent
O Good
Δ Practically satisfactory

TABLE E-15

| Conditions | Gases employed | Flow rate (SCCM) | Flow rate ratio or Area ratio | Discharging power (W/cm$^2$) | Layer thickness (μ) |
|---|---|---|---|---|---|
| 15-1 | Ar(NO/Ar) | 200(1/1) | Si wafer:SiO$_2$ = 1:30 | 0.3 | 0.5 |
| 15-2 | Ar(NO/Ar) | 200(1/1) | Si wafer:SiO$_2$ = 1:60 | 0.3 | 0.3 |
| 15-3 | Ar(NO/Ar) | 200(1/1) | Si wafer:SiO$_2$ = 6:4 | 0.3 | 1.0 |
| 15-4 | SiH$_4$/He = 1<br>NO | SiH$_4$ = 15 | SiH$_4$:NO = 5:1 | 0.18 | 0.3 |
| 15-5 | SiH$_4$/He = 1<br>NO | SiH$_4$ = 100 | SiH$_4$:NO = 1:1 | 0.18 | 1.5 |
| 15-6 | SiH$_4$/He = 0.5 | SiH$_4$ + SiF$_4$ = 150 | SiH$_4$:SiF$_4$:NO = 1:1:1 | 0.18 | 0.5 |

TABLE E-15-continued

| Conditions | Gases employed | Flow rate (SCCM) | Flow rate ratio or Area ratio | Discharging power (W/cm$^2$) | Layer thickness ($\mu$) |
|---|---|---|---|---|---|
| 15-7 | SiF$_4$/He = 0.5<br>NO<br>SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 15-8 | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE E-15A

| Preparation conditions for layer (II) | Sample No./Evaluation | | | | | | | | |
|---|---|---|---|---|---|---|---|---|---|
| 15-1 | 15-201 ○ ○ | 15-301 ○ ○ | 15-401 ○ ○ | 15-501 ○ ○ | 15-601 ○ ○ | 15-701 ○ ○ | 15-801 ○ ○ | 15-901 ○ ○ | 15-1001 ○ ○ |
| 15-2 | 15-202 ○ ○ | 15-302 ○ ○ | 15-402 ○ ○ | 15-502 ○ ○ | 15-602 ○ ○ | 15-702 ○ ○ | 15-802 ○ ○ | 15-902 ○ ○ | 15-1002 ○ ○ |
| 15-3 | 15-203 ○ ○ | 15-303 ○ ○ | 15-403 ○ ○ | 15-503 ○ ○ | 15-603 ○ ○ | 15-703 ○ ○ | 15-803 ○ ○ | 15-903 ○ ○ | 15-1003 ○ ○ |
| 15-4 | 15-204 ◎ ◎ | 15-304 ◎ ◎ | 15-404 ◎ ◎ | 15-504 ◎ ◎ | 15-604 ◎ ◎ | 15-704 ◎ ◎ | 15-804 ◎ ◎ | 15-904 ◎ ◎ | 15-1004 ◎ ◎ |
| 15-5 | 15-205 ◎ ◎ | 15-305 ◎ ◎ | 15-405 ◎ ◎ | 15-505 ◎ ◎ | 15-605 ◎ ◎ | 15-705 ◎ ◎ | 15-805 ◎ ◎ | 15-905 ◎ ◎ | 15-1005 ◎ ◎ |
| 15-6 | 15-206 ◎ ◎ | 15-306 ◎ ◎ | 15-406 ◎ ◎ | 15-506 ◎ ◎ | 15-606 ◎ ◎ | 15-706 ◎ ◎ | 15-806 ◎ ◎ | 15-906 ◎ ◎ | 15-1006 ◎ ◎ |
| 15-7 | 15-207 ○ ○ | 15-307 ○ ○ | 15-407 ○ ○ | 15-507 ○ ○ | 15-607 ○ ○ | 15-707 ○ ○ | 15-807 ○ ○ | 15-907 ○ ○ | 15-1007 ○ ○ |
| 15-8 | 15-208 ○ ○ | 15-308 ○ ○ | 15-408 ○ ○ | 15-508 ○ ○ | 15-608 ○ ○ | 15-708 ○ ○ | 15-808 ○ ○ | 15-908 ○ ○ | 15-1008 ○ ○ |

Evaluation standard
◎ Excellent
○ Good

Sample No.
Overall image evaluation    Durability evaluation

TABLE E-16

| Sample No. | 1601 | 1602 | 1603 | 1604 | 1605 | 1606 | 1607 |
|---|---|---|---|---|---|---|---|
| Si:SiO$_2$ Target area ratio | 9:1 | 6.5:3.5 | 4:10 | 2:60 | 1:100 | 1:100 | 1:100 |
| (NO/Ar) | (0/1) | (1/1) | (1/1) | (1/1) | (2/1) | (3/1) | (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ◎ | ◎ | ○ | ○ | Δ | X |

◎ Very good
○ Good
Δ Sufficiently practically usable
X Image defect formed

TABLE E-17

| Sample No. | 1701 | 1702 | 1703 | 1704 | 1705 | 1706 | 1707 |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | ○ | ◎ | ◎ | ○ | Δ | X |

◎ Very good
○ Good
Δ Practically satisfactory
X Image defect formed

TABLE E-18

| Sample No. | 1801 | 1802 | 1803 | 1804 | 1805 | 1806 | 1807 |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ◎ | ◎ | ○ | Δ | X |

◎ Very good
○ Good
Δ Practically satisfactory
X Image defect formed

TABLE E-19

| Sample No. | Thickness of layer (II) (μ) | Results |
|---|---|---|
| 1901 | 0.001 | Image defect liable to occur |
| 1902 | 0.02 | No image defect during 20,000 repetitions |
| 1903 | 0.05 | Stable for 50,000 repetitions or more |
| 1904 | 1 | Stable for 200,000 repetitions or more |

TABLE F-1

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 8/100$<br>$B_2H_6/(GeH_4 + SiH_4) = 8 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 19 |
| Layer (II) | $SiH_4/He = 0.05$<br>NO | $SiH_4 = 100$ | $SiH_4/NO = 1$ | 0.18 | 10 | 0.5 |

TABLE F-2

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/10 \sim 8/100$<br>$B_2H_6/(GeH_4 + SiH_4) = 5 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 8/100 \sim 0$ | 0.18 | 5 | 19 |

TABLE F-3

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 4/10 \sim 33/100$<br>$B_2H_6/(GeH_4 + SiH_4) = 1 \times 10^{-3}$<br>$C_2H_4/(GeH_4 + SiH_4) = 2/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 33/100 \sim 4/100$ | 0.18 | 5 | 19.5 |

TABLE F-4

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 15/100$<br>$B_2H_6/(GeH_4 + SiH_4) = 5 \times 10^{-4}$<br>$C_2H_4/(GeH_4 + SiH_4) = 3/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 15/100 \sim 0$ | 0.18 | 5 | 19.5 |

TABLE F-5

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | $SiH_4/He = 0.05$<br>$GeH_4/He = 0.05$<br>$B_2H_6/He = 10^{-3}$<br>$C_2H_4$ | $SiH_4 + GeH_4 = 50$ | $GeH_4/SiH_4 = 1/1 \sim 6/10$<br>$B_2H_6/(GeH_4 + SiH_4) = 2 \times 10^{-3}$<br>$C_2H_4/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 6/10 \sim 5/1000$ | 0.18 | 5 | 19 |

TABLE F-6

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $B_2H_6/He = 10^{-3}$ $C_2H_4$ | $SiH_4 + GeH_4 = 50$ | $GeH_4/SiH_4 = 2/10 \sim 195/1000$ $B_2H_6/(GeH_4 + SiH_4) = 5 \times 10^{-3}$ $C_2H_4/(GeH_4 + SiH_4) = 3/100$ | 0.18 | 5 | 1 |
| Second layer | $SiH_4/He = 0.05$ $GeH_4/He = 0.05$ | $SiH_4 + GeH_4 = 50$ | $GeH_4/SiH_4 = 195/1000 \sim 0$ | 0.18 | 5 | 19 |

TABLE F-7

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ $B_2H_6/He = 10^{-3}$ $C_2H_4$ | $SiH_4 + GeH_4 = 50$ | $GeH_4/SiH_4 = 1/10 \sim 95/100$ $B_2H_6/(GeH_4 + SiH_4) = 2 \times 10^{-3}$ $C_2H_4/(GeH_4 + SiH_4) = 3/100$ | 0.18 | 5 | 1 |
| Second layer | $SiH_4/He = 0.05$ $GeH_4/He = 0.05$ | $SiH_4 + GeH_4 = 50$ | $GeH_4/SiH_4 = 95/100 \sim 0$ | 0.18 | 5 | 19 |

TABLE F-8

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $Si_2H_6/He = 0.05$ $GeH_4/He = 0.05$ $B_2H_6/He = 10^{-3}$ $C_2H_4$ | $Si_2H_6 + GeH_4 = 50$ | $GeH_4/Si_2H_6 = 4/10 \sim 8/100$ $B_2H_6/(GeH_4 + Si_2H_6) = 8 \times 10^{-3}$ $C_2H_4/(GeH_4 + Si_2H_6) = 3/100$ | 0.18 | 5 | 1 |
| Second layer | $Si_2H_6/He = 0.05$ $GeH_4/He = 0.05$ | $Si_2H_6 + GeH_4 = 50$ | $GeH_4/Si_2H_6 = 8/100 \sim 0$ | 0.18 | 5 | 19 |

TABLE F-9

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiF_4/He = 0.05$ $GeH_4/He = 0.05$ $B_2H_6/He = 10^{-3}$ $C_2H_4$ | $SiF_4 + GeH_4 = 50$ | $GeH_4/SiF_4 = 1/10 \sim 8/100$ $B_2H_6/(GeH_4 + SiF_4) = 5 \times 10^{-3}$ $C_2H_4/(GeH_4 + SiF_4) = 3/100$ | 0.18 | 5 | 1 |
| Second layer | $SiF_4/He = 0.05$ $GeH_4/He = 0.05$ | $SiF_4 + GeH_4 = 50$ | $GeH_4/SiF_4 = 8/100 \sim 0$ | 0.18 | 5 | 19 |

TABLE F-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $SiF_4/He = 0.05$ $GeH_4/He = 0.05$ $B_2H_6/He = 10^{-3}$ $C_2H_4$ | $SiH_4 + SiF_4 + GeH_4 = 50$ | $GeH_4/(SiH_4 + SiF_4) = 4/10 \sim 33/100$ $B_2H_6/(GeH_4 + SiH_4 + SiF_4) = 1 \times 10^{-3}$ $C_2H_4/(GeH_4 + SiH_4 + SiF_4) = 2/100$ | 0.18 | 5 | 0.5 |
| Second layer | $SiH_4/He = 0.0505$ $SiF_4/He = 0.05$ $GeH_4/He = 0.05$ | $SiH_4 + SiF_4 + GeH_4 = 50$ | $GeH_4/(SiH_4 + SiF_4) = 4/10 \sim 33/100$ | 0.18 | 5 | 19.5 |

TABLE F-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | $SiH_4/He = 0.05$ $GeH_4/He = 0.05$ | $SiH_4 + GeH_4 = 50$ | $GeH_4/SiH_4 = 4/10 \sim 8/100$ $PH_3/(GeH_4 + SiH_4) = 1 \times 10^{-3}$ | 0.18 | 5 | 1 |

TABLE F - 11-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | PH$_3$/He = 10$^{-3}$ C$_2$H$_4$ | | C$_2$H$_4$/(GeH$_4$ + SiH$_4$) = 3/100 | | | |
| Second layer | SiH$_4$/He = 0.05 GeH$_4$/He = 0.05 | SiH$_4$ + GeH$_4$ = 50 | GeH$_4$/SiH$_4$ = 8/100~0 | 0.18 | 5 | 19 |
| Layer (II) | SiH$_4$/He = 0.5 NO | SiH$_4$ = 100 | SiH$_4$/NO = 1 | 0.18 | 10 | 0.5 |

TABLE F - 12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05 GeH$_4$/He = 0.05 B$_2$H$_6$/He = 10$^{-3}$ C$_2$H$_4$ | SiH$_4$ + GeH$_4$ = 50 | GeH$_4$/SiH$_4$ = 4/10~0 B$_2$H$_6$/(GeH$_4$ + SiH$_4$) = 8 × 10$^{-3}$ C$_2$H$_4$/(GeH$_4$ + SiH$_4$) = 1/100 | 0.18 | 5 | 20 |
| Second layer | SiH$_4$/He = 0.5 NO | SiH$_4$ = 100 | SiH$_4$/NO = 1 | 0.18 | 10 | 0.5 |

TABLE F - 13

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05 GeH$_4$/He = 0.05 B$_2$H$_6$/He = 10$^{-3}$ C$_2$H$_4$ | SiH$_4$ + GeH$_4$ = 50 | GeH$_4$/SiH$_4$ = 1/10~0 B$_2$H$_6$/(GeH$_4$ + SiH$_4$) = 5 × 10$^{-3}$ C$_2$H$_4$/(GeH$_4$ + SiH$_4$) = 1/100 | 0.18 | 5 | 20 |

TABLE F - 14

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05 GeH$_4$/He = 0.05 B$_2$H$_6$/He = 10$^{-3}$ C$_2$H$_4$ | SiH$_4$ + GeH$_4$ = 50 | GeH$_4$/SiH$_4$ = 4/10~4/100 B$_2$H$_6$/(GeH$_4$ + SiH$_4$) = 1 × 10$^{-3}$ C$_2$H$_4$/(GeH$_4$ + SiH$_4$) = 2/100~0 | 0.18 | 5 | 20 |

[The flow rate ratio C$_2$H$_4$/(GeH$_4$ + SiH$_4$) was reduced linearly.]

TABLE F - 15

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05 GeH$_4$/He = 0.05 B$_2$H$_6$/He = 10$^{-3}$ C$_2$H$_4$ | SiH$_4$ + GeH$_4$ = 50 | GeH$_4$/SiH$_4$ = 15/100~0 B$_2$H$_6$/(GeH$_4$ + SiH$_4$) = 5 × 10$^{-4}$ C$_2$H$_4$/(GeH$_4$ + SiH$_4$) = 3/100~0 | 0.18 | 5 | 20 |

[The flow rate ratio C$_2$H$_4$/(GeH$_4$ + SiH$_4$) was reduced linearly.]

TABLE F - 16

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05 GeH$_4$/He = 0.05 B$_2$H$_6$/He = 10$^{-3}$ C$_2$H$_4$ | SiH$_4$ + GeH$_4$ = 50 | GeH$_4$/SiH$_4$ = 1/1~6/10 B$_2$H$_6$(GeH$_4$ + SiH$_4$) = 2 × 10$^{-3}$ C$_2$H$_4$/(GeH$_4$ + SiH$_4$) = 3/100 | 0.18 | 5 | 1 |
| Second layer | SiH$_4$/He = 0.05 GeH$_4$/He = 0.05 B$_2$H$_6$/He = 10$^{-3}$ | SiH$_4$ + GeH$_4$ = 50 | GeH$_4$/SiH$_4$ = 6/10~5/1000 B$_2$H$_6$/(GeH$_4$ + SiH$_4$) = 2 × 10$^{-3}$ | 0.18 | 5 | 19 |

TABLE F - 17

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>C$_2$H$_4$/(GeH$_4$ + SiH$_4$) = 3/100 | 0.18 | 5 | 15 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 195/1000~0<br>B$_2$H$_6$/(GeH$_4$ + SiH$_4$) = 5 × 10$^{-3}$ | 0.18 | 5 | 19 |

TABLE F - 18

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>C$_2$H$_4$/(GeH$_4$ + SiH$_4$) = 3/100 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 95/100~0<br>B$_2$H$_6$/(GeH$_4$ + SiH$_4$) = 2 × 10$^{-3}$ | 0.18 | 5 | 19 |

TABLE F - 19

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 8 × 10$^{-3}$ | 0.18 | 5 | 19 |

[The flow rate ratio (C$_2$H$_4$/(GeH$_4$ + SiH$_4$) was reduced linearly.]

TABLE F - 20

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>C$_2$H$_4$/(GeH$_4$ + SiH$_4$) = 3/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 5 × 10$^{-3}$ | 0.18 | 5 | 19 |

[The flow rate ratio C$_2$H$_4$/(GeH$_4$ + SiH$_4$) was reduced linearly.]

TABLE F - 21

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>C$_2$H$_4$/(GeH$_4$ + SiH$_4$) = 2/100 | 0.18 | 5 | 0.5 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 33/100~0<br>B$_2$H$_6$/(GeH$_4$ + SiH$_4$) = 1 × 10$^{-3}$ | 0.18 | 5 | 19.5 |

[The flow rate ratio (C$_2$H$_4$/(GeH$_4$ + SiH$_4$) was reduced linearly.]

TABLE F - 22

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | SiH$_4$/He = 0.05<br>GeH$_4$/He = 0.05<br>B$_2$H$_6$/He = 10$^{-3}$<br>C$_2$H$_4$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>C$_2$H$_4$/(GeH$_4$ + SiH$_4$) = 3/100 | 0.18 | 5 | 15 |
| Second layer | SiH$_4$/He = 0.05<br>GeH$_4$/He = 0.05<br>PH$_3$/He = 10$^{-3}$ | SiH$_4$ + GeH$_4$ = 50 | GeH$_4$/SiH$_4$ = 8/100~0<br>PH$_3$/(GeH$_4$ + SiH$_4$) = 1 × 10$^{-3}$ | 0.18 | 5 | 5 |

TABLE F - 23

| Conditions | Gases employed | Flow rate (SCCM) | Flow rate ratio or Area ratio | Discharging power (W/cm$^2$) | Layer thickness ($\mu$) |
|---|---|---|---|---|---|
| 15-1 | Ar(NO/Ar) | 200(1/1) | Si wafer:SiO$_2$ = 1:30 | 0.3 | 0.5 |
| 15-2 | Ar(NO/Ar) | 200(1/1) | Si wafer:SiO$_2$ = 1:60 | 0.3 | 0.3 |
| 15-3 | Ar(NO/Ar) | 200(1/1) | Si wafer:SiO$_2$ = 6:4 | 0.3 | 1.0 |
| 15-4 | SiH$_4$/He = 1<br>NO | SiH$_4$ = 15 | SiH$_4$:NO = 5:1 | 0.18 | 0.3 |
| 15-5 | SiH$_4$/He = 0.5<br>NO | SiH$_4$ = 100 | SiH$_4$:NO = 1:1 | 0.18 | 1.5 |
| 15-6 | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 15-7 | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 15-8 | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE F - 23A

| Preparation conditions for layer (II) | Sample No./Evaluation | | | | | | | | |
|---|---|---|---|---|---|---|---|---|---|
| 15-1 | 15-201<br>○ ○ | 15-301<br>○ ○ | 15-401<br>○ ○ | 15-501<br>○ ○ | 15-601<br>○ ○ | 15-701<br>○ ○ | 15-801<br>○ ○ | 15-901<br>○ ○ | 15-1001<br>○ ○ |
| 15-2 | 15-202<br>○ ○ | 15-302<br>○ ○ | 15-402<br>○ ○ | 15-502<br>○ ○ | 15-602<br>○ ○ | 15-702<br>○ ○ | 15-802<br>○ ○ | 15-902<br>○ ○ | 15-1002<br>○ ○ |
| 15-3 | 15-203<br>○ ○ | 15-303<br>○ ○ | 15-403<br>○ ○ | 15-503<br>○ ○ | 15-603<br>○ ○ | 15-703<br>○ ○ | 15-803<br>○ ○ | 15-903<br>○ ○ | 15-1003<br>○ ○ |
| 15-4 | 15-204<br>◉ ◉ | 15-304<br>◉ ◉ | 15-404<br>◉ ◉ | 15-504<br>◉ ◉ | 15-604<br>◉ ◉ | 15-704<br>◉ ◉ | 15-804<br>◉ ◉ | 15-904<br>◉ ◉ | 15-1004<br>◉ ◉ |
| 15-5 | 15-205<br>◉ ◉ | 15-305<br>◉ ◉ | 15-405<br>◉ ◉ | 15-505<br>◉ ◉ | 15-605<br>◉ ◉ | 15-705<br>◉ ◉ | 15-805<br>◉ ◉ | 15-905<br>◉ ◉ | 15-1005<br>◉ ◉ |
| 15-6 | 15-206<br>◉ ◉ | 15-306<br>◉ ◉ | 15-406<br>◉ ◉ | 15-506<br>◉ ◉ | 15-606<br>◉ ◉ | 15-706<br>◉ ◉ | 15-806<br>◉ ◉ | 15-906<br>◉ ◉ | 15-1006<br>◉ ◉ |
| 15-7 | 15-207<br>○ ○ | 15-307<br>○ ○ | 15-407<br>○ ○ | 15-507<br>○ ○ | 15-607<br>○ ○ | 15-707<br>○ ○ | 15-807<br>○ ○ | 15-907<br>○ ○ | 15-1007<br>○ ○ |
| 15-8 | 15-208<br>○ ○ | 15-308<br>○ ○ | 15-408<br>○ ○ | 15-508<br>○ ○ | 15-608<br>○ ○ | 15-708<br>○ ○ | 15-808<br>○ ○ | 15-908<br>○ ○ | 15-1008<br>○ ○ |

Evaluation standard
◉ Excellent
○ Good

Sample No.
Overall image evaluation   Durability evaluation

TABLE F - 24

| | Sample No. | | | | | | |
|---|---|---|---|---|---|---|---|
| | 1601 | 1602 | 1603 | 1604 | 1605 | 1606 | 1607 |
| Si:SiO$_2$ Target area ratio | 9:1 | 6.5:3.5 | 4:10 | 2:60 | 1:100 | 1:100 | 1:100 |
| (NO/Ar) | (0/1) | (1/1) | (1/1) | (1/1) | (2/1) | (3/1) | (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ◉ | ◉ | ○ | ○ | Δ | X |

◉ Very good
○ Good
Δ Sufficiently practically usable
X Image defect formed

TABLE F - 25

| | Sample No. | | | | | | |
|---|---|---|---|---|---|---|---|
| | 1701 | 1702 | 1703 | 1704 | 1705 | 1706 | 1707 |
| $SiH_4:NO$ (Flow rate ratio) | 1000:1 | 99:1 | 5:1 | 1:1 | 1:2 | 3:10 | 1:1000 |
| Si:O (Content ratio) | 9.9999: 0.0001 | 9.9:0.1 | 9:1 | 6:4 | 5:5 | 3.3:6.7 | 2:8 |
| Image quality evaluation | Δ | O | ⊚ | ⊚ | O | Δ | X |

⊚ Very good
O Good
Δ Practically satisfactory
X Image defect formed

TABLE F - 26

| | Sample No. | | | | | | |
|---|---|---|---|---|---|---|---|
| | 1801 | 1802 | 1803 | 1804 | 1805 | 1806 | 1807 |
| $SiH_4:NO$ (Flow rate ratio) | 500:400:1 | 50:50:1 | 5:5:2 | 5.5:10 | 1:1:4 | 3:3:20 | 1:1:2000 |
| Si:O (Content ratio) | 9.9998: 0.0002 | 9.8:0.2 | 8.8:1.2 | 6.3:3.7 | 5.1:4.9 | 3.5:6.5 | 2.3:7.7 |
| Image quality evaluation | Δ | O | ⊚ | ⊚ | O | Δ | X |

⊚ Very good
O Good
Δ Practically satisfactory
X Image defect formed

TABLE F - 27

| Sample No. | Thickness of layer (II) | Results |
|---|---|---|
| 1901 | 0.001 | Image defect liable to occur |
| 1902 | 0.02 | No image defect during 20,000 repetitions |
| 1903 | 0.05 | Stable for 50,000 repetitions or mare |
| 1904 | 1 | Stable for 200,000 repetitions or mare |

What we claim is:

1. A photoconductive member comprising a substrate and a light receiving layer haivng photoconductivity which comprises an amorphous material containing at least one of hydrogen atoms and halogen atoms, said light receiving layer further containing silicon atoms and germanium atoms, the distribution of germanium atoms therein being nonuniform in the layer thickness direction, and carbon atoms being contained in the light receiving layer; said light receiving layer exhibiting an enhanced absorption coefficient for visible light from the longer wavelength side of the spectrum.

2. The photoconductive member of claim 1, wherein the light receiving layer contains hydrogen atoms.

3. The photoconductive member of claim 1, wherein the light receiving layer contains halogen atoms.

4. The photoconductive member of claim 1, wherein the light receiving layer contains hydrogen atoms and halogen atoms.

5. The photoconductive member of claim 1, wherein germanium atoms in the light receiving layer are much distributed to the substrate side of the light receiving layer.

6. The photoconductive member of claim 1, wherein the light receiving layer contains a substance controlling electroconductive properties.

7. The photoconductive member of claim 6, wherein the light receiving layer contains hydrogen atoms.

8. The photoconductive member of claim 6, wherein the light receiving layer contains halogen atoms.

9. The photoconductive member of claim 6, wherein the light receiving layer contains hydrogen atoms and halogen atoms.

10. The photoconductive member of claim 6, wherein germanium atoms in the light receiving layer are much distributed to the substrate side of the light receiving layer.

11. The photoconductive member of claim 6, wherein the substance controlling electroconductive properties is atoms of group III of the periodic table.

12. The photoconductive member of claim 6, wherein the substance controlling electroconductive properties is atoms of group V of the periodic table.

13. A photoconductive member comprising a substrate and a light receiving layer comprising a first layer which comprises an amorphous material containing at least one of hydrogen atoms and halogen atoms, said first layer further containing silicon atoms and germanium atoms and exhibiting photoconductivity and a second layer which comprises an amorphous material containing silicon atoms as a matrix and at least one kind of atoms selected from the group consisting of nitrogen atoms and oxygen atoms, the distribution of germanium atoms in the first layer being non-uniform in the layer thickness direction, and carbon atoms being contained in the first layer; said light receiving layer exhibiting an enhanced absorption coefficient for visible light from the longer wavelength side of the spectrum.

14. The photoconductive member of claim 13, wherein the first layer contains hydrogen atoms.

15. The photoconductive member of claim 13, wherein the first layer contains halogen atoms.

16. The photoconductive member of claim 13, wherein the first layer contains hydrogen atoms and halogen atoms.

17. The photoconductive member of claim 13, wherein germanium atoms in the first layer are much distributed to the substrate side of the first layer.

18. The photoconductive member of claim 13, wherein the first layer contains a substance controlling electroconductive properties.

19. The photoconductive member of claim 18, wherein the first layer contains hydrogen atoms.

20. The photoconductive member of claim 18, wherein the first layer contains halogen atoms.

21. The photoconductive member of claim 18, wherein the first layer contains hydrogen atoms and halogen atoms.

22. The photoconductive member of claim 18, wherein germanium atoms in the first layer are much distributed to the substrate side of the first layer.

23. The photoconductive member of claim 18, wherein the substance controlling electroconductive properties is atoms of group III of the periodic table.

24. The photoconductive member of claim 18, wherein the substance controlling electroconductive properties is atoms of group V of the periodic table.

25. The photoconductive member of claim 1, wherein the content of carbon atoms in the light receiving layer is in the range of 0.001 to 50 atomic %.

26. The photoconductive member of claim 2, wherein the content of hydrogen atoms in the light receiving layer is in the range of 0.01 to 40 atomic %.

27. The photoconductive member of claim 3, wherein the content of halogen atoms in the light receiving layer is in the range of 0.01 to 40 atomic %.

28. The photoconductive member of claim 4, wherein the total content of hydrogen atoms and halogen atoms in the range of 0.01 to 40 atomic %.

29. The photoconductive member of claim 1, wherein the thickness of the light receiving layer is in the range of 1 to 100μu.

30. The photoconductive member of claim 1, wherein the content of germanium atoms in the light receiving layer is in the range of 1 to $9.5 \times 10^5$ atomic ppm based on the total content of germanium atoms and silicon atoms therein.

31. The photoconductive member of claim 6, wherein the content of the substance controlling electroconductive properties in the light receiving layer is in range of 0.01 to $5 \times 10^4$ atomic ppm.

32. The photoconductive member of claim 13, wherein the content of carbon atoms in the first layer is in the range of 0.001 to 50 atomic %.

33. The photoconductive member of claim 14, wherein the content of hydrogen atoms in the first layer is in the range of 0.01 to 40 atomic %.

34. The photoconductive member of claim 15, wherein the content of halogen atoms in the first layer is in the range of 0.01 to 40 atomic %.

35. The photoconductive member of claim 16, wherein the total content of hydrogen atoms and halogen atoms in the first layer is in the range of 0.01 to 40 atomic %.

36. The photoconductive member of claim 13, wherein the thickness of the first layer is in the range of 1 to 100μu.

37. The photoconductive member of claim 13, wherein the content of germanium atoms in the first layer is in the range of 1 to $9.5 \times 10^5$ atomic ppm based on the total content of germanium atoms and silicon atoms therein.

38. The photoconductive member of claim 18, wherein the content of the substance controlling electroconductive properties in the first layer is in the range of 0.01 to $5 \times 10^4$ atomic ppm.

39. The photoconductive member of claim 13, wherein the second layer contains hydrogen atoms.

40. The photoconductive member of claim 13, wherein the second layer contains halogen atoms.

41. The photoconductive member of claim 13, wherein the second layer contains hydrogen atoms and halogen atoms.

42. The photoconductive member of claim 13, wherein the thickness of the second layer is in the range of 0.003 to 30μu.

43. The photoconductive member of claim 7, wherein the content of hydrogen atoms in the light receiving layer is in the range of 0.01 to 40 atomic %.

44. The photoconductive member of claim 8, wherein the content of halogen atoms in the light receiving layer is in the range of 0.01 to 40 atomic %.

45. The photoconductive member of claim 9, wherein the total content of hydrogen atoms and halogen atoms is to the range of 0.01 to 40 atomic %.

46. The photoconductive member of claim 19, wherein the content of hydrogen atoms in the first layer is in the range of 0.01 to 40 atomic %.

47. The photoconductive member of claim 20, wherein the content of halogen atoms in the first layer is in the range of 0.01 to 40 atomic %.

48. The photoconductive member of claim 21, wherein the total content of hydrogen atoms and halogen atoms in the first layer is in the range of 0.01 to 40 atomic %.

* * * * *

UNITED STATES PATENT AND TRADEMARK OFFICE
CERTIFICATE OF CORRECTION

PATENT NO. : 4,567,127

DATED : January 28, 1986

INVENTOR(S) : KEISHI SAITOH, ET AL.

It is certified that error appears in the above-identified patent and that said Letters Patent is hereby corrected as shown below:

AT [54] IN THE TITLE

Line 4, change "GERANIUM" to --GERMANIUM--.

COLUMN 1

Line 4, change "GERANIUM" to --GERMANIUM--.

COLUMN 5

Line 32, change "exibits" to --exhibits--.
    Line 62, change "fitst" to --first--.
    Line 65, change "$t_T$side" to --$t_T$ side--.

COLUMN 6

Line 29, change "$t_B$(italic) to(italic) C(italic)16" to --$t_B$ to $C_{16}$--.

Line 47, change "$t_T$side" to --$t_T$ side--.

Line 51, change "concentrations, rations, in" to --concentrations, in--.

COLUMN 9

Line 45, change "Gehd $3H_8$" to --$Ge_3H_8$--.

COLUMN 11

Line 3, change "0.40 atomic" to --40 atomic--.
    Line 3, change "%.preferably" to --%, preferably--.

COLUMN 12

Line 8, change "$(H_3Si.O.SiH_2.SiH_3)$," to --$(H_3Si.O.SiH_2.O.SiH_3)$,--.

UNITED STATES PATENT AND TRADEMARK OFFICE
CERTIFICATE OF CORRECTION

PATENT NO. : 4,567,127
DATED : January 28, 1986
INVENTOR(S) : KEISHI SAITOH, ET AL.

It is certified that error appears in the above-identified patent and that said Letters Patent is hereby corrected as shown below:

COLUMN 13

Lines 39-40, change "atomic $0.5-1 \times 10^4$" to --atomic ppm, preferably $0.5-1 \times 10^4$--.

COLUMN 16

Line 63, change "hydrozine" to --hydrazine--.

COLUMN 18

Line 49, change "a(-" to --a-(---.

COLUMN 19

Lines 38-39, change "a $O_{1-x})_y(H,X)_{1-y}$" to --a-$(Si_x O_{1-x})_y (H,X)_{1-y}$--

COLUMN 20

Line 61, change "silaxanes," to --siloxanes,--.

COLUMN 23

Line 50, change "$B_2H_2$/He" to --$B_2H_6$/He--.

COLUMN 24

Line 35, change "In corporation" to --Incorporation--.

COLUMN 37

Lines 30-31, change "12-10-01" to --12-1001--.

COLUMN 43

Lines 23-24, change "12-10-01" to --12-1001--.

UNITED STATES PATENT AND TRADEMARK OFFICE
CERTIFICATE OF CORRECTION

PATENT NO. : 4,567,127
DATED : January 28, 1986
INVENTOR(S) : KEISHI SAITOH, ET AL.

Page 3 of 5

It is certified that error appears in the above-identified patent and that said Letters Patent is hereby corrected as shown below:

COLUMN 48

Lines 4-5, change "5-1001-1-5" to --15-1001-15--.

COLUMN 51

Line 10, change "$SiG_4$/He" to --$SiH_4$/He--.

COLUMN 53

Line 16, change "∝ Table F-21" to --- Table F-21--.
Line 55, change "layer" to --laser--.
Lines 66-67, change "15-10-01" to --15-1001--.

COLUMN 55

Line 3, change "Layer not containing germanium atom (Ge)... about    to --Layer not containing germanium atom (Ge)... about 250° C.--.
between Table A-5 and Table A-6, delete "250°C.

COLUMN 65

Table B-19, change "$SiH_4$He" to --$SiH_4$/He--.

COLUMN 73

Table C-16, change " o Very good" to --ⓞ Very good--.

COLUMN 77

Table D-11, change "$SiH_4$He" to --$SiH_4$/He--.

COLUMN 85

Table D-26, change "1.2:300" to --1:2:300--.
Table E-1, change "$GeH_4$ 32 50" to --$GeH_4$ = 50--.

UNITED STATES PATENT AND TRADEMARK OFFICE
CERTIFICATE OF CORRECTION

PATENT NO. : 4,567,127
DATED : January 28, 1986
INVENTOR(S) : KEISHI SAITOH, ET AL.

It is certified that error appears in the above-identified patent and that said Letters Patent is hereby corrected as shown below:

COLUMN 89

Table E-11, change "$Si_1H_4$" to --$SiH_4$--.

COLUMN 99

Table F-19, change "ratio ($C_2$" to --ratio $C_2$--.
Table F-21, change "ratio ($C_2$" to --ratio $C_2$--.

COLUMN 103

Table F-26, change "5.5:10" to --5:5:10--.
Line 41, change "haivng" to --having--.
Line 59, change "much" to --mostly--.

COLUMN 104

Line 32, change "much" to --mostly--.
Line 64, change "much" to --mostly--.

COLUMN 105

Line 9, change "much" to --mostly--.
Lines 29-39, change "atoms in" to --atoms is in--.
Line 33, change "100μu." to --100μ.--.
Line 41, change "in range" to --in the range--.

UNITED STATES PATENT AND TRADEMARK OFFICE
CERTIFICATE OF CORRECTION

PATENT NO. : 4,567,127

DATED : January 28, 1986

INVENTOR(S) : KEISHI SAITOH, ET AL.

Page 5 of 5

It is certified that error appears in the above-identified patent and that said Letters Patent is hereby corrected as shown below:

<u>COLUMN 106</u>

```
Line 10, change "100µu." to --100µ.--.
Line 29, change "30µu." to --30µ.--.
Line 38, change "is to the" to --is in the--.
```

Signed and Sealed this

Twenty-first Day of April, 1987

Attest:

DONALD J. QUIGG

*Attesting Officer*   *Commissioner of Patents and Trademarks*